United States Patent
Isa

(10) Patent No.: US 10,325,966 B2
(45) Date of Patent: Jun. 18, 2019

(54) DISPLAY DEVICE, MODULE, AND ELECTRONIC DEVICE

(71) Applicant: Semiconductor Energy Laboratory Co., Ltd., Kanagawa-ken (JP)

(72) Inventor: Toshiyuki Isa, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 15/743,806

(22) PCT Filed: Jul. 14, 2016

(86) PCT No.: PCT/IB2016/054192
§ 371 (c)(1),
(2) Date: Jan. 11, 2018

(87) PCT Pub. No.: WO2017/013538
PCT Pub. Date: Jan. 26, 2017

(65) Prior Publication Data
US 2018/0204884 A1    Jul. 19, 2018

(30) Foreign Application Priority Data

Jul. 23, 2015  (JP) .................................. 2015-145504
Jun. 16, 2016  (JP) .................................. 2016-119835

(51) Int. Cl.
*H01L 27/32*     (2006.01)
*H01L 51/00*     (2006.01)
(Continued)

(52) U.S. Cl.
CPC ............ *H01L 27/323* (2013.01); *G06F 3/041* (2013.01); *H01L 27/3279* (2013.01);
(Continued)

(58) Field of Classification Search
CPC .................. G06F 3/041; G06F 3/044; G06F 2203/04102; G06F 2203/04111
See application file for complete search history.

(56) References Cited

U.S. PATENT DOCUMENTS 6,682,963 B2   1/2004  Ishikawa
7,109,071 B2   9/2006  Ishikawa
(Continued)

FOREIGN PATENT DOCUMENTS

CN    102184970 A    9/2011
CN    103226920 A    7/2013
(Continued)

OTHER PUBLICATIONS

International Search Report re Application No. PCT/IB2016/054192, dated Nov. 1, 2016.
(Continued)

*Primary Examiner* — Md Saiful A Siddiqui
(74) *Attorney, Agent, or Firm* — Husch Blackwell LLP

(57) ABSTRACT

The display defects of a display device are reduced. The display quality of the display device is improved. The display device includes a display panel and a first conductive layer. The display panel includes a display element including a pair of electrodes. An electrode of the pair of electrodes which is closer to one surface of the display panel is supplied with a constant potential. A constant potential is supplied to the first conductive layer. The second conductive layer provided on the other surface of the display panel is in contact with the first conductive layer, whereby the second conductive layer is also supplied with the constant potential. The second conductive layer includes a portion not fixed to the first conductive layer.

14 Claims, 36 Drawing Sheets

(51) Int. Cl.
*G06F 3/041* (2006.01)
*H05B 33/26* (2006.01)
*G06F 3/044* (2006.01)

(52) U.S. Cl.
CPC ........ *H01L 51/003* (2013.01); *H01L 51/0097* (2013.01); *H05B 33/26* (2013.01); *G06F 3/044* (2013.01); *G06F 2203/04102* (2013.01); *G06F 2203/04111* (2013.01); *H01L 27/3244* (2013.01); *H01L 2227/323* (2013.01); *H01L 2251/5338* (2013.01); *Y02E 10/549* (2013.01)

(56) References Cited

U.S. PATENT DOCUMENTS

| | | | |
|---|---|---|---|
| 7,408,193 | B2 | 8/2008 | Ishikawa |
| 7,642,555 | B2 | 1/2010 | Ishikawa |
| 8,047,442 | B2 | 11/2011 | Yamazaki et al. |
| 8,264,144 | B2 | 9/2012 | Oikawa et al. |
| 8,272,575 | B2 | 9/2012 | Yamazaki et al. |
| 8,546,912 | B2 | 10/2013 | Yamazaki et al. |
| 8,563,970 | B2 | 10/2013 | Choi et al. |
| 8,664,658 | B2 | 3/2014 | Yoneda |
| 8,860,306 | B2 | 10/2014 | Oikawa et al. |
| 8,956,891 | B2 | 2/2015 | Chida |
| 9,088,006 | B2 | 7/2015 | Yamazaki et al. |
| 9,117,401 | B2 | 8/2015 | Choi et al. |
| 9,257,560 | B2 | 2/2016 | Adachi et al. |
| 9,356,087 | B1 * | 5/2016 | Lee .................... H01L 27/3276 |
| 9,627,648 | B2 | 4/2017 | Yamazaki et al. |
| 10,134,904 | B2 | 11/2018 | Adachi et al. |
| 2013/0193415 | A1 | 8/2013 | Choi et al. |
| 2013/0320851 | A1 | 12/2013 | Choi et al. |
| 2013/0323499 | A1 | 12/2013 | Choi et al. |
| 2014/0078104 | A1 * | 3/2014 | Lee .......... G06F 3/044 345/174 |
| 2015/0060890 | A1 | 3/2015 | Oikawa et al. |
| 2016/0378224 | A1 * | 12/2016 | Kwon ................ H01L 51/5256 345/174 |
| 2017/0279081 | A1 | 9/2017 | Yamazaki et al. |
| 2017/0329162 | A1 * | 11/2017 | Yamazaki ......... G02F 1/133345 |

FOREIGN PATENT DOCUMENTS

| | | |
|---|---|---|
| CN | 103400851 A | 11/2013 |
| CN | 104103677 A | 10/2014 |
| JP | 2000-040586 A | 2/2000 |
| JP | 2007-188725 A | 7/2007 |
| JP | 2011-118082 A | 6/2011 |
| JP | 2013-156624 A | 8/2013 |
| JP | 5446790 B2 | 3/2014 |
| JP | 2014-160663 A | 9/2014 |
| JP | 2014-197522 A | 10/2014 |
| KR | 10-1190630 | 10/2012 |

OTHER PUBLICATIONS

Written Opinion re Application No. PCT/IB2016/054192, dated Nov. 1, 2016.

* cited by examiner

C4 < C3

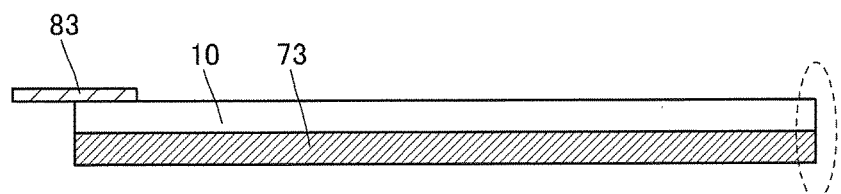
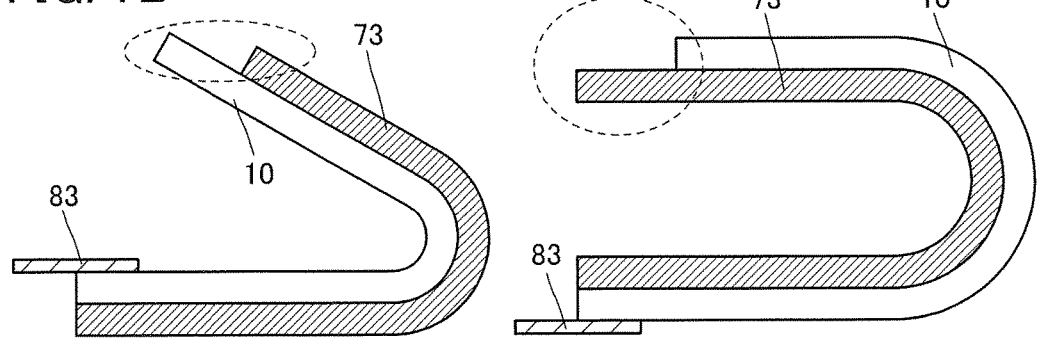
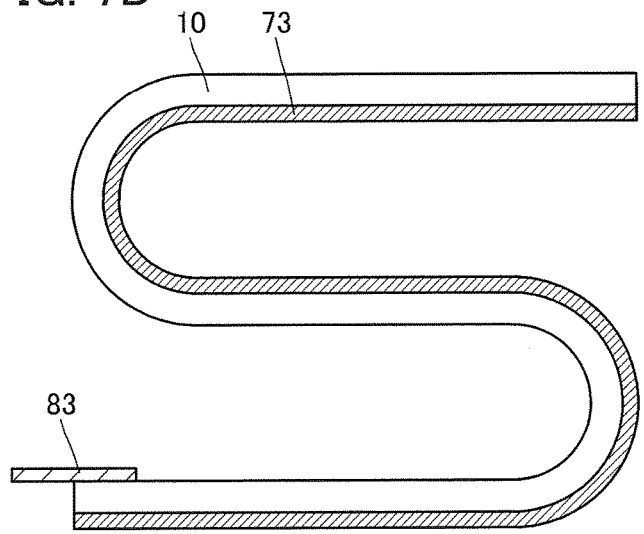

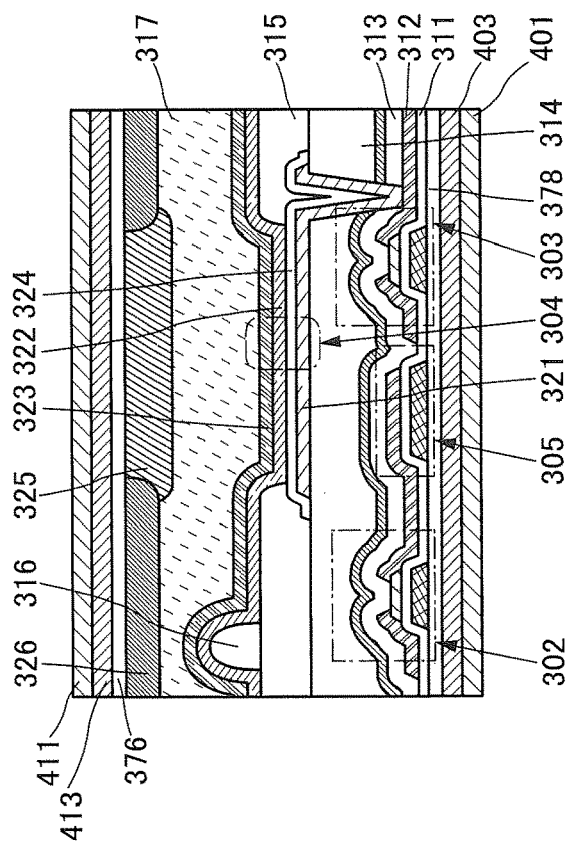
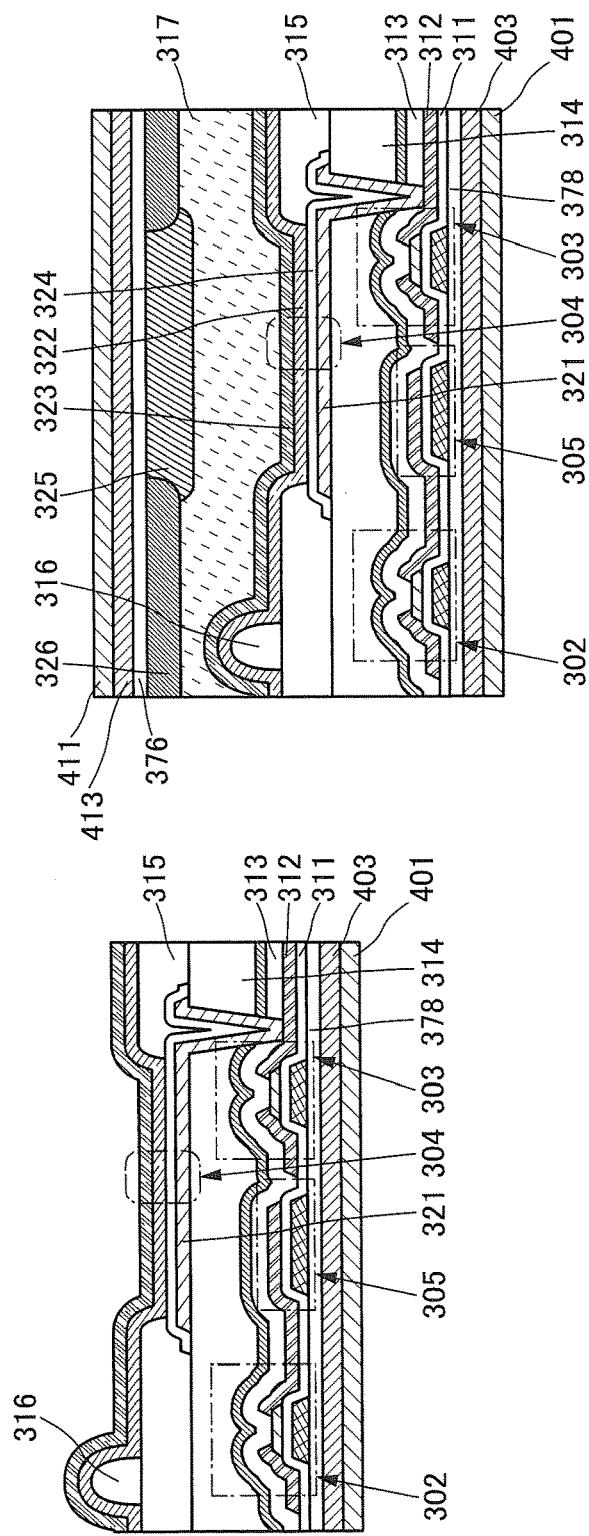
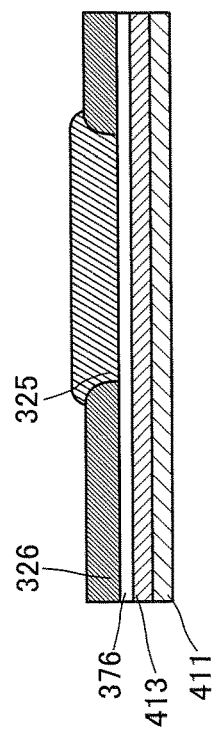

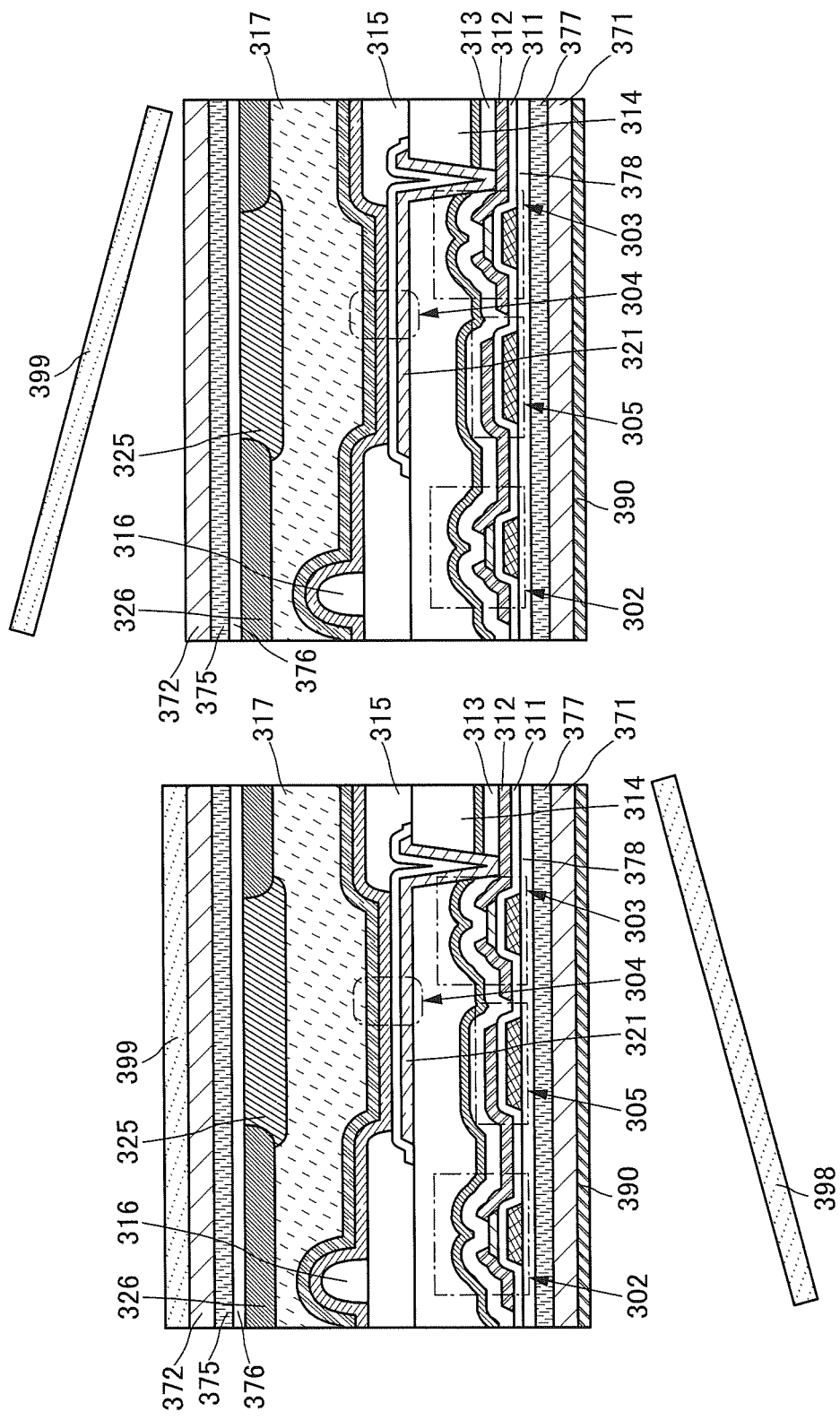

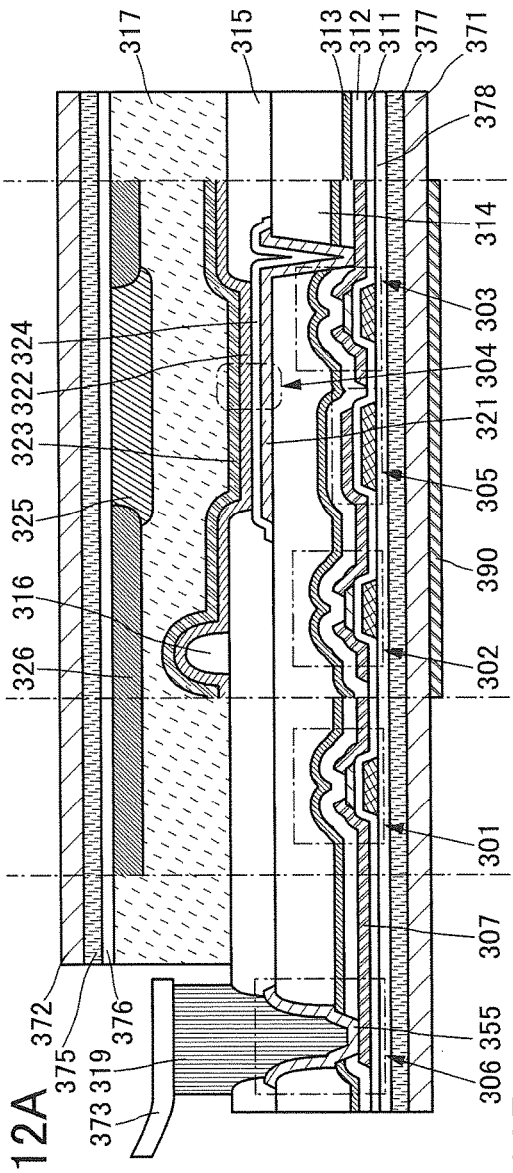

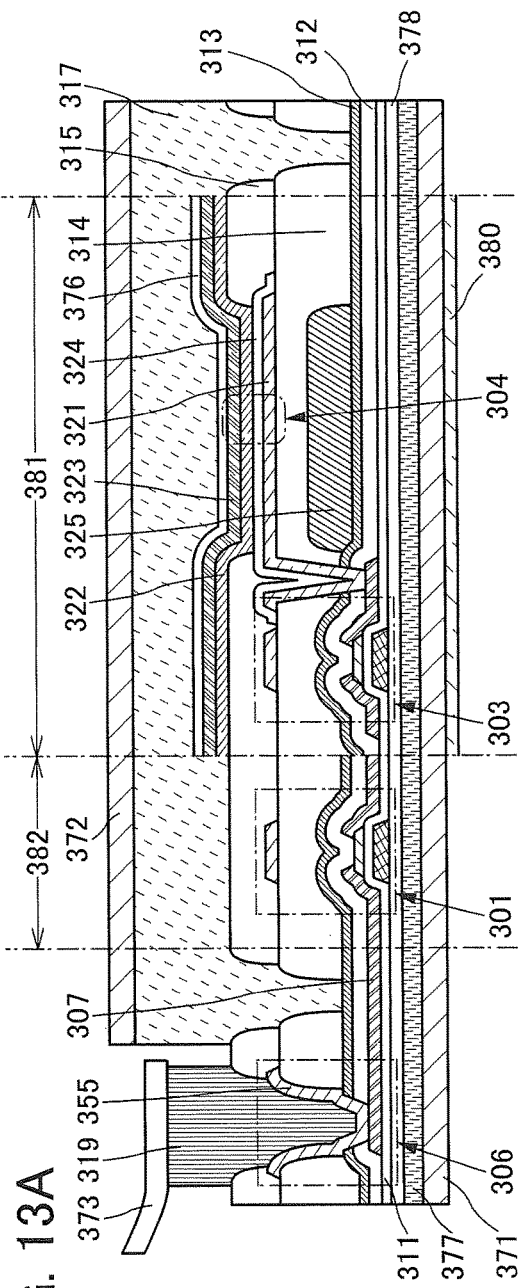
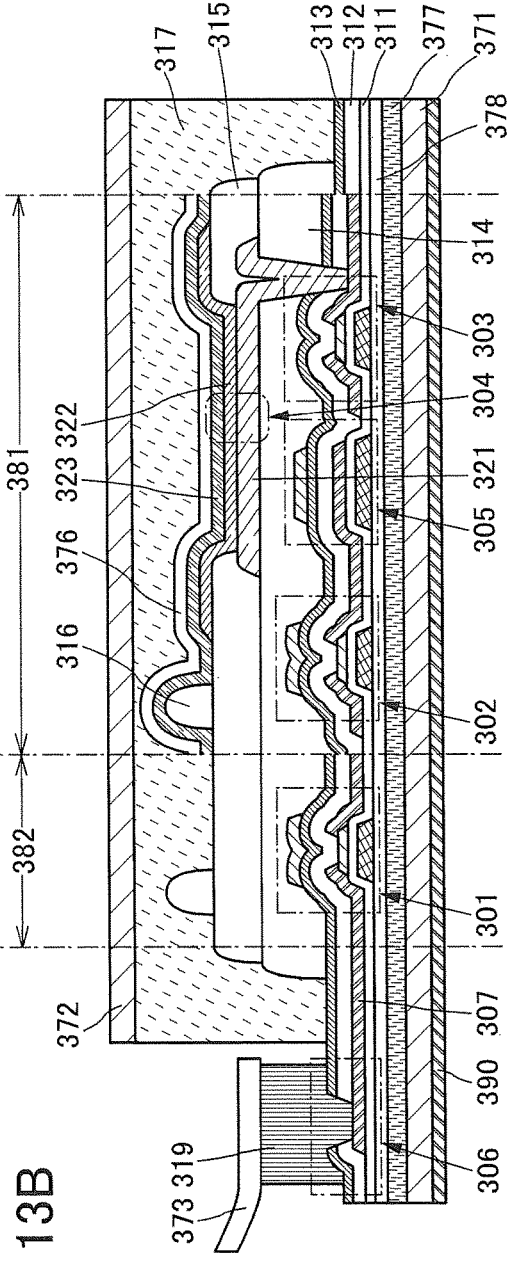

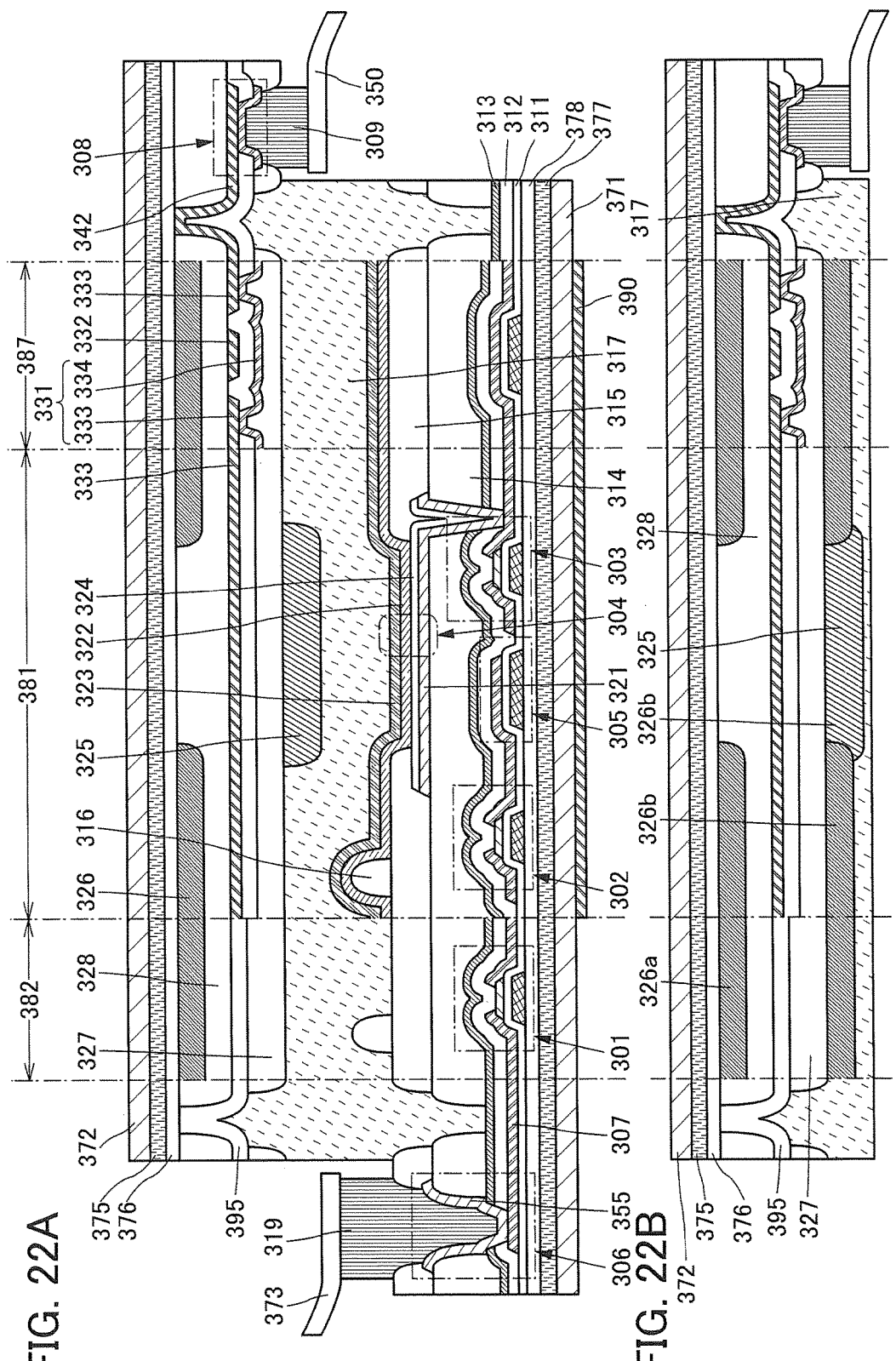

FIG. 29A
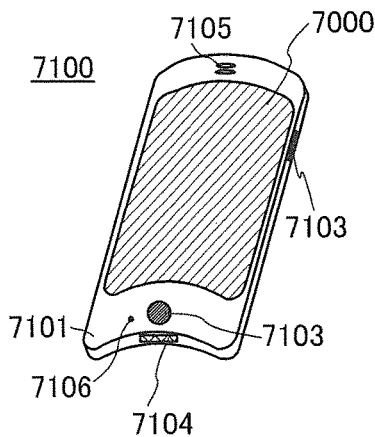
FIG. 29B
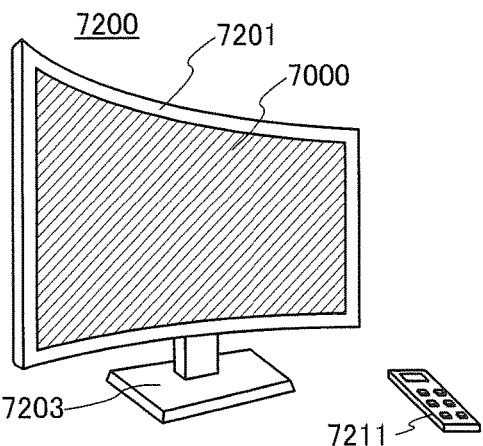
FIG. 29C1
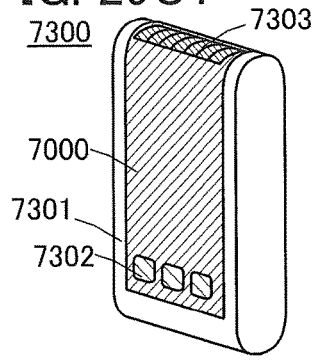
FIG. 29D
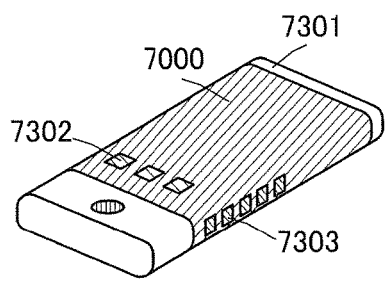
FIG. 29E
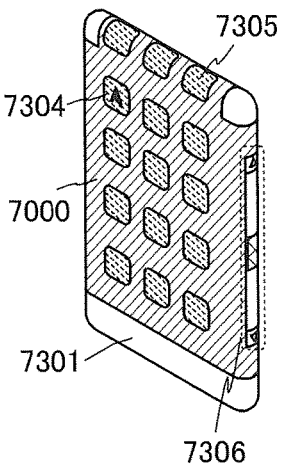
FIG. 29C2
FIG. 29F
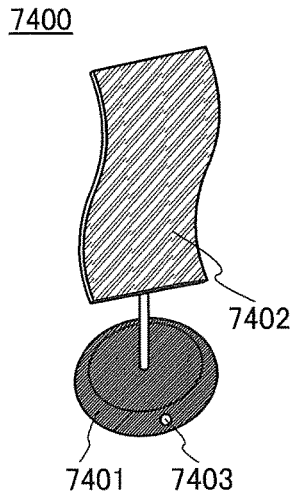
FIG. 29G
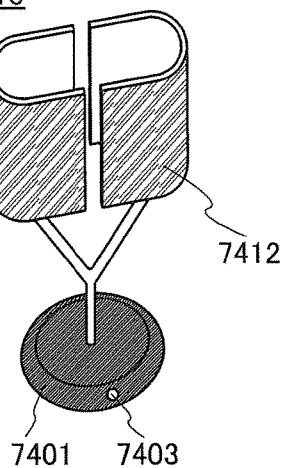
FIG. 29H
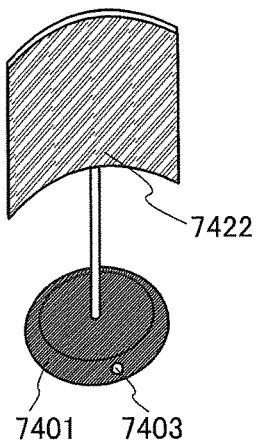

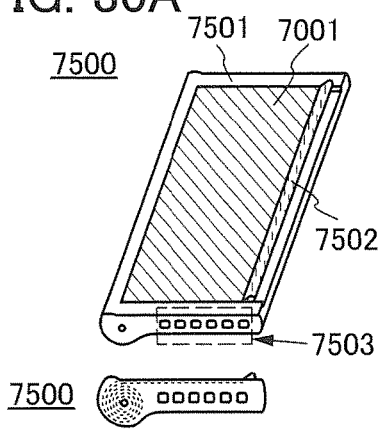
FIG. 30A
FIG. 30B
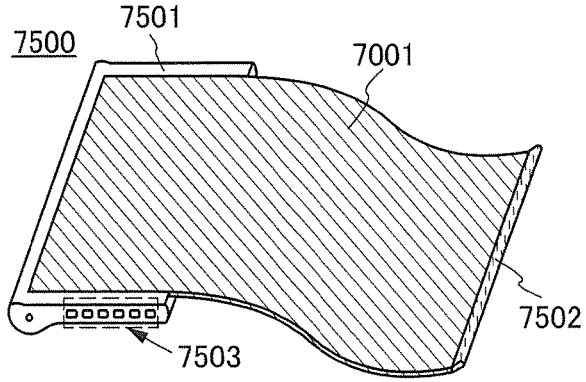
FIG. 30C
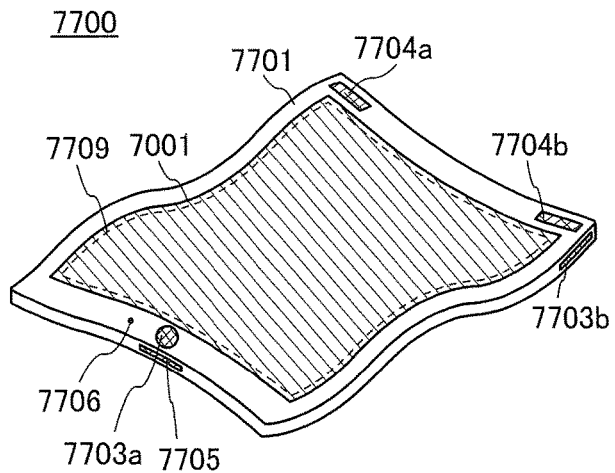
FIG. 30D

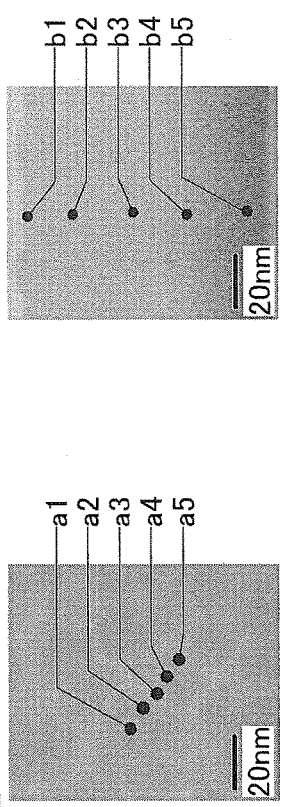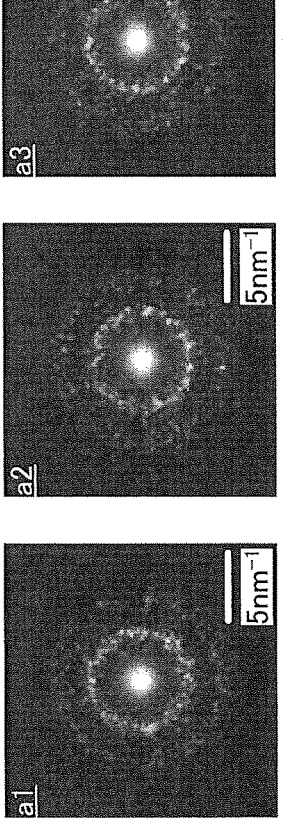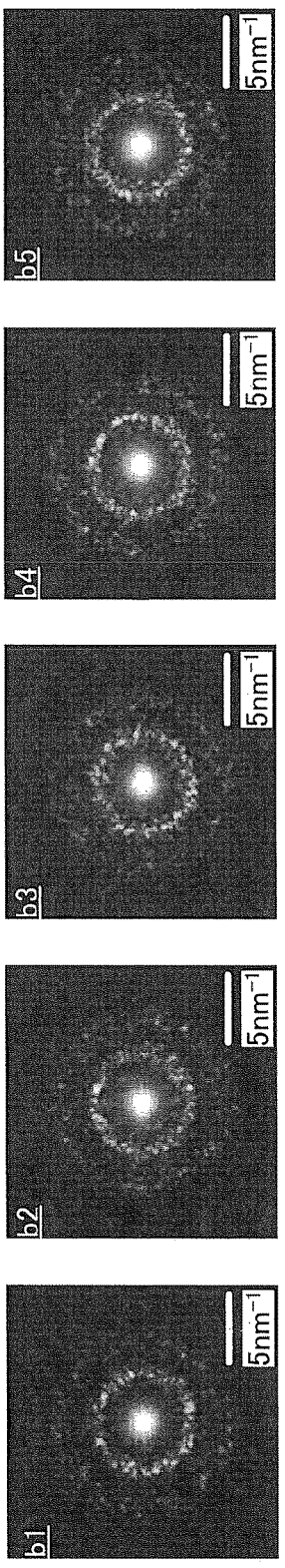
FIG. 35A plan-view TEM image
FIG. 35B cross-sectional TEM image
FIG. 35C FIG. 35D FIG. 35E FIG. 35F FIG. 35G
FIG. 35H FIG. 35I FIG. 35J FIG. 35K FIG. 35L

DISPLAY DEVICE, MODULE, AND ELECTRONIC DEVICE

TECHNICAL FIELD

One embodiment of the present invention relates to a display device, a module, and an electronic device. In particular, one embodiment of the present invention relates to a display device, a module, and an electronic device that utilize an electroluminescence (hereinafter also referred to as EL) phenomenon.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), and an input/output device (such as a touch panel), and a method for driving any of them and a method for manufacturing any of them.

BACKGROUND ART

Recent display devices are expected to be used in a variety of uses and become diversified.

For example, display devices for mobile devices and the like are required to be thin, lightweight, and less likely to be broken.

Light-emitting elements utilizing EL phenomenon (also referred to as EL elements) have features such as ease of thinning and lightening, high-speed response to input signal, and driving with a direct-current low voltage source; therefore, application of the light-emitting elements to display devices has been proposed.

For example, Patent Document 1 discloses a flexible light-emitting device in which an organic EL element is used.

PRIOR ART DOCUMENT

Patent Document

[Patent Document 1] Japanese Published Patent Application No. 2014-197522

SUMMARY OF THE INVENTION

Problems to be Solved by the Invention

When the display panel has a small thickness so as to be lightweight or flexible, the display panel is likely to be influenced by noise.

A factor in causing noise is, for example, a parasitic capacitance between the display panel and a housing, a human body, or the like.

For example, when the display panel is changed in shape, the position of at least one portion of the display panel relative to the housing is changed in some cases. Thus, parasitic capacitance between the display panel and the housing is changed, so that the luminance of the pixel might be locally changed to cause a display defect.

An object of one embodiment of the present invention is to reduce display defects of a display device. Another object of one embodiment of the present invention is to improve the display quality of a display device. Another object of one embodiment of the present invention is to provide a display device with a curved surface. Another object of one embodiment of the present invention is to provide a flexible display device. Another object of one embodiment of the present invention is to provide a lightweight display device. Another object of one embodiment of the present invention is to provide a thin display device. Another object of one embodiment of the present invention is to provide a display device with high reliability. Another object of one embodiment of the present invention is to provide a novel display device, a novel electronic device, or the like.

Note that the descriptions of these objects do not disturb the existence of other objects. In one embodiment of the present invention, there is no need to achieve all the objects. Other objects can be derived from the description of the specification, the drawings, and the claims.

Means for Solving the Problems

A display panel of one embodiment of the present invention includes a flexible substrate, a transistor, a light-emitting element, and a conductive layer. The transistor and the light-emitting element are each positioned over the flexible substrate. The light-emitting element includes a first electrode over the flexible substrate, a layer containing a light-emitting substance (hereinafter referred to as an EL layer) over the first electrode, and a second electrode over the EL layer. The first electrode is electrically connected to a source or a drain of the transistor. The second electrode is supplied with a constant potential. The transistor and the light-emitting element are each electrically insulated from the conductive layer. The transistor and the light-emitting element each overlap with the conductive layer with the flexible substrate provided therebetween. The conductive layer is supplied with a constant potential.

A display device of one embodiment of the present invention includes a display panel and a first conductive layer. The display panel has flexibility. The display panel includes a flexible substrate, a transistor, a light-emitting element, and a second conductive layer. The transistor and the light-emitting element are each positioned over the flexible substrate. The light-emitting element includes a first electrode over the flexible substrate, an EL layer over the first electrode, and a second electrode over the EL layer. The first electrode is electrically connected to a source or a drain of the transistor. The EL layer contains a light-emitting substance. The second electrode is supplied with a constant potential. The transistor and the light-emitting element are each electrically insulated from the second conductive layer. The transistor and the light-emitting element each overlap with the second conductive layer with the flexible substrate provided therebetween. The second conductive layer comprises a portion in contact with the first conductive layer. The second conductive layer comprises a portion not fixed to the first conductive layer. The first conductive layer is supplied with a constant potential.

The first conductive layer is preferably in contact with a wiring supplied with the constant potential in a portion not overlapping with the display panel.

The area where the second conductive layer and a display region of the display panel overlap with each other is preferably greater than or equal to 80% and less than or equal to 100% of the area of the display region.

The area of the second conductive layer is preferably larger than the area of the display region of the display panel.

The area where the first conductive layer and the display panel overlap with each other is preferably greater than or equal to 80% and less than or equal to 100% of the area of the display panel.

The area of the first conductive layer is preferably larger than the area of the display panel.

The display device preferably includes an insulating layer which overlaps with the display panel with the first conductive layer provided therebetween. For example, the insulating layer preferably contains a resin. The display device may include, for example, a film or a sheet including a stack of the insulating layer and the first conductive layer. The thickness of the film or the sheet is greater than or equal to 20 μm and less than or equal to 100 μm. The Rockwell hardness of the insulating layer is preferably higher than or equal to M60 and lower than or equal to M120 when the insulating layer contains the resin.

The thickness of the display panel is preferably greater than or equal to 50 μm and less than or equal to 100 μm.

In the case where the light-emitting element emits light toward the flexible substrate side, the first conductive layer and the second conductive layer each have a function of transmitting visible light. In the case where the light-emitting element emits light toward a side opposite to the flexible substrate side, the first conductive layer preferably contains a metal or an alloy.

One embodiment of the present invention is a module including any of the display devices having the above structures. The module is provided with a connector such as a flexible printed circuit (hereinafter also referred to as an FPC) or a TCP (tape carrier package) or is mounted with an integrated circuit (IC) by a COG (chip on glass) method, a COF (chip on film) method, or the like.

In one embodiment of the present invention, the above structures may be applied to a light-emitting device or an input/output device (e.g., a touch panel) instead of the display device.

One embodiment of the present invention is an electronic device including the above-described module and a sensor. The sensor overlaps with the display panel with the second conductive layer provided therebetween.

One embodiment of the present invention is an electronic device including the above-mentioned module and at least one of an antenna, a battery, a housing, a camera, a speaker, a microphone, and an operation button.

Effect of the Invention

According to one embodiment of the present invention, display defects of a display device can be reduced. According to one embodiment of the present invention, the display quality of a display device can be improved. According to one embodiment of the present invention, a display device having a curved surface can be provided. According to one embodiment of the present invention, a display device having flexibility can be provided. According to one embodiment of the present invention, a lightweight display device can be provided. According to one embodiment of the present invention, a thin display device can be provided. According to one embodiment of the present invention, a display device with high reliability can be provided. According to one embodiment of the present invention, a novel display device, a novel electronic device, or the like can be provided.

Note that the description of these effects does not preclude the existence of other effects. One embodiment of the present invention does not necessarily have all the effects listed above. Other effects can be derived from the description of the specification, the drawings, and the claims.

BRIEF DESCRIPTION OF DRAWINGS

FIGS. 7A-7D Side views illustrating examples of a display device.

FIGS. 9A-9C Cross-sectional views illustrating an example of a method for manufacturing a display panel.

FIGS. 11A-11B Cross-sectional views illustrating an example of a method for manufacturing a display panel.

FIGS. 12A-12B Cross-sectional views illustrating examples of a display panel.

FIGS. 13A-13B Cross-sectional views illustrating examples of a display panel.

FIGS. 22A-22B Cross-sectional views illustrating examples of a touch panel.

FIGS. 29A-29H Diagrams illustrating examples of an electronic device.

FIGS. 30A-30D Diagrams illustrating examples of an electronic device.

FIGS. 35A-35L TEM images of samples and electron diffraction patterns.

MODE FOR CARRYING OUT THE INVENTION

Figure 1A:
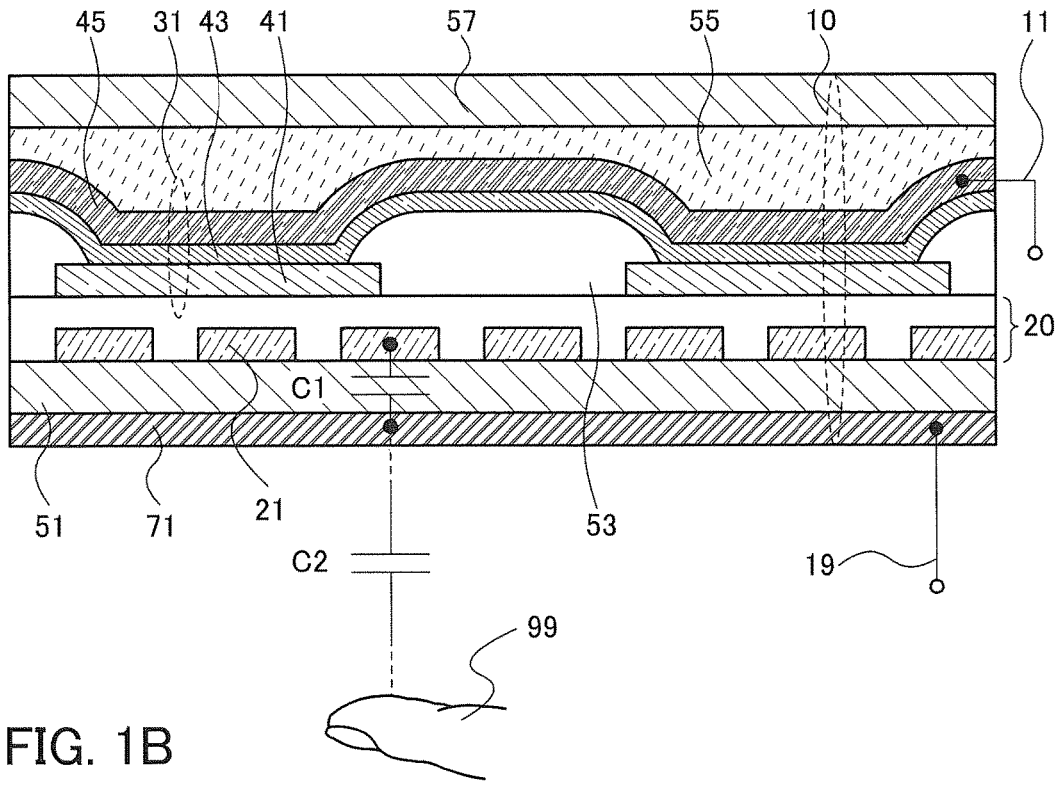
FIGS. 1A-1C Cross-sectional views illustrating an example of a display panel.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Further, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

Note that in this specification, a "substrate" preferably has a function of supporting at least one of a functional circuit, a functional element, a functional film, and the like. A "substrate" does not necessarily have a function of supporting these objects, and may have a function of protecting a surface of a device or a panel, or a function of sealing at least one of a functional circuit, a functional element, a functional film, and the like, for example. In this specification, a substrate having flexibility is referred to as a "flexible substrate".

(Embodiment 1)

In this embodiment, a display device of one embodiment of the present invention will be described with reference to FIG. 1 to FIG. 7.

In this embodiment, an example where an organic EL element is mainly used is described. An organic EL element is preferable because of the ease of being flexible.

FIG. 1 is cross-sectional views of a display panel of one embodiment of the present invention and FIG. 2 is cross-sectional views of a display device of one embodiment of the present invention. FIG. 3(A) is a circuit diagram showing an example of a pixel circuit of a display panel. FIG. 3(B) and FIG. 4 are cross-sectional views of comparative display panels.

A pixel circuit illustrated in FIG. 3(A) includes a light-emitting element 31, a transistor 32, a transistor 33, and a capacitor 34. The transistor 32 functions as a driving transistor. The transistor 33 functions as a selection transistor.

A first electrode of the light-emitting element 31 is electrically connected to a first wiring 11. A second electrode of the light-emitting element 31 is electrically connected to a first electrode of the transistor 32. A second electrode of the transistor 32 is electrically connected to a second wiring 12. A gate of the transistor 32 is electrically connected to a first electrode of the transistor 33 and a first electrode of the capacitor 34. A second electrode of the transistor 33 is electrically connected to a third wiring 13. A gate of the transistor 33 is electrically connected to a fourth wiring 14. A second electrode of the capacitor 34 is electrically connected to a fifth wiring 15.

A comparative display panel 16 illustrated in FIG. 3(B) includes a flexible substrate 51, a layer 20 including a transistor, a light-emitting element 31, an insulating layer 53, a bonding layer 55, and a flexible substrate 57.

The layer 20 including a transistor includes a plurality of conductive layers such as a gate, a source, and a drain of the transistor and a wiring. In FIG. 3(B), a conductive layer 21, which is one of the conductive layers included in the layer 20 including a transistor, is illustrated.

The light-emitting element 31 includes an electrode 41, an EL layer 43, and an electrode 45. The light-emitting element 31 is sealed with the flexible substrate 51, the bonding layer 55, and the flexible substrate 57.

One of the electrode 41 and the electrode 45 functions as an anode and the other functions as a cathode. When a voltage higher than the threshold voltage of the light-emitting element 31 is applied between the electrode 41 and the electrode 45, holes are injected to the EL layer 43 from the anode side and electrons are injected to the EL layer 43 from the cathode side. The injected electrons and holes are recombined in the EL layer 43 and a light-emitting substance contained in the EL layer 43 emits light.

The electrode 41 functions as a pixel electrode and is provided for each light-emitting element 31. Two adjacent electrodes 41 are electrically insulated from each other by the insulating layer 53. The electrode 45 functions as a common electrode and is provided for a plurality of light-emitting elements 31. The electrode 45 corresponds to an electrode electrically connected to the first wiring 11 in FIG. 3(A). A fixed potential is supplied to the electrode 45.

As the thickness of the display panel 16 is smaller, the display panel 16 can be lightweight and flexible, whereas the display panel 16 is easily affected by noise.

As illustrated in FIG. 3(B), capacitance 39 is formed between a finger 99 of a user of the display panel 16 and the conductive layer 21. When the finger 99 moves relatively to the conductive layer 21, a distance between the finger 99 and the conductive layer 21 is changed and the capacitance 39 is also changed.

Figure 4A:
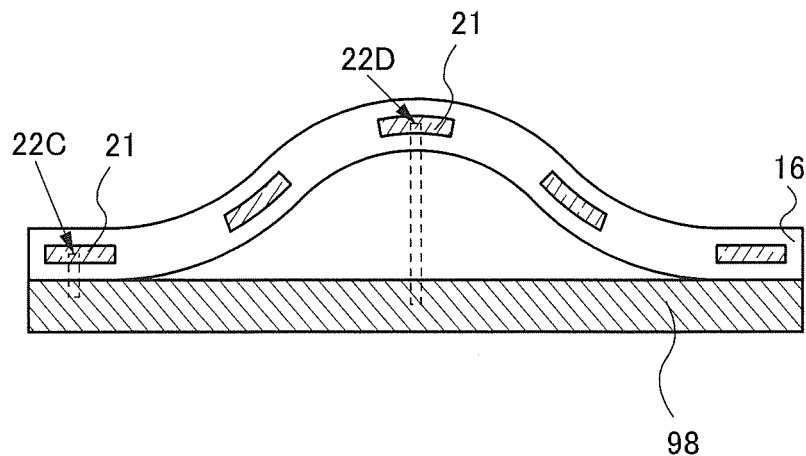
FIGS. 4A-4C Cross-sectional views illustrating an example of a display panel.
Figure 4B:
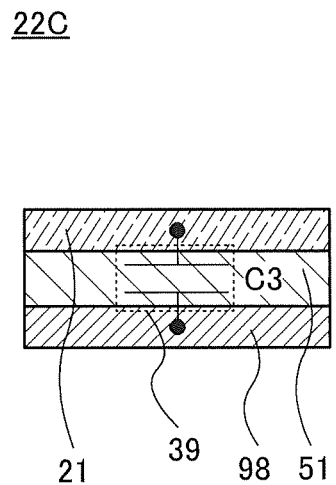
Figure 4C:
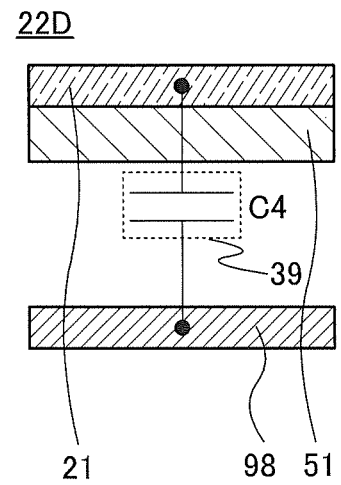

In addition, FIG. 4(A) shows an example where the display panel 16 is placed over a housing 98 having conductivity. Parts of the display panel 16 are in contact with the housing 98 and the other parts are apart from the housing 98. FIG. 4(B) is an enlarged view of a region 22C where the display panel 16 is in contact with the housing 98 in FIG. 4(A). FIG. 4(C) is an enlarged view of a region 22D where the display panel 16 is not in contact with the housing 98 in FIG. 4(A).

The capacitance 39 between the housing 98 and the conductive layer 21 in the case where the housing 98 is in contact with the conductive layer 21 (capacitance C3 in FIG. 4(B)) differs from that in the case where they are not in contact with each other (capacitance C4 in FIG. 4(C)). In FIGS. 4(B) and (C), C3 is larger than C4.

The display panel 16 is partly apart from the housing 98 in some cases even when being placed over the housing 98. Alternatively, when the display panel 16 is changed in shape, the display panel 16 is partly apart from the housing 98 in some cases. Thus, while the display panel 16 is used, the capacitance 39 between the housing 98 and the conductive layer 21 is changed in some cases.

As illustrated in FIG. 3(A), the capacitance 39 influences the potential of the node N. As a distance between the conductive layer 21 and the housing or the human body is shorter, the capacitance 39 becomes larger. As the thickness of the display panel 16 is smaller, the shortest distance between the conductive layer 21 and the housing or the human body becomes shorter and large capacitance is easily generated. That is, the range of the change of the capacitance 39 is expanded, and the range of the change of the potential of the node N is also expanded. Thus, the luminance of the pixel is locally and largely changed, and a display defect might be caused.

Thus, in one embodiment of the present invention, the display panel is provided with a conductive layer to which a constant potential is supplied. Examples of the constant potential include power supply potentials such as a low power supply potential (VSS) and a high power supply potential (VDD), a ground potential (GND potential), a common potential, a reference potential, and the like.

A display panel 10 illustrated in FIG. 1(A) differs from the display panel 16 illustrated in FIG. 3(A) in including a conductive layer 71 overlapping with the conductive layer 21 with the flexible substrate 51 provided therebetween. The other structures are the same as those in the display panel 16; thus, detailed description is omitted.

The conductive layer 71 is electrically connected to a wiring 19 which supplies a constant potential. The conductive layer 71 is electrically insulated from the conductive layer 21 included in the layer 20 including the transistor. Since the conductive layer 71 is positioned on the surface of the display panel 10, the constant potential supplied to the conductive layer 71 is preferably a GND potential in terms of the safety. In this embodiment, an example where a GND potential is supplied to the conductive layer 71 is shown.

Figure 1B:
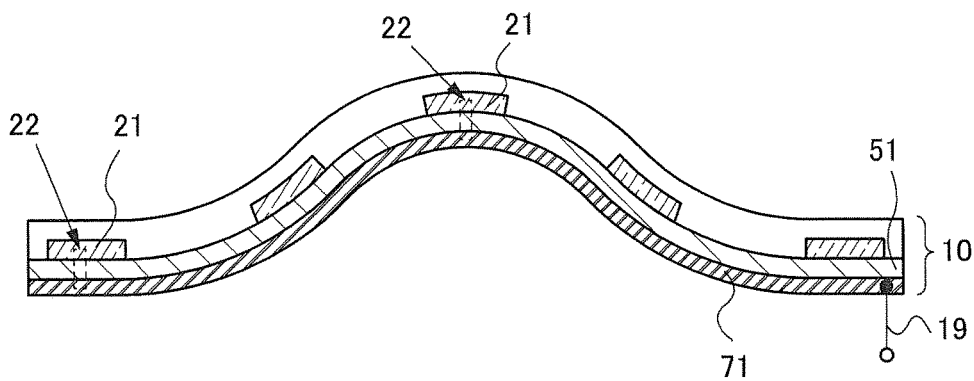
Figure 1C:
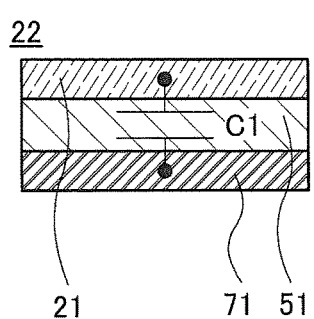

A capacitance C1 is generated between the conductive layer 21 and the conductive layer 71. As illustrated in FIGS. 1(B) and (C), even when the display panel 10 is bent, the position of the conductive layer 21 relative to the conductive layer 71 is not changed. FIG. 1(C) is an enlarged view of a region 22 in FIG. 1(B). In the two regions 22 illustrated in FIG. 1(B), distances between the conductive layer 21 and the conductive layer 71 are the same and the capacitances C1 generated between the conductive layer 21 and the conductive layer 71 are the same.

Furthermore, capacitance C2 is formed between the finger 99 and the conductive layer 71. As a distance between the finger 99 and the conductive layer 71 is shorter, the capacitance C2 becomes larger. When the capacitance C2 is changed, the potential of the conductive layer 71 is changed and the potential of the conductive layer 21 may also be changed. However, in one embodiment of the present invention, since the conductive layer 71 is supplied with a constant potential, even when the capacitance C2 is changed, the potential of the conductive layer 21 is not changed.

In addition, the display panel 10 includes the electrode 45 to which a constant potential is supplied. Thus, even if the human body or the housing is positioned on the flexible substrate 57 side, a change in capacitance between the electrode 45 and the human body or the housing does not affect the potential of the conductive layer 21.

As described above, in the display panel of one embodiment of the present invention, the conductive layers each of which is supplied with the constant potential are provided in both an upper layer and a lower layer of the layer including the transistor. Thus, a change in the potential of the conductive layer included in the layer including the transistor due to the noise from the outside can be suppressed, and the display defects in the display panel can be reduced.

The display panel in which one embodiment of the present invention is used is hardly affected by noise even when the thickness is reduced. The thickness of the display panel 10 can be, for example, greater than or equal to 30 μm and less than or equal to 300 μm and is preferably greater than or equal to 50 μm and less than or equal to 200 μm, further preferably greater than or equal to 50 μm and less than or equal to 150 μm, and still further preferably greater than or equal to 50 μm and less than or equal to 100 μm. To increase the mechanical strength of the display panel 10, the thickness of the display panel 10 is preferably greater than or equal to 50 μm. Furthermore, to increase the flexibility of the display panel 10, the thickness of the display panel 10 is preferably less than or equal to 200 μm and further preferably less than or equal to 100 μm. For example, in the case where the thickness is less than or equal to 100 μm, a display panel which can be subjected to bending operation with a radius of curvature of 1 mm or can be subjected to bending and unbending operation with a radius of curvature of 5 mm in which a flat state and a bent state of a display surface are alternately repeated (e.g., more than 100000 times) can be obtained.

Figure 2A:
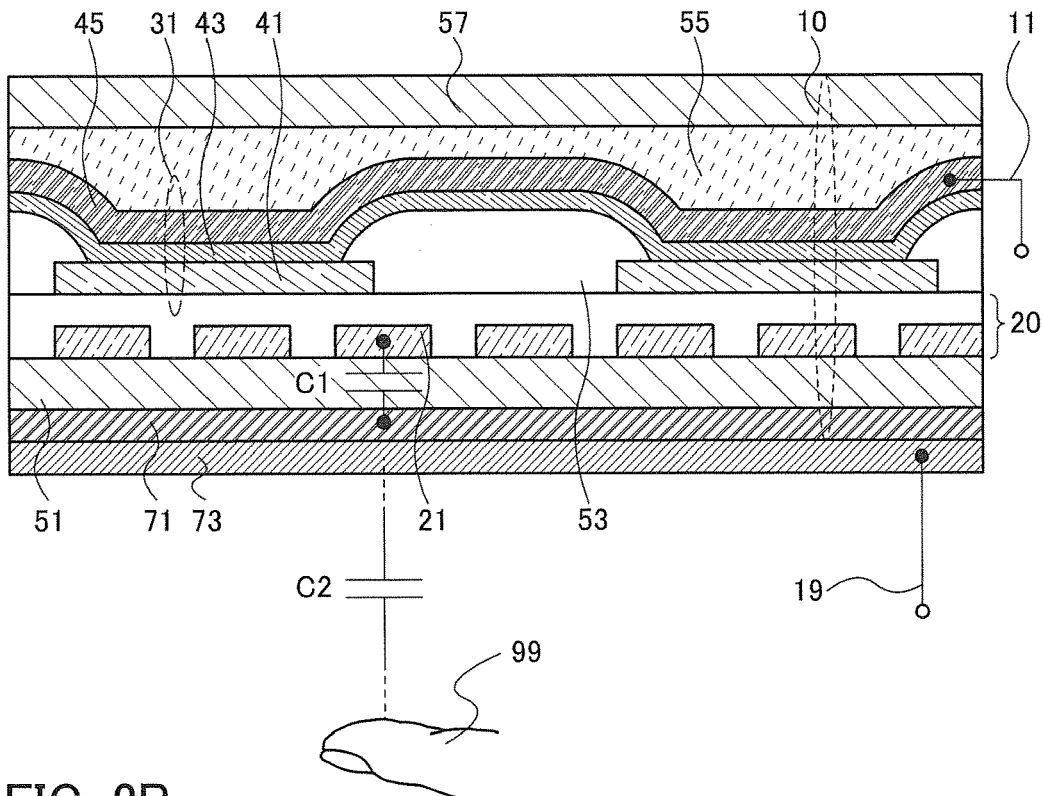
FIGS. 2A-2D Cross-sectional views illustrating an example of a display panel.
Figure 3A:
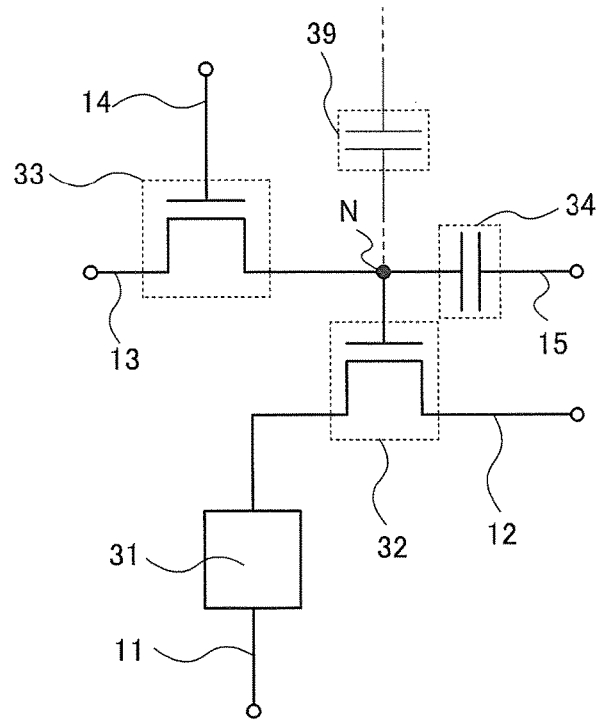
FIGS. 3A-3B A circuit diagram of a pixel and a cross-sectional view illustrating an example of a display panel.
Figure 3B:
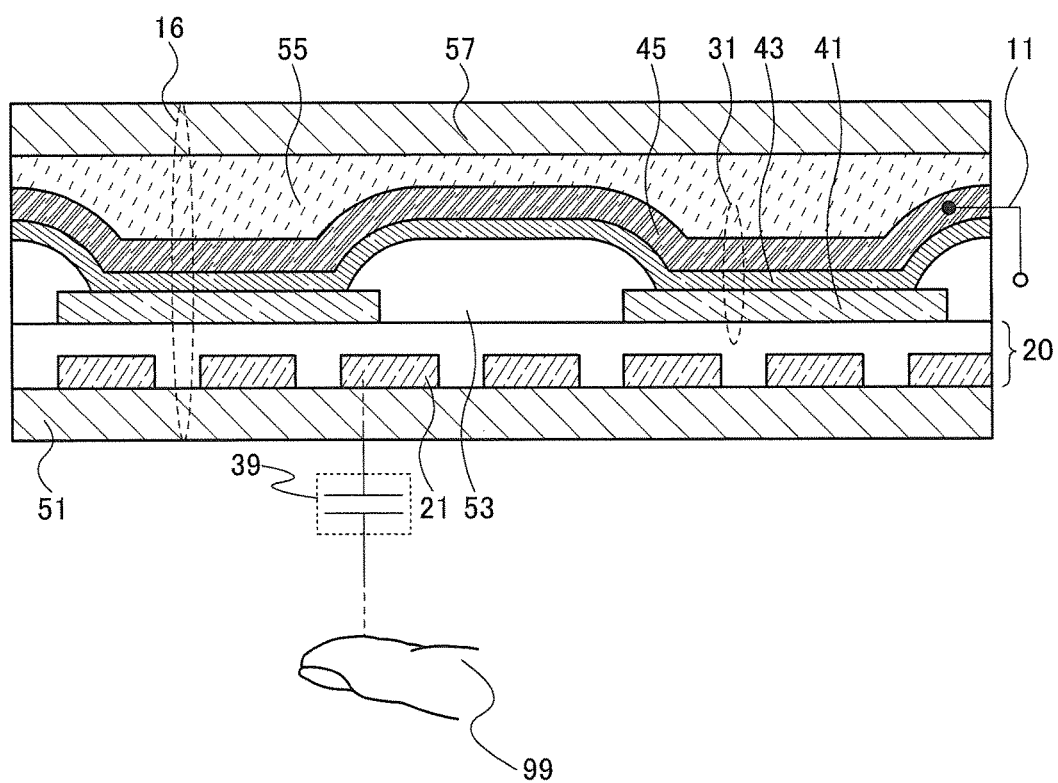

FIG. 2(A) is a cross-sectional view of a display device including the display panel 10 and a conductive layer 73. The display panel 10 has the same structure as a structure example 1 (FIG. 1(A)); thus, detailed description is omitted.

The conductive layer 71 includes a portion in contact with the conductive layer 73. The conductive layer 73 is electrically connected to the wiring 19 which supplies a constant potential. The constant potential is supplied to the conductive layer 71 through the conductive layer 73. The conductive layer 71 is not necessarily fixed to the conductive layer 73. When at least part of the conductive layer 71 is in contact with the conductive layer 73, the constant potential is supplied to the conductive layer 71.

Figure 2B:
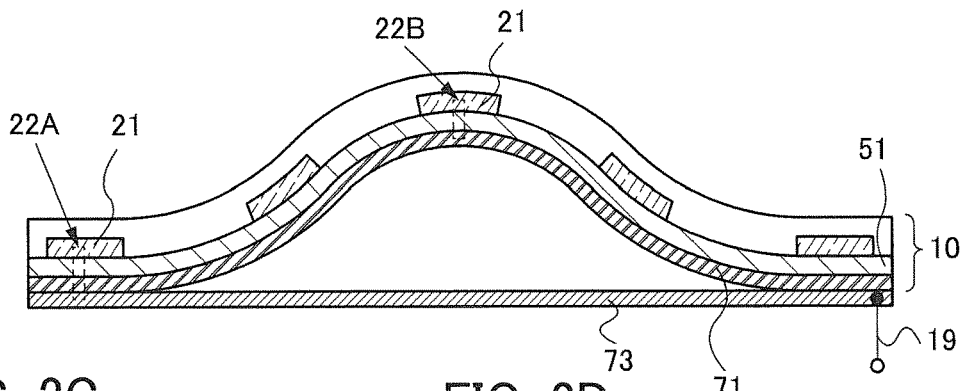
Figure 2C:
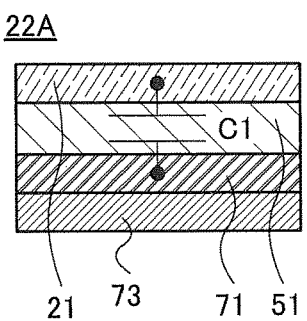
Figure 2D:
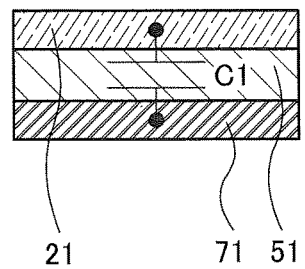

The capacitance C1 is generated between the conductive layer 21 and the conductive layer 71. As illustrated in FIGS. 2(B) to (D), even when the display panel 10 is bent, the position of the conductive layer 21 relative to the conductive layer 71 is not changed.

In FIG. 2(B), part of the display panel 10 is in contact with the conductive layer 71 and the other part is apart from the conductive layer 71. FIG. 2(C) illustrates a region 22A where the display panel 10 in FIG. 2(B) is in contact with the conductive layer 71. FIG. 2(D) illustrates a region 22B where the display panel 10 in FIG. 2(B) is not in contact with the conductive layer 71. In the region 22A and the region 22B, distances between the conductive layer 21 and the conductive layer 71 are the same and the capacitances C1 generated between the conductive layer 21 and the conductive layer 71 are the same.

Furthermore, the capacitance C2 is formed between the finger 99 and the conductive layer 73. As a distance between the finger 99 and the conductive layer 73 is shorter, the capacitance C2 becomes larger. When the capacitance C2 is changed, the potentials of the conductive layer 73 and the conductive layer 71 are changed and the potential of the conductive layer 21 may also be changed. However, in one embodiment of the present invention, since the conductive layer 73 and the conductive layer 71 are supplied with a constant potential, even when the capacitance C2 is changed, the potential of the conductive layer 21 is not changed.

As described above, the conductive layer 73 supplied with the constant potential and the conductive layer 71 positioned at the surface of the display panel 10 are in contact with each other in at least one portion, whereby the constant potential can be supplied to the conductive layer 71.

Figure 5A:
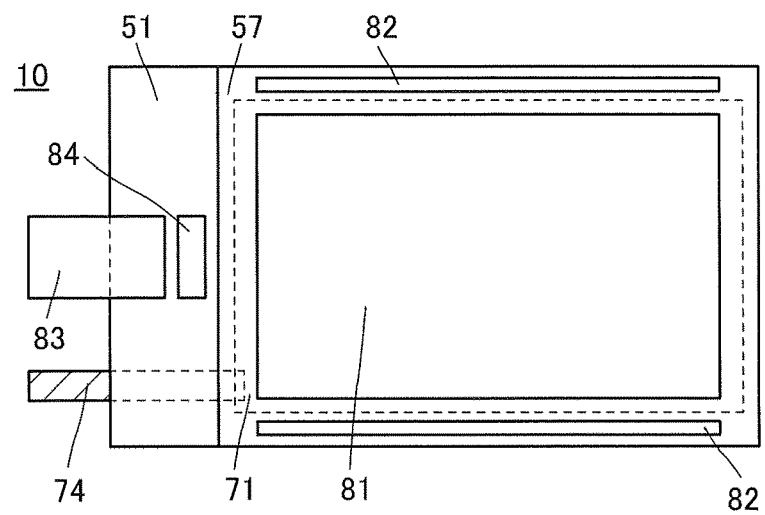
FIGS. 5A-5C A top view and bottom views illustrating examples of a display panel.

FIGS. 5(A) and (B) are a top view and a bottom view of the display panel 10 illustrated in FIG. 1(A) and the like.

Figure 5B:
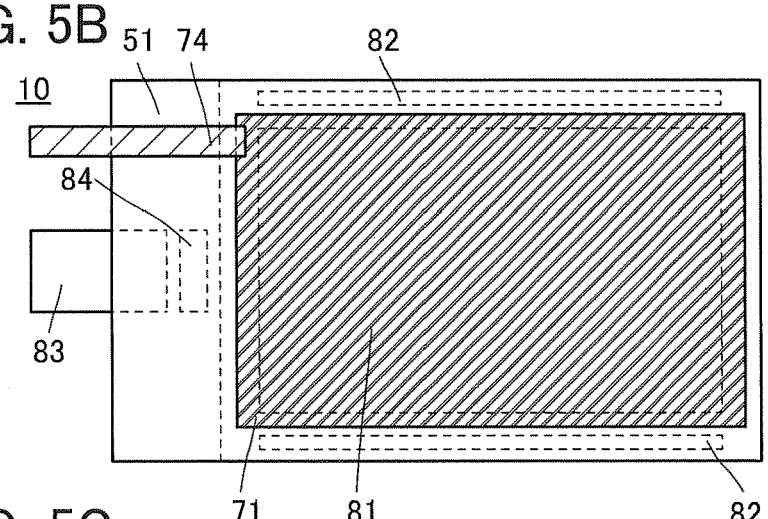

FIG. 5(A) is a view of a front surface (display surface) of the display panel 10 (also referred to as a top view of the display panel 10) and FIG. 5(B) is a view of a rear surface (surface opposite to the display surface) of the display panel 10 (also referred to as a bottom view of the display panel 10).

The display panel 10 includes a display region 81 and a scan line driver circuit 82. The display region 81 includes a plurality of pixels, a plurality of signal lines, and a plurality of scan lines, and has a function of displaying an image. The scan line driver circuit 82 has a function of outputting scan signals to the scan lines included in the display region 81.

In this embodiment, an example where the display panel 10 includes a scan line driver circuit is shown; however, one embodiment of the present invention is not limited thereto. The display panel 10 may include one of or both a scan line driver circuit and a signal line driver circuit or may include none of the scan line driver circuit and the signal line driver circuit. Furthermore, when the display panel 10 has a function as a touch sensor, the display panel 10 may include a sensor driver circuit.

In the display panel 10, an IC 84 is mounted on the flexible substrate 51 by a mounting method such as a COF method. The IC 84 includes, for example, any one or more of a signal line driver circuit, a scan line driver circuit, and a sensor driver circuit. Side surfaces of the IC 84 are covered with a resin such as an epoxy resin, whereby the mechanical strength of a connection portion of the display panel 10 and the IC 84 can be increased. Thus, even when the display panel 10 is bent, a crack is less likely to be generated and the reliability of the display panel 10 can be increased. As a resin, for example, a resin used as any of a variety of adhesives can be used.

In addition, an FPC 83 is electrically connected to the display panel 10. The IC 84 and the scan line driver circuit are supplied with a signal from the outside via the FPC 83. Furthermore, signals can be output to the outside from the IC 84 via the FPC 83.

An IC may be mounted on the FPC 83. For example, an IC including any one or more of a signal line driver circuit, a scan line driver circuit, and a sensor driver circuit may be mounted on the FPC 83. For example, the IC can be mounted on the FPC 83 by a mounting method such as a COF method or a TAB (tape automated bonding) method.

The conductive layer 71 is provided on the rear surface of the display panel 10. The conductive layer 71 overlaps with the display region 81. An area where the conductive layer 71 and the display region 81 overlap with each other is preferably greater than or equal to 80% and less than or equal to 100%, further preferably greater than or equal to 90% and less than or equal to 100%, still further preferably greater than or equal to 95% and less than or equal to 100% of the area of the display region 81. Furthermore, the area of the conductive layer 71 is preferably larger than the area of the display region 81. An area of the display region 81 which does not overlap with the conductive layer 71 is preferably smaller, in which case the display panel 10 is less likely to be affected by noise.

Figure 5C:
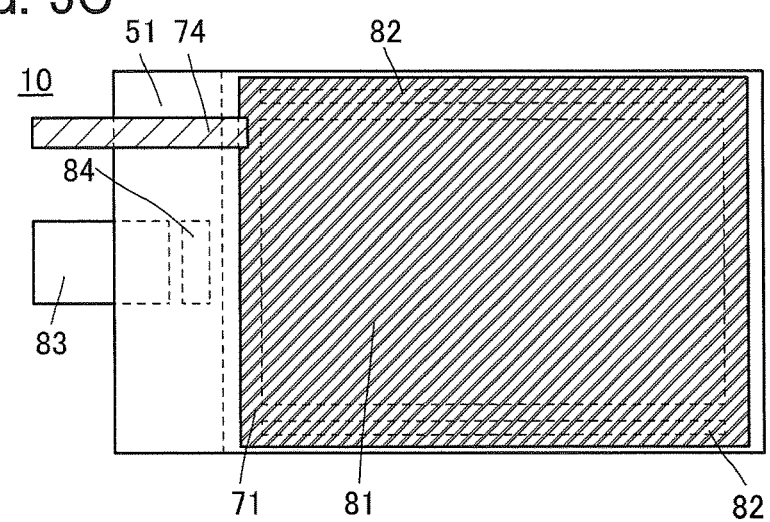

As illustrated in FIG. 5(C), the conductive layer 71 may overlap with the scan line driver circuit 82.

In FIGS. 5(A) to (C), an example where a conductor 74 is connected to the conductive layer 71 is shown. A constant potential is supplied to the conductor 74. The conductor 74 electrically connects a wiring supplied with a GND potential (also referred to as a GND line) to the conductive layer 71. As the conductor 74, a conductive tape, a conductive wiring, or the like is used. For example, a GND line of a power source such as a battery or a power supply circuit may be electrically connected to the conductive layer 71 through the conductor 74.

As illustrated in FIGS. 5(A) to (C), in the case where the light-emitting element 31 emits light toward the flexible substrate 57 side, the conductive layer 71 is positioned on a rear surface of the display panel (surface opposite to the display surface). When the conductive tape, the conductive wiring, or the like is directly connected to the conductive layer 71, steps along the shape of the conductive tape, the conductive wiring, or the like may be generated in the display panel 10. As the thickness of the display panel 10 is smaller, the steps along the shape become apparent. The display region is preferably smoother without a large step, in which case a more highly-attractive image is displayed. Thus, it is preferable that the connection portion of the conductive layer 71 and the conductor 74 not overlap with the display region 81.

Figure 6A:
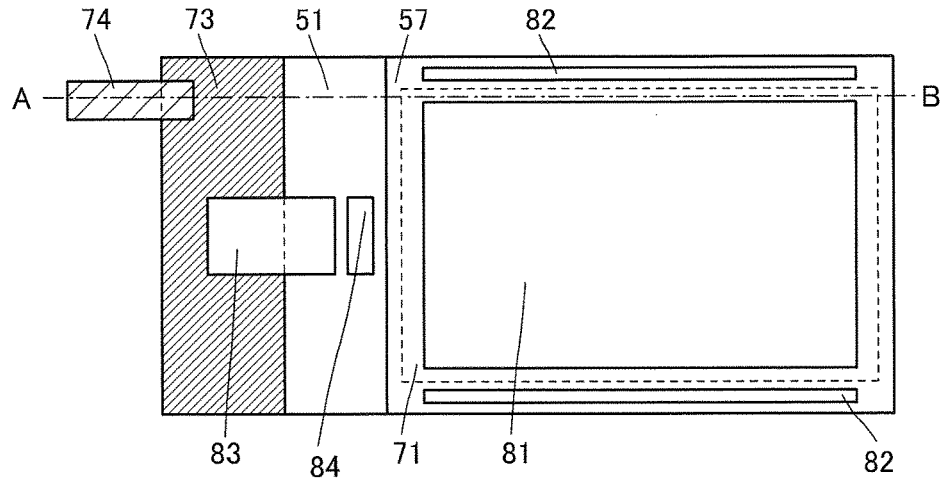
FIGS. 6A-6D Top views and cross-sectional views illustrating examples of a display device.
Figure 6B:
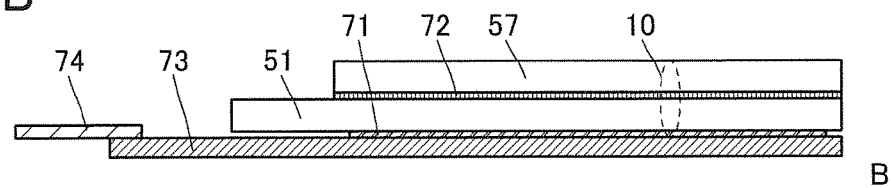

FIG. 6(A) is a top view of the display device illustrated in FIG. 2(A) and the like. FIG. 6(A) is a view of a front surface (display surface) of the display device and FIG. 6(B) is a cross-sectional view taken along dashed-dotted line A-B in FIG. 6(A). The display panel 10 has the same structure as the display panel in FIGS. 5(A) and (B); thus, detailed description is omitted.

In FIG. 6(B), layers which the display panel 10 includes between the flexible substrate 51 and the flexible substrate 57 are collectively referred to as an element layer 72. Specifically, the element layer 72 includes the layer 20 including a transistor, the light-emitting element 31, the insulating layer 53, the bonding layer 55, and the like illustrated in FIG. 1(A) and the like.

FIGS. 6(A) and (B) show an example where the conductor 74 is connected to the conductive layer 73. The conductor 74 is an example of a conductor which electrically connects the GND line to the conductive layer 73. The conductor 74 is supplied with the GND potential.

As illustrated in FIGS. 6(A) and (B), the connection portion of the conductive layer 73 and the conductor 74 is positioned in a portion which does not overlap with the display panel 10. Steps along the shape of the connection portion are formed at a position apart from the display region 81. Thus, the formation of the steps in the display region 81 can be prevented.

As described above, the connection portion of the conductor which electrically connects the conductive layer 71 included in the display panel 10 to the wiring which supplies a constant potential preferably does not overlap with the display region 81, further preferably does not overlap with the display panel 10. Thus, the formation of steps in the display region 81 can be prevented and the display quality of the display region 81 can be improved.

An area where the conductive layer 73 and the display panel 10 overlap with each other is preferably greater than or equal to 80% and less than or equal to 100% of the area of the display panel 10. Furthermore, the area of the conductive layer 73 is preferably larger than the area of the display panel 10. As the thickness of the display panel 10 is smaller, the steps along the shape of other structure placed on the rear surface side of the display device are easily formed in the display region 81. The conductive layer 73 overlaps with one surface of the display region 81, whereby the steps formed in the display region 81 can be reduced.

Figure 6C:
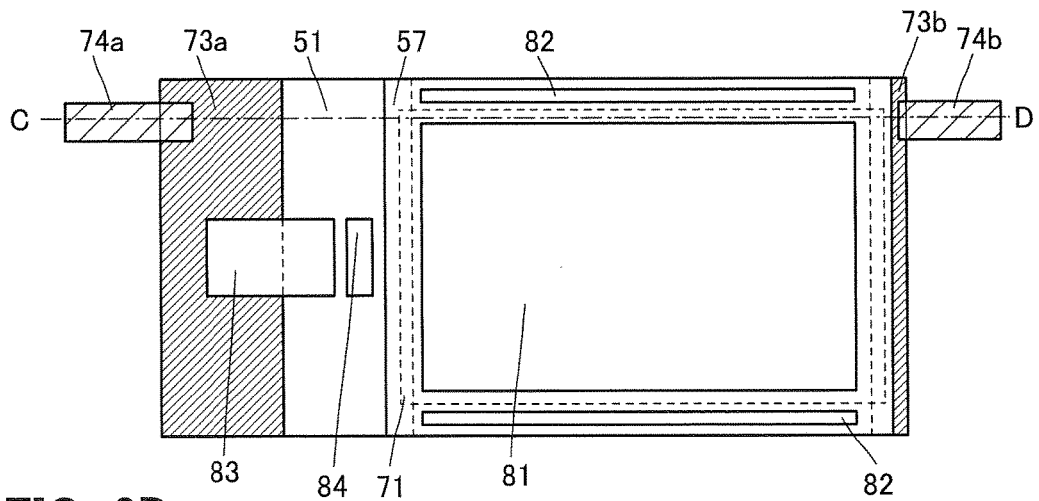
Figure 6D:
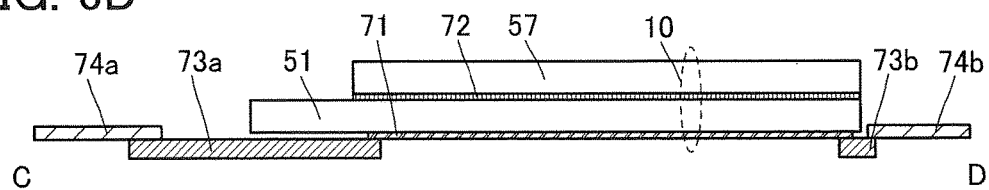

FIG. 6(C) is a top view of a display device which differs from the above-described structures. FIG. 6(C) is a view of a front surface (display surface) of the display device and FIG. 6(D) is a cross-sectional view taken along dashed-dotted line C-D in FIG. 6(C). The display panel 10 has the same structure as the display panel in FIGS. 5(A) and (B); thus, detailed description is omitted.

Although an example where the conductive layer 73 overlaps with (and is in contact with) the entire surface of the conductive layer 71 is shown in FIGS. 6(A) and (B), a conductive layer supplied with a constant potential may be in contact with part of the conductive layer 71 as illustrated in FIGS. 6(C) and (D).

The display device illustrated in FIGS. 6(C) and (D) includes the display panel 10, a conductive layer 73a, and a conductive layer 73b. The conductive layer 73a includes a portion in contact with the conductive layer 71. The conductive layer 73b includes a portion in contact with the conductive layer 71.

In this manner, a plurality of conductive layers in contact with the conductive layer 71 are provided, whereby a high flexibility region and a low flexibility region can be provided in the display device. The conductive layer 73a is provided to overlap with a region which is susceptible to bending damage such as the connection portion of the FPC 83 and the display panel 10, whereby the flexibility of the portion which is susceptible to bending damage is reduced. When the display panel 10 is changed in shape, a high flexibility region in which the conductive layers 73a and 73b are not provided is easily bent; thus, the portion which is susceptible to bending damage can be prevented from being bent with a large curvature, and the reliability of the display device can be increased.

A conductor 74a is connected to the conductive layer 73a. The conductor 74a is an example of a conductor which electrically connects the GND line to the conductive layer 73a. Similarly, a conductor 74b is connected to the conductive layer 73b.

As illustrated in FIGS. 6(C) and (D), the connection portion of the conductive layer 73a and the conductor 74a and the connection portion of the conductive layer 73b and the conductor 74b are each positioned in a portion which does not overlap with the display panel 10. Steps along the shape of the connection portion are formed at a position apart from the display region 81. Thus, the formation of the steps in the display region 81 can be prevented.

If the conductive layer 73 and the display panel 10 are completely fixed, when the display device is changed in shape, compressive stresses or tensile stress is applied to the display panel 10 and the display panel 10 might be broken.

Thus, in one embodiment of the present invention, the conductive layer 71 included in the display panel 10 has a portion which is not fixed to the conductive layer 73. Accordingly, when the display device is bent or opened, the position of at least one portion of the display panel 10 relative to the conductive layer 73 is changed. In addition, since a neutral plane can be formed in the display panel 10, the display panel 10 can be prevented from being broken by power applied to the display panel 10. Note that the conductive layer 71 may have a portion fixed to the conductive layer 73 or is not necessarily fixed to the conductive layer 73. Furthermore, even if the conductive layer 73 is thick, the neutral plane can be formed in the display panel 10. Thus, an allowable range of the thickness of the conductive layer 73 is widened.

Note that a neutral plane refers to a plane at which distortion of stress, such as compressive stress or tensile stress, due to deformation such as bending is not caused and a plane which does not expand or contract.

FIG. 7(A) shows an opened display device. The display device includes a stack of the conductive layer 73 and the display panel 10. Here, a side on which the FPC 83 is connected is a display surface of the display device. FIG. 7(B) shows a display device which is bent so that the display panel 10 is on the inside (hereinafter referred to as "bent inward"). In a portion surrounded by a dotted line in FIG. 7(A), end portions of the conductive layer 73 and the display panel 10 are aligned with each other; in contrast, in a portion surrounded by a dotted line in FIG. 7(B), the end portions of the conductive layer 73 and the display panel 10 are not aligned with each other. The same applies to FIG. 7(C) which shows a display device which is bent so that the display panel 10 is on the outside (hereinafter referred to as "bent outward").

There are one or a plurality of positions at which the display device is bent. FIG. 7(D) shows a tri-fold display device including one inward bending portion and one outward bending portion.

The conductive layer 71 and the conductive layer 73 can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, for each of the conductive layer 71 and the conductive layer 73, a light-transmitting conductive material such as indium oxide, indium tin oxide (ITO), indium oxide containing tungsten, indium zinc oxide containing tungsten, indium oxide containing titanium, indium tin oxide containing titanium, indium zinc oxide, zinc oxide, zinc oxide containing gallium, or indium tin oxide containing silicon may be used. Alternatively, a semiconductor such as an oxide semiconductor or polycrystalline silicon whose resistance is lowered by containing an impurity element or the like, or silicide such as nickel silicide may be used. A film including graphene can be used as well. The film including graphene can be formed, for example, by reducing a film containing graphene oxide which is formed into a film shape. A semiconductor such as an oxide semiconductor containing an impurity element may be used. Alternatively, the conductive layer 71 and the conductive layer 73 may each be formed using a conductive paste of silver, carbon, copper, or the like or a conductive polymer such as a polythiophene. A conductive paste is preferable because it is inexpensive. A conductive polymer is preferable because it is easily applied.

In the case where the conductive layer 71 and the conductive layer 73 are positioned on the display surface side of the display panel 10, as each of the conductive layer 71 and the conductive layer 73, a conductive layer which transmits visible light is used. In the case where the conductive layer 71 and the conductive layer 73 are positioned on the side opposite to the display surface, the conductive layer 71 and the conductive layer 73 do not necessarily have a light-transmitting property.

In the case where the conductive layer 71 is formed directly on the surface of the display panel 10, the thickness of the conductive layer 71 is larger than or equal to 1 nm and smaller than or equal to 1000 nm, preferably larger than or equal to 1 nm and smaller than or equal to 100 nm, further preferably larger than or equal to 1 nm and smaller than or equal to 50 nm, still further preferably larger than or equal to 1 nm and smaller than or equal to 25 nm. The thickness of the conductive layer 71 is preferably smaller, in which case internal stress of the conductive layer 71 can be reduced and the display panel 10 is less likely to be warped.

As the conductive layer 73, a metal foil, a metal plate, or the like can be used. In the case where the conductive layer 73 overlaps with the bending portion of the display panel 10, the thickness and hardness of the conductive layer 73 are enough to have flexibility.

Furthermore, a film or a sheet of a stacked-layer structure of an insulating layer and a layer containing a conductive material may be used. The layer containing a conductive material functions as the conductive layer 71 or the conductive layer 73. As the film or the sheet of the stacked-layer structure of the insulating layer and the layer containing a conductive material, a conductive film and a conductive sheet in which the layer containing a conductive material is provided over a resin film or a resin sheet are given as examples. Specifically, a film, a sheet, and the like in which copper, ITO, graphene, or a carbon nanotube is formed over a polyethylene terephtalate (PET) film or a polyethylene naphthalate (PEN) film are given as examples. Alternatively, a sheet formed by hardening graphite may be used. Graphite and graphene are preferable because they can each be formed as a thin film and have high conductivity.

The thicknesses of the conductive film, the conductive sheet, and the like are each preferably larger than or equal to 20 μm and less than or equal to 200 μm, further preferably larger than or equal to 20 μm and less than or equal to 150 μm, further preferably larger than or equal to 20 μm and less than or equal to 100 μm. Note that in the case where there is no limitation on the degree of flexibility of the conductive sheet, the thickness may be larger than 200 μm.

When local pressure is applied to the display panel 10 due to the contact with a human nail, a stylus, or the like, the display panel 10 may be damaged, and further, may be broken. A member positioned under the display panel 10 is preferably harder, in which case the change in shape of the display panel 10 is suppressed, and the generation of pin holes in the display panel 10 and the damage to the display panel 10 can be suppressed. For example, a film in which the layer containing a conductive material (corresponding to the conductive layer 73) is formed over a resin layer having Rockwell hardness of higher than or equal to M60 and lower than or equal to M120 is preferably used. As the resin layer having Rockwell hardness of higher than or equal to M60 and lower than or equal to M120, a PET film is given as an example.

Furthermore, a housing of the display device may function as the conductive layer 73.

For each of the flexible substrates 51 and 57, a material such as glass, quartz, a resin, a metal, an alloy, or a semiconductor thin enough to have flexibility can be used. The substrate through which light is extracted from the light-emitting element is formed using a material which transmits the light. For example, the thickness of the flexible substrate is preferably greater than or equal to 1 μm and less than or equal to 200 μm, further preferably greater than or equal to 1 μm and less than or equal to 100 μm, still further preferably greater than or equal to 10 μm and less than or equal to 50 μm, and particularly preferably greater than or equal to 10 μm and less than or equal to 25 μm. The thickness and hardness of the flexible substrate are set in the range where mechanical strength and flexibility can be balanced against each other. The flexible substrate may have a single-layer structure or a stacked-layer structure.

A resin, which has a specific gravity smaller than that of glass, is preferably used for the flexible substrate, in which case the display panel can be lightweight as compared with the case where glass is used.

The substrate is preferably formed using a material with high toughness. In that case, a display panel with high impact resistance that is less likely to be broken can be provided. For example, when a resin substrate or a thin metal or alloy substrate is used, the display panel can be lightweight and unlikely to be broken as compared with the case where a glass substrate is used.

A metal material and an alloy material, which have high thermal conductivity, are preferable because they can easily conduct heat to the whole substrate and accordingly can prevent a local temperature rise in the display panel. The thickness of a substrate using a metal material or an alloy material is preferably greater than or equal to 10 μm and less than or equal to 200 μm, further preferably greater than or equal to 20 μm and less than or equal to 50 μm.

There is no particular limitation on a material of the metal substrate or the alloy substrate, but it is preferable to use, for example, aluminum, copper, nickel, or a metal alloy such as an aluminum alloy or stainless steel. Examples of a material for a semiconductor substrate include silicon and the like.

Furthermore, when a material with high thermal emissivity is used for the substrate, the surface temperature of the display panel can be prevented from rising, leading to inhibition of breakage or a decrease in reliability of the display panel. For example, the substrate may have a stacked-layer structure of a metal substrate and a layer with high thermal emissivity (the layer can be formed using a metal oxide or a ceramic material, for example).

Examples of materials having flexibility and a light-transmitting property include polyester resins such as PET and PEN, a polyacrylonitrile resin, an acrylic resin, a polyimide resin, a polymethyl methacrylate resin, a polycarbonate (PC) resin, a polyether sulfone (PES) resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, polytetrafluoroethylene (PTFE), and an ABS resin. In particular, a material with a low coefficient of linear expansion is preferred, and for example, a polyamide imide resin, a polyimide resin, a polyamide resin, or PET can be suitably used. A substrate in which a fibrous body is impregnated with a resin (also referred to as a prepreg), a substrate whose linear thermal expansion coefficient is reduced by mixing an inorganic filler with a resin, or the like can also be used.

The flexible substrate may have a stacked-layer structure in which at least one of a hard coat layer (e.g., a silicon nitride layer) by which a surface of the device is protected from damage, a layer for dispersing pressure (e.g., an aramid resin layer), and the like is stacked over a layer of any of the above-mentioned materials.

When a glass layer is used for the flexible substrate, a barrier property against water and oxygen can be improved, and thus a highly reliable display panel can be provided.

For example, a flexible substrate in which a glass layer, a bonding layer, and a resin layer are stacked from the side closer to a light-emitting element can be used. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and high flexibility. The thickness of the resin layer is greater than or equal to 10 μm and less than or equal to 200 µm, preferably greater than or equal to 20 µm and less than or equal to 50 µm. By providing such a resin layer, occurrence of a crack and a break in the glass layer can be inhibited and mechanical strength can be improved. With the substrate that includes such a composite material of a glass material and a resin, a highly reliable flexible display panel can be provided.

For the bonding layer, various curable adhesives such as a photocurable adhesive (e.g., an ultraviolet curable adhesive), a reactive curable adhesive, a thermosetting adhesive, and an anaerobic adhesive can be used. Alternatively, an adhesive sheet or the like may be used.

Furthermore, the bonding layer may include a drying agent. For example, it is possible to use a substance that adsorbs moisture by chemical adsorption, such as oxide of an alkaline earth metal (e.g., calcium oxide or barium oxide). Alternatively, it is possible to use a substance that adsorbs moisture by physical adsorption, such as zeolite or silica gel. The drying agent is preferably included because it can prevent impurities such as moisture from entering the functional element, thereby improving the reliability of the display panel.

When a filler with a high refractive index or a light scattering member is contained in the bonding layer, the efficiency of light extraction from the light-emitting element can be improved. For example, titanium oxide, barium oxide, zeolite, or zirconium can be used.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used. Any of a variety of display elements can be used in the display device of one embodiment of the present invention. For example, a liquid crystal element, an electrophoretic element, a display element using MEMS (micro electro mechanical systems), or the like may be used.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

The conductive film that transmits visible light can be formed using, for example, indium oxide, ITO, indium zinc oxide, zinc oxide (ZnO), or zinc oxide containing gallium. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Further, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used. An alloy containing silver and copper is preferable because of its high heat resistance. Further, when a metal film or a metal oxide film is stacked on and in contact with an aluminum alloy film, oxidation of the aluminum alloy film can be prevented. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

The EL layer 43 includes at least a light-emitting layer. The EL layer 43 may include a plurality of light-emitting layers. In addition to the light-emitting layer, the EL layer 43 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 43, either a low molecular compound or a high molecular compound can be used, and an inorganic compound may also be used. Each of the layers included in the EL layer 43 can be formed by any of the following methods: an evaporation method (including a vacuum evaporation method), a transfer method, a printing method, an ink-jet method, a coating method, and the like.

The light-emitting element 31 may contain two or more kinds of light-emitting substances. Thus, for example, a light-emitting element that emits white light can be achieved. For example, light-emitting substances are selected so that two or more kinds of light-emitting substances emit complementary colors to obtain white light emission. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 31 preferably has two or more peaks in the wavelength range in a visible region (e.g., greater than or equal to 350 nm and less than or equal to 750 nm or greater than or equal to 400 nm and less than or equal to 800 nm).

Moreover, the light-emitting element 31 may be a single element including one EL layer or a tandem element in which EL layers are stacked with a charge generation layer provided therebetween.

In one embodiment of the present invention, a light-emitting element containing an inorganic compound such as a quantum dot may be employed. Examples of quantum dot materials include a colloidal quantum dot material, an alloyed quantum dot material, a core-shell quantum dot material, and a core quantum dot material. For example, an element such as cadmium (Cd), selenium (Se), zinc (Zn), sulfur (S), phosphorus (P), indium (In), tellurium (Te), lead (Pb), gallium (Ga), arsenic (As), or aluminum (Al) may be contained.

The structure of the transistors in the display panel is not particularly limited. For example, a planar transistor, a forward staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

A semiconductor material used for the semiconductor layer of the transistor is not particularly limited, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

An oxide semiconductor is preferably used as a semiconductor where a channel of the transistor is formed. In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). Further preferably, the oxide semiconductor contains an oxide represented by an In-M-Zn oxide (M is a metal such as Al, Ti, Ga, Ge, Y, Zr, Sn, La, Ce, Hf, or Nd).

A c-axis aligned crystalline oxide semiconductor (CAAC-OS) is preferably used as a semiconductor material for the transistors. Unlike an amorphous semiconductor, the CAAC-OS has few defect states, so that the reliability of the transistor can be improved. Moreover, since no grain boundary is observed in the CAAC-OS, a stable and uniform film can be formed over a large area, and stress that is caused by bending a flexible display device does not easily make a crack in a CAAC-OS film.

The CAAC-OS is a crystalline oxide semiconductor in which c-axes of crystals are oriented in a direction substantially perpendicular to the film surface. It has been found that oxide semiconductors have a variety of crystal structures other than a single-crystal structure. An example of such structures is a nano-crystal (nc) structure, which is an aggregate of nanoscale microcrystals. The crystallinity of a CAAC-OS structure is lower than that of a single-crystal structure and higher than that of an nc structure.

The CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

An organic insulating material or an inorganic insulating material can be used for the insulating layers included in the display panel. Examples of resins include an acrylic resin, an epoxy resin, a polyimide resin, a polyamide resin, a polyimide-amide resin, a siloxane resin, a benzocyclobutene-based resin, and a phenol resin. Examples of inorganic insulating films include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

For each of the conductive layers included in the display panel, any of the above-described materials which can be used for the conductive layer 71 and the conductive layer 73 can be used.

As described above, in the display device of this embodiment, even if the thickness of the display panel is extremely small, the change in potential of the conductive layer included in the layer including the transistor due to noise from the outside can be suppressed and the display defects of the display panel can be reduced. In addition, steps are not easily formed in the display region and degradation in the display quality can be suppressed. Furthermore, the display panel has flexibility to have a structure which is less likely to be damaged due to bending.

This embodiment can be combined with any of other embodiments as appropriate.

(Embodiment 2)

In this embodiment, structures and a manufacturing method of the display panel of one embodiment of the present invention will be described with reference to FIG. 8 to FIG. 22. In this embodiment, a display panel that uses an EL element as a display element is described as an example.

In this embodiment, the display panel can have a structure in which sub-pixels of three colors of red (R), green (G), and blue (B) express one color, a structure in which sub-pixels of four colors of R, G, B, and white (W) express one color, a structure in which sub-pixels of four colors of R, G, B, and yellow (Y) express one color, or the like. There is no particular limitation on color elements, and colors other than R, G, B, W, and Y may be used. For example, cyan or magenta may be used.

<Structure Example 1>

Figure 8:
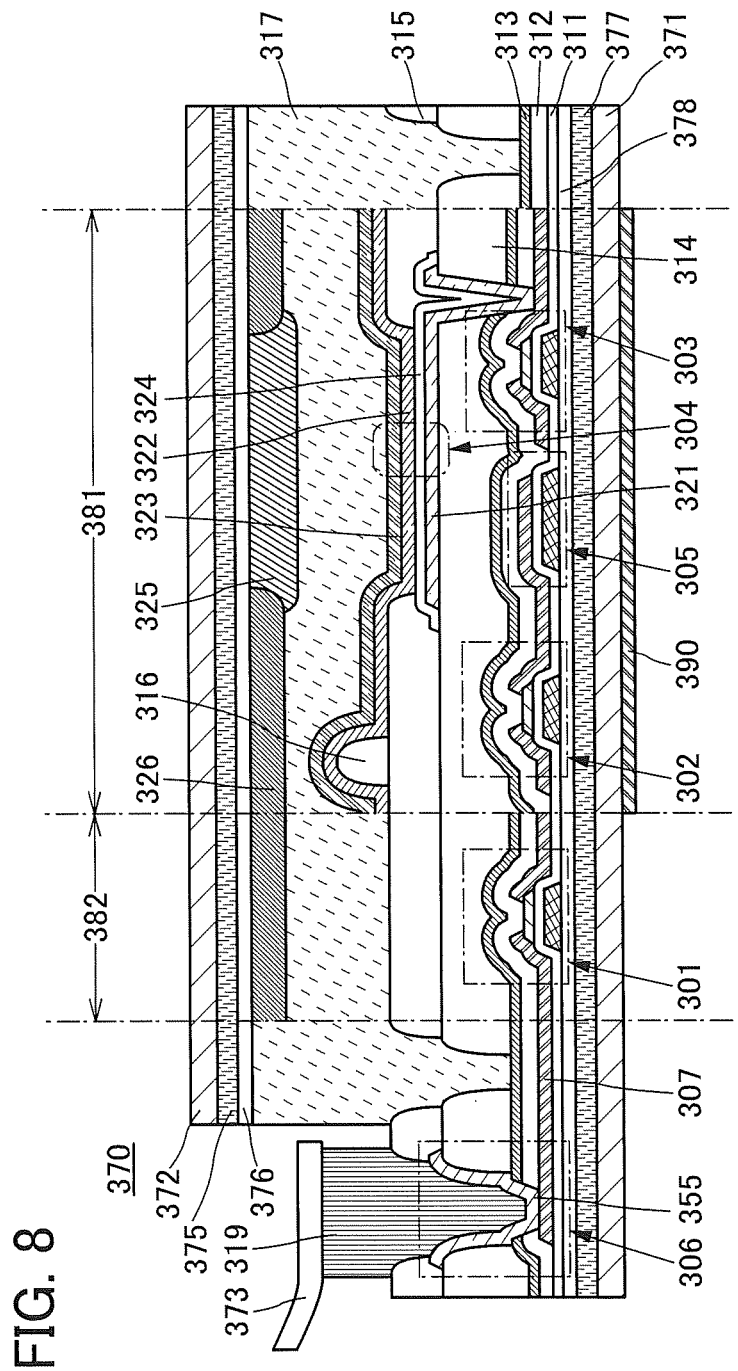
FIG. 8 A cross-sectional view illustrating an example of a display panel.

FIG. 8 is a cross-sectional view of a display panel 370 employing a color filter method and having a top-emission structure.

The display panel 370 includes a conductive layer 390, a flexible substrate 371, a bonding layer 377, an insulating layer 378, a plurality of transistors, a capacitor 305, a conductive layer 307, an insulating layer 312, an insulating layer 313, an insulating layer 314, an insulating layer 315, a light-emitting element 304, a conductive layer 355, a spacer 316, a bonding layer 317, a coloring layer 325, a light-blocking layer 326, a flexible substrate 372, a bonding layer 375, and an insulating layer 376.

The conductive layer 390 is provided in at least a display portion 381. The conductive layer 390 may be provided also in a driver circuit portion 382 and the like. The conductive layer 390 is positioned on the side opposite to the display surface side of the display panel 370, and thus the conductive layer 390 does not necessarily transmit visible light.

The driver circuit portion 382 includes a transistor 301. The display portion 381 includes a transistor 302 and a transistor 303.

Each transistor includes a gate, a gate insulating layer 311, a semiconductor layer, a source, and a drain. The gate and the semiconductor layer overlap with each other with the gate insulating layer 311 provided therebetween. Part of the gate insulating layer 311 functions as a dielectric of the capacitor 305. The conductive layer functioning as the source or the drain of the transistor 302 serves as one electrode of the capacitor 305.

In FIG. 8, a bottom-gate transistor is illustrated. The structure of the transistor may be different between the driver circuit portion 382 and the display portion 381. The driver circuit portion 382 and the display portion 381 may each include a plurality of kinds of transistors.

The capacitor 305 includes a pair of electrodes and the dielectric therebetween. The capacitor 305 includes a conductive layer that is formed using the same material and the same step as the gate of the transistor and a conductive layer that is formed using the same material and the same step as the source and the drain of the transistor.

The insulating layer 312, the insulating layer 313, and the insulating layer 314 are each provided to cover the transistors and the like. The number of the insulating layers covering the transistors and the like is not particularly limited. The insulating layer 314 functions as a planarization layer. It is preferable that at least one of the insulating layer 312, the insulating layer 313, and the insulating layer 314 be formed using a material inhibiting diffusion of impurities such as water and hydrogen. Diffusion of impurities from the outside into the transistors can be effectively inhibited, leading to improved reliability of the display panel.

In the case where the insulating layer 314 is formed using an organic material, impurities such as moisture might enter the light-emitting element 304 and the like from the outside of the display panel through the insulating layer 314 exposed at an end portion of the display panel. Deterioration of the light-emitting element 304 due to the entry of an impurity leads to deterioration of the display panel. Thus, as illustrated in FIG. 8, it is preferable that an opening which reaches an inorganic film (here, the insulating layer 313) be formed in the insulating layer 314 so that an impurity such as moisture entering from the outside of the display panel does not easily reach the light-emitting element 304.

FIG. 12(A) is a cross-sectional view illustrating the case where the opening is not provided in the insulating layer 314. The insulating layer 314 is preferably provided in the entire area of the display panel as illustrated in FIG. 12(A), in which case the yield of the separation step described below can be increased.

FIG. 12(B) is a cross-sectional view illustrating the case where the insulating layer 314 is not positioned at the end portion of the display panel. Since an insulating layer formed using an organic material is not positioned at the end portion of the display panel in the structure of FIG. 12(B), entry of impurities into the light-emitting element 304 can be inhibited.

The light-emitting element 304 includes an electrode 321, an EL layer 322, and an electrode 323. The light-emitting element 304 may include an optical adjustment layer 324. The light-emitting element 304 has a top-emission structure with which light is emitted to the coloring layer 325 side.

The transistor, the capacitor, the wiring, and the like are provided to overlap with a light-emitting region of the light-emitting element 304, whereby an aperture ratio of the display portion 381 can be increased.

One of the electrode 321 and the electrode 323 functions as an anode and the other functions as a cathode. When a voltage higher than the threshold voltage of the light-emitting element 304 is applied between the electrode 321 and the electrode 323, holes are injected to the EL layer 322 from the anode side and electrons are injected to the EL layer 322 from the cathode side. The injected electrons and, holes are recombined in the EL layer 322 and a light-emitting substance contained in the EL layer 322 emits light.

The electrode 321 is electrically connected to the source or the drain of the transistor 303, directly or through another conductive layer. The electrode 321 functions as a pixel electrode and is provided for each light-emitting element 304. Two adjacent electrodes 321 are electrically insulated from each other by the insulating layer 315.

The EL layer 322 is a layer containing a light-emitting substance.

The electrode 323 functions as a common electrode and is provided for a plurality of light-emitting elements 304. A fixed potential is supplied to the electrode 323.

The light-emitting element 304 overlaps with the coloring layer 325 with the bonding layer 317 provided therebetween. The spacer 316 overlaps with the light-blocking layer 326 with the bonding layer 317 provided therebetween. Although FIG. 8 illustrates the case where a space is provided between the light-emitting element 304 and the light-blocking layer 326, the light-emitting element 304 and the light-blocking layer 326 may be in contact with each other. Although the spacer 316 is provided on the flexible substrate 371 side in the structure illustrated in FIG. 8, the spacer 316 may be provided on the flexible substrate 372 side (e.g., in a position closer to the flexible substrate 371 than that of the light-blocking layer 326).

Owing to the combination of a color filter (the coloring layer 325) and a microcavity structure (the optical adjustment layer 324), light with high color purity can be extracted from the display panel. The thickness of the optical adjustment layer 324 is varied depending on the color of the pixel.

The coloring layer is a colored layer that transmits light in a specific wavelength range. For example, a color filter that transmits light in a specific wavelength range, such as red, green, blue, or yellow light, can be used. Examples of materials that can be used for the coloring layer include a metal material, a resin material, and a resin material containing a pigment or dye.

Note that one embodiment of the present invention is not limited to a color filter method, and a separate coloring method, a color conversion method, a quantum dot method, and the like may be employed.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. For the light-blocking layer, a material that blocks light from the light-emitting element can be used; for example, a black matrix can be formed using a metal material or a resin material containing pigment or dye. Note that it is preferable to provide the light-blocking layer in a region other than the pixel, such as the driver circuit, in which case undesired leakage of guided light or the like can be suppressed.

An overcoat may be provided to cover the coloring layer and the light-blocking layer. The overcoat can prevent an impurity and the like contained in the coloring layer from being diffused into the light-emitting element. The overcoat is formed with a material that transmits light emitted from the light-emitting element; for example, it is possible to use an inorganic insulating film such as a silicon nitride film or a silicon oxide film, an organic insulating film such as an acrylic film or a polyimide film, or a stacked layer of an organic insulating film and an inorganic insulating film.

In the case where a material of the bonding layer is applied to the coloring layer and the light-blocking layer, a material that has high wettability with respect to the material of the bonding layer is preferably used as the material of the overcoat. For example, an oxide conductive film such as an ITO film or a metal film such as an Ag film which is thin enough to transmit light is preferably used as the overcoat.

When a material that has high wettability with respect to the material for the bonding layer is used as the material of the overcoat, the material for the bonding layer can be uniformly applied. Thus, entry of bubbles in the step of attaching the pair of substrates to each other can be prevented, and thus a display defect can be prevented.

The insulating layer 378 and the flexible substrate 371 are attached to each other with the bonding layer 377. The insulating layer 376 and the flexible substrate 372 are attached to each other with the bonding layer 375. The insulating layer 376 and the insulating layer 378 are preferably highly resistant to moisture. The light-emitting element 304, the transistors, and the like are preferably provided between a pair of insulating layers which are highly resistant to moisture, in which case impurities such as moisture can be prevented from entering these elements, leading to higher reliability of the display panel.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], still further preferably lower than or equal to $1 \times 10^{-8}$ [g/(m$^2$·day)].

A connection portion 306 includes the conductive layer 307 and the conductive layer 355. The conductive layer 307 and the conductive layer 355 are electrically connected to each other. The conductive layer 307 can be formed using the same material and the same step as those of the source and the drain of the transistor. The conductive layer 355 is electrically connected to an external input terminal through which a signal or a potential from the outside is transmitted to the driver circuit portion 382. Here, an example in which an FPC 373 is provided as an external input terminal is shown. The FPC 373 and the conductive layer 355 are electrically connected to each other through a connector 319.

As the connector 319, any of various anisotropic conductive films (ACF), anisotropic conductive pastes (ACP), and the like can be used.

<Example of Manufacturing Method of Structure Example 1>

An example of a method for manufacturing the structure example 1 is described with reference to FIG. 9 to FIG. 11. FIG. 9 to FIG. 11 are cross-sectional views illustrating a method for manufacturing the display portion 381 of the display panel 370.

As illustrated in FIG. 9(A), a separation layer 403 is formed over a formation substrate 401. Next, a layer to be separated is formed over the separation layer 403. Here, the layer to be separated that is formed over the separation layer 403 corresponds to the layers from the insulating layer 378 to the light-emitting element 304 in FIG. 8.

As the formation substrate 401, a substrate having at least heat resistance high enough to withstand process temperature in a manufacturing process is used. As the formation substrate 401, for example, a glass substrate, a quartz substrate, a sapphire substrate, a semiconductor substrate, a ceramic substrate, a metal substrate, a resin substrate, or a plastic substrate can be used.

Note that it is preferable to use a large-sized glass substrate as the formation substrate 401 in terms of productivity. For example, a glass substrate having a size greater than or equal to the 3rd generation (550 mm×650 mm) and less than or equal to the 10th generation (2950 mm×3400 mm) or a glass substrate having a larger size than the 10th generation is preferably used.

In the case where a glass substrate is used as the formation substrate 401, as a base film, an insulating film such as a silicon oxide film, a silicon oxynitride film, a silicon nitride film, or a silicon nitride oxide film is preferably formed between the formation substrate 401 and the separation layer 403, in which case contamination from the glass substrate can be prevented.

The separation layer 403 can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or an In—Ga—Zn oxide can be used. The separation layer 403 is preferably formed using a high-melting-point metal material such as tungsten, titanium, or molybdenum, in which case the degree of freedom of the process for forming the layer to be separated can be increased.

The separation layer 403 can be formed by, for example, a sputtering method, a plasma CVD method, a coating method (including a spin coating method, a droplet discharging method, a dispensing method, and the like), a printing method, or the like. The thickness of the separation layer 403 is, for example, greater than or equal to 1 nm and less than or equal to 200 nm, preferably greater than or equal to 10 nm and less than or equal to 100 nm.

In the case where the separation layer 403 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum is an alloy of tungsten and molybdenum, for example.

In the case where the separation layer 403 is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide (N$_2$O) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer 403 is changed by the plasma treatment or heat treatment, whereby adhesion between the separation layer 403 and the insulating film formed later can be controlled.

Note that the separation layer is not necessary in the case where separation at the interface between the formation substrate and the layer to be separated is possible. For example, a glass substrate is used as the formation substrate, and an organic resin such as polyimide, polyester, polyolefin, polyamide, polycarbonate, or acrylic is formed in contact with the glass substrate. Next, adhesion between the formation substrate and the organic resin is improved by laser light irradiation or heat treatment. Then, an insulating film, a transistor, and the like are formed over the organic resin. After that, separation at the interface between the formation substrate and the organic resin can be performed by performing laser light irradiation with energy density higher than that of the above laser light irradiation or performing heat treatment at a temperature higher than that of the above heat treatment. Moreover, the interface between the formation substrate and the organic resin may be filled with a liquid to perform separation.

The organic resin may be used for a substrate of the device. Alternatively, the organic resin may be removed and another substrate may be attached to an exposed surface of the layer to be separated with the use of an adhesive.

Alternatively, separation at the interface between a metal layer and the organic resin may be performed in the following manner: the metal layer is provided between the formation substrate and the organic resin and current is made to flow in the metal layer so that the metal layer is heated.

The insulating layer 378 preferably has a single-layer structure or a stacked-layer structure including any of a silicon nitride film, a silicon oxynitride film, a silicon oxide film, a silicon nitride oxide film, and the like.

The insulating layer 378 can be formed by a sputtering method, a plasma CVD method, a coating method, a printing method, or the like. For example, the insulating layer 378 is formed at a temperature higher than or equal to 250° C. and lower than or equal to 400° C. by a plasma CVD method, whereby the insulating layer 378 can be a dense film having an excellent moisture-resistant property. Note that the thickness of the insulating layer 378 is preferably greater than or equal to 10 nm and less than or equal to 3000 nm, or further preferably greater than or equal to 200 nm and less than or equal to 1500 nm.

As illustrated in FIG. 9(B), a separation layer 413 is formed over a formation substrate 411. Next, a layer to be separated is formed over the separation layer 413. Here, the layer to be separated that is formed over the separation layer 413 corresponds to the insulating layer 376, the light-blocking layer 326, and the coloring layer 325 in FIG. 8.

The formation substrate 411, the separation layer 413, and the insulating layer 376 can be formed using the materials that can be used for the formation substrate 401, the separation layer 403, and the insulating layer 378, respectively.

Then, as illustrated in FIG. 9(C), the formation substrate 401 and the formation substrate 411 are attached to each other with the bonding layer 317.

Figure 10A:
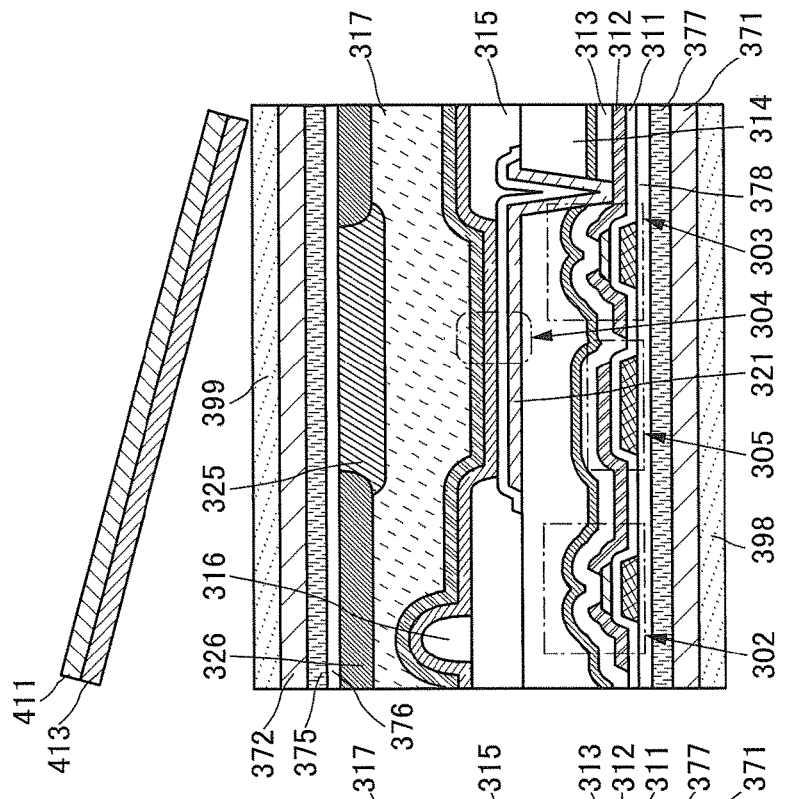
FIGS. 10A-10B Cross-sectional views illustrating an example of a method for manufacturing a display panel.

Then, as illustrated in FIG. 10(A), the formation substrate 401 and the insulating layer 378 are separated from each other. Note that either of the formation substrate 401 and the formation substrate 411 may be separated first.

Before the separation of the formation substrate 401 and the insulating layer 378, a separation starting point is preferably formed using laser light, a sharp knife, or the like. The insulating layer 378 is partly cracked (or broken), whereby the separation starting point can be formed. For example, laser light irradiation enables part of the insulating layer 378 to be melted, evaporated, or thermally broken.

Then, the insulating layer 378 and the formation substrate 401 are separated from the formed separation starting point by physical force (e.g., a separation process with a human hand or a jig, or a separation process by rotation of a roller adhered to the substrate). In the lower part of FIG. 10(A), the separation layer 403 and the formation substrate 401 that are separated from the insulating layer 378 are illustrated. After that, as illustrated in FIG. 10(A), the exposed insulating layer 378 and the flexible substrate 371 are attached to each other with the bonding layer 377.

In many cases, both sides of a film that can be favorably used as the flexible substrate 371 are provided with separation films (also referred to as separate films or release films). When the flexible substrate 371 and the insulating layer 378 are bonded to each other, it is preferable that only one separation film which is provided over the flexible substrate 371 be separated, and the other separation film remain. This facilitates transfer and processing in later steps. FIG. 10(A) illustrates an example in which one surface of the flexible substrate 371 is provided with a separation film 398.

Figure 10B:
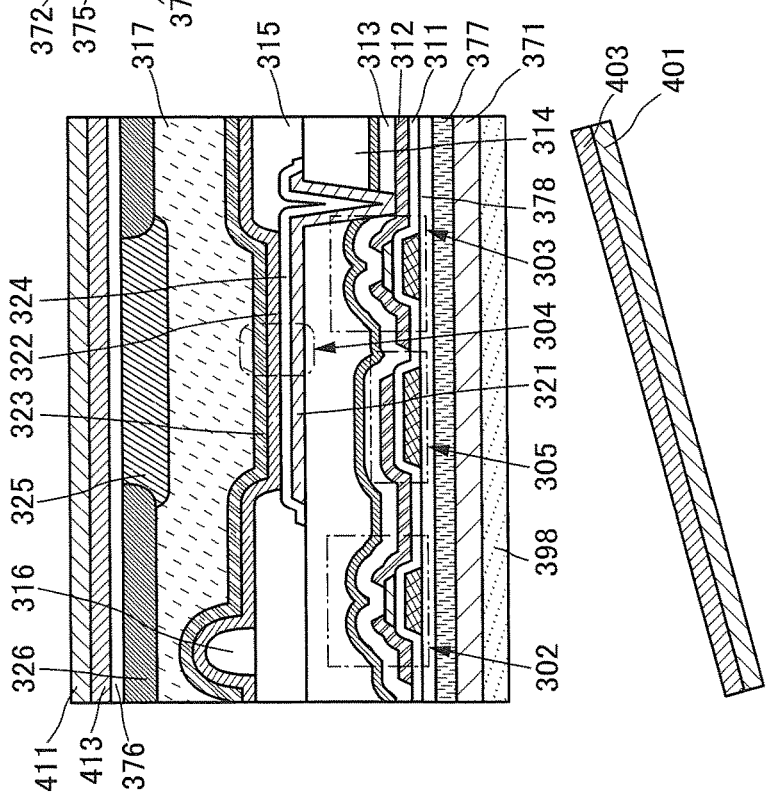

Then, as illustrated in FIG. 10(B), the formation substrate 411 and the insulating layer 376 are separated from each other. In the upper part of FIG. 10(B), the separation layer 413 and the formation substrate 411 that are separated from the insulating layer 376 are illustrated. Next, the exposed insulating layer 376 and the flexible substrate 372 are attached to each other with the bonding layer 375. FIG. 10(B) illustrates an example in which one surface of the flexible substrate 372 is provided with a separation film 399.

Next, as illustrated in FIG. 11(A), the peeling film 398 is peeled, and the conductive layer 390 is formed on the surface of the exposed flexible substrate 371.

Then, as illustrated in FIG. 11(B), the peeling film 399 is peeled. The peeling film 399 is preferably peeled after the formation of the conductive layer 390. When the conductive layer 390 is formed in the state of including the peeling film 399, the warp of the display panel due to internal stress of the conductive layer 390 can be suppressed.

As described above, in one embodiment of the present invention, each of the functional elements and the like included in the display panel is formed over the formation substrate; thus, even in the case where a high-resolution display panel is manufactured, high alignment accuracy of the flexible substrate is not required. It is thus easy to attach the flexible substrate. In addition, since the functional element and the like can be fabricated with high temperatures, a highly reliable display panel can be obtained.

<Structure Example 2>

FIG. 13(A) shows a cross-sectional view of a display panel employing a color filter method. Note that in the following structure examples, components similar to those in the above structure example will not be described in detail.

The display panel in FIG. 13(A) includes a conductive layer 380, the flexible substrate 371, the bonding layer 377, the insulating layer 378, a plurality of transistors, the conductive layer 307, the insulating layer 312, the insulating layer 313, the insulating layer 314, the insulating layer 315, the light-emitting element 304, the conductive layer 355, the bonding layer 317, the coloring layer 325, the flexible substrate 372, and the insulating layer 376.

The conductive layer 380 is provided in at least the display portion 381. The conductive layer 380 may be provided also in a driver circuit portion 382 and the like. The conductive layer 380 is positioned on the display surface of the display panel, and thus the conductive layer 380 is formed using a material which transmits visible light.

The driver circuit portion 382 includes the transistor 301. The display portion 381 includes the transistor 303.

Each transistor includes two gates, the gate insulating layer 311, a semiconductor layer, a source, and a drain. The two gates each overlap with the semiconductor layer with the gate insulating layer 311 provided therebetween. FIG. 13(A) illustrates an example where each transistor has a structure in which the semiconductor layer is sandwiched between the two gates. Such transistors can have higher field-effect mobility and thus have higher on-state current than other transistors. Consequently, a circuit capable of high-speed operation can be obtained. Furthermore, the area occupied by a circuit can be reduced. The use of the transistor having high on-state current can reduce signal delay in wirings and can reduce display luminance variation even in a display panel in which the number of wirings is increased because of an increase in size or resolution. FIG. 13(A) illustrates an example in which one of the gates is formed using the same material and the same step as the electrode 321.

The light-emitting element 304 has a bottom-emission structure with which light is emitted to the coloring layer 325 side.

The light-emitting element 304 overlaps with the coloring layer 325 with the insulating layer 314 provided therebetween. The coloring layer 325 is provided between the light-emitting element 304 and the flexible substrate 371. FIG. 13(A) illustrates an example in which the coloring layer 325 is provided over the insulating layer 313. In the example illustrated in FIG. 13(A), a light-blocking layer and a spacer are not provided.

<Structure Example 3>

FIG. 13(B) shows a cross-sectional view of a display panel employing a separate coloring method.

The display panel in FIG. 13(B) includes the conductive layer 390, the flexible substrate 371, the bonding layer 377, the insulating layer 378, a plurality of transistors, the conductive layer 307, the insulating layer 312, the insulating layer 313, the insulating layer 314, the insulating layer 315, the spacer 316, the light-emitting element 304, the bonding layer 317, the flexible substrate 372, and the insulating layer 376.

FIG. 13(B) shows an example where the conductive layer 390 is provided over the entire surface of the flexible substrate 371.

The driver circuit portion 382 includes a transistor 301. The display portion 381 includes the transistor 302, the transistor 303, and the capacitor 305.

Each transistor includes two gates, the gate insulating layer 311, a semiconductor layer, a source, and a drain. The two gates each overlap with the semiconductor layer with the insulating layer provided therebetween. FIG. 13(B) illustrates an example where each transistor has a structure in which the semiconductor layer is sandwiched between the two gates. In the example illustrated in FIG. 13(B), one of the gates is formed between the insulating layer 313 and the insulating layer 314.

The light-emitting element 304 has a top-emission structure with which light is emitted to the flexible substrate 372 side. FIG. 13(B) shows an example where the light-emitting element 304 does not include an optical adjustment layer. The insulating layer 376 serves as a sealing layer for the light-emitting element 304.

The connection portion 306 includes the conductive layer 307. The conductive layer 307 is electrically connected to the FPC 373 through the connector 319.

<Application Example>

In one embodiment of the present invention, a display device provided with a touch sensor (also referred to as a touch panel) can be manufactured.

There is no particular limitation on a sensor element included in the touch panel of one embodiment of the present invention. Note that a variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element will be described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display panel and a sensor element that are separately formed are attached to each other and a structure in which an electrode and the like included in a sensor element are provided on one or both of a substrate supporting a display element and a counter substrate.

<Structure Example 4>

Figure 14A:
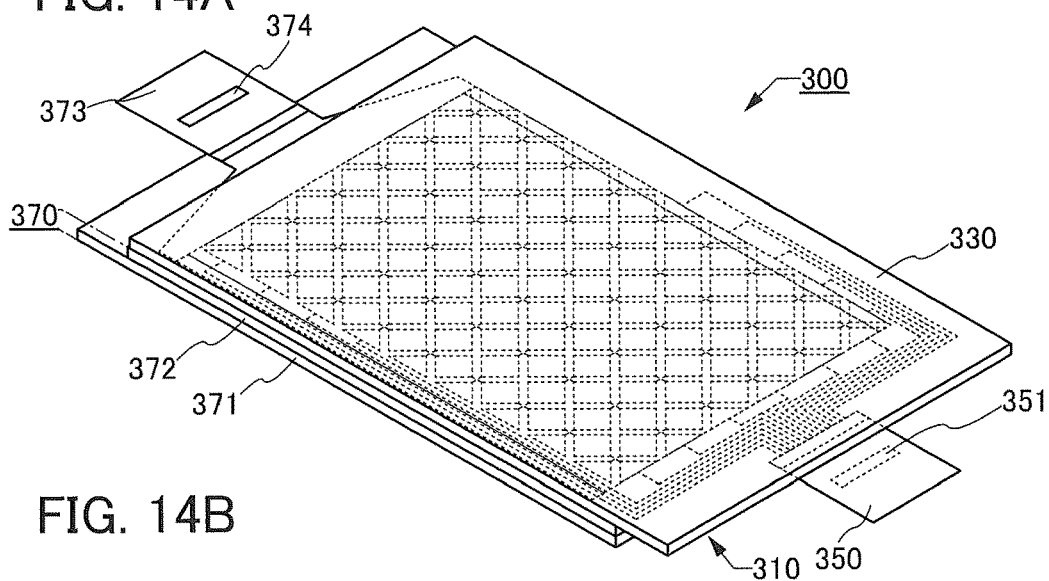
FIGS. 14A-14B Perspective views illustrating an example of a touch panel.
Figure 14B:
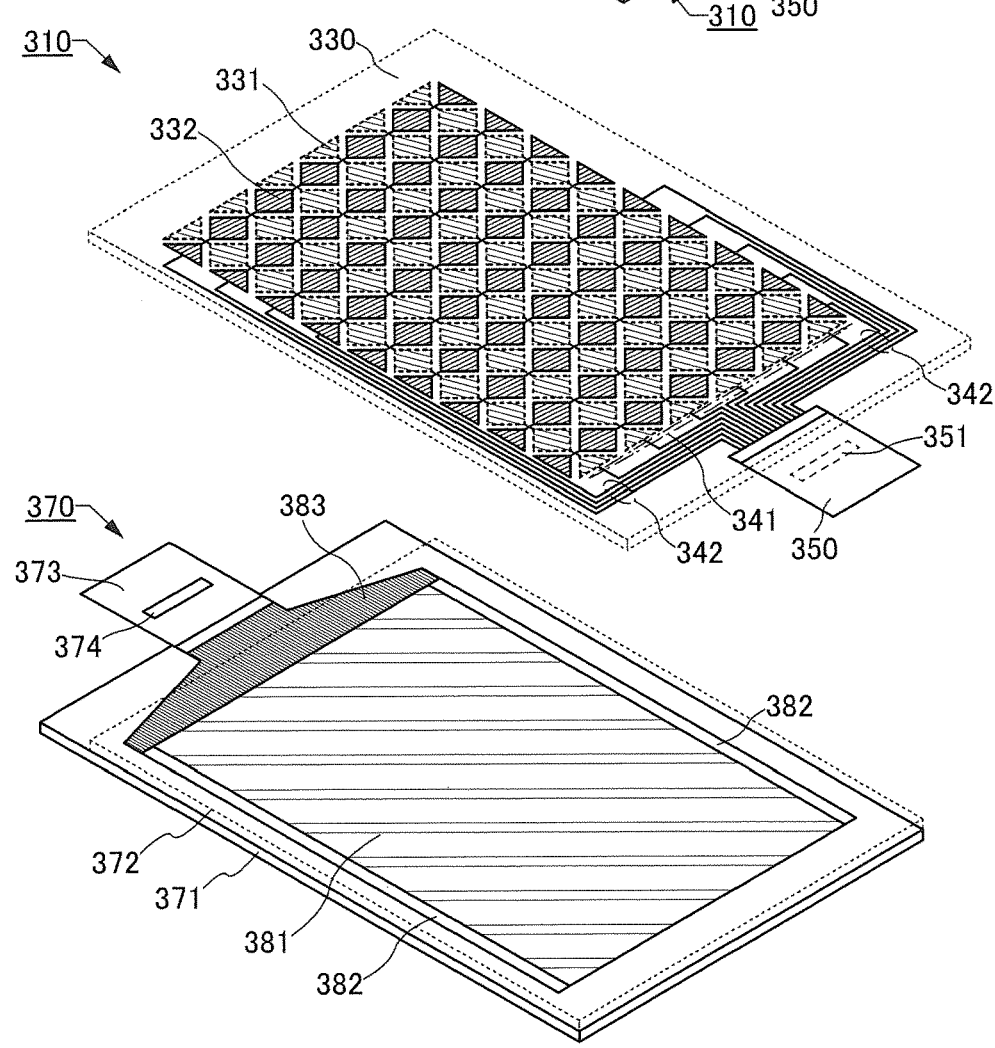

FIG. 14(A) is a schematic perspective view of a touch panel 300. FIG. 14(B) is a developed view of the schematic perspective view of FIG. 14(A). Note that only typical components are illustrated for simplicity. In FIG. 14(B), some components (such as the flexible substrate 330 and the flexible substrate 372) are illustrated only in dashed outline.

The touch panel 300 includes an input device 310 and the display panel 370, which are provided to overlap with each other.

The input device 310 includes the flexible substrate 330, an electrode 331, an electrode 332, a plurality of wirings 341, and a plurality of wirings 342. An FPC 350 is electrically connected to each of the plurality of wirings 341 and the plurality of wirings 342. The FPC 350 is provided with an IC 351.

The display panel 370 includes the flexible substrate 371 and the flexible substrate 372 which are provided so as to face each other. The display panel 370 includes the display portion 381 and the driver circuit portion 382. A wiring 383 and the like are provided over the flexible substrate 371. The FPC 373 is electrically connected to the wiring 383. The FPC 373 is provided with an IC 374.

The wiring 383 has a function of supplying a signal and power to the display portion 381 and the driver circuit portion 382. The signal and power are input to the wiring 383 from the outside or the IC 374 through the FPC 373.

Figure 15:
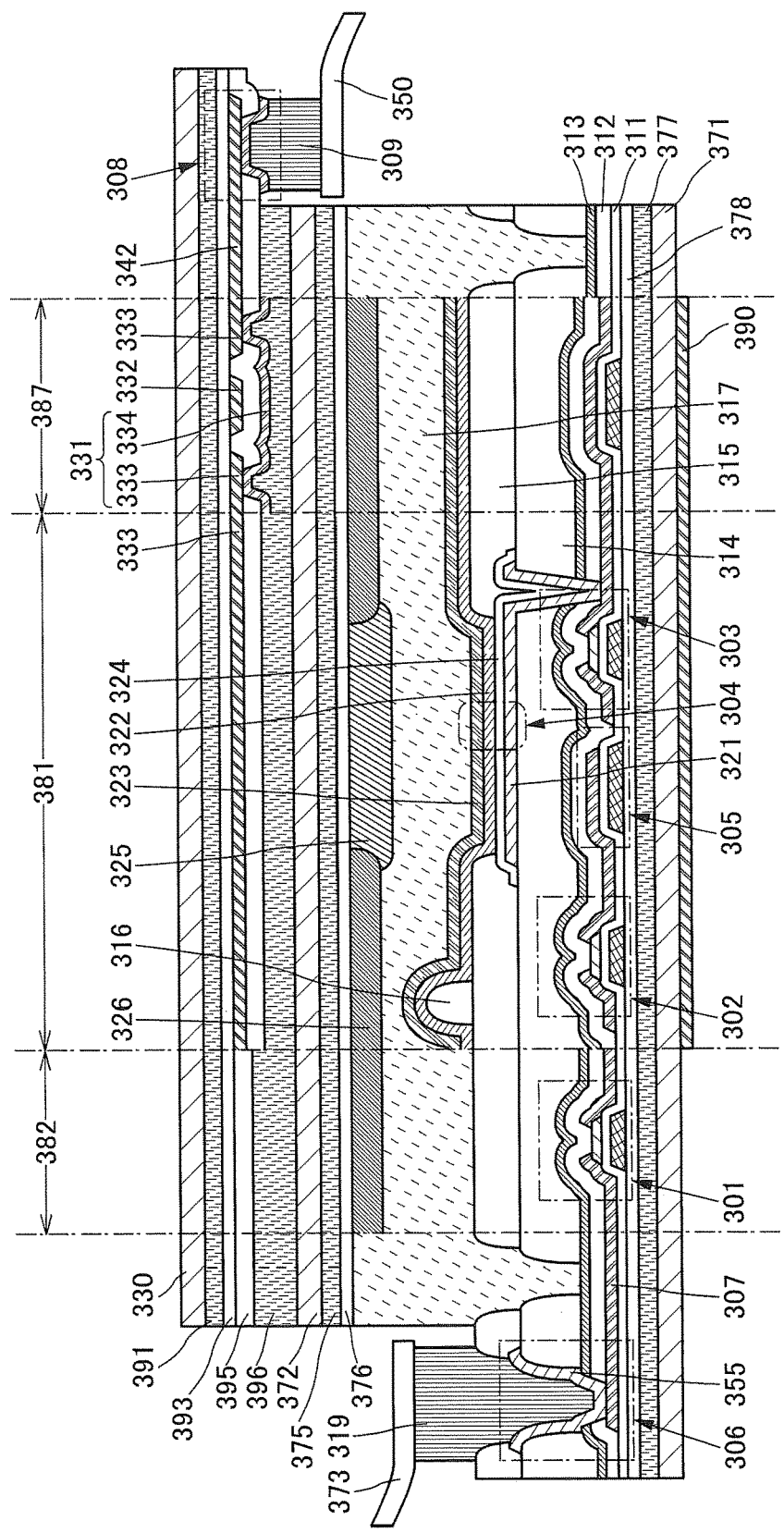
FIG. 15 A cross-sectional view illustrating an example of a touch panel.
Figure 16:
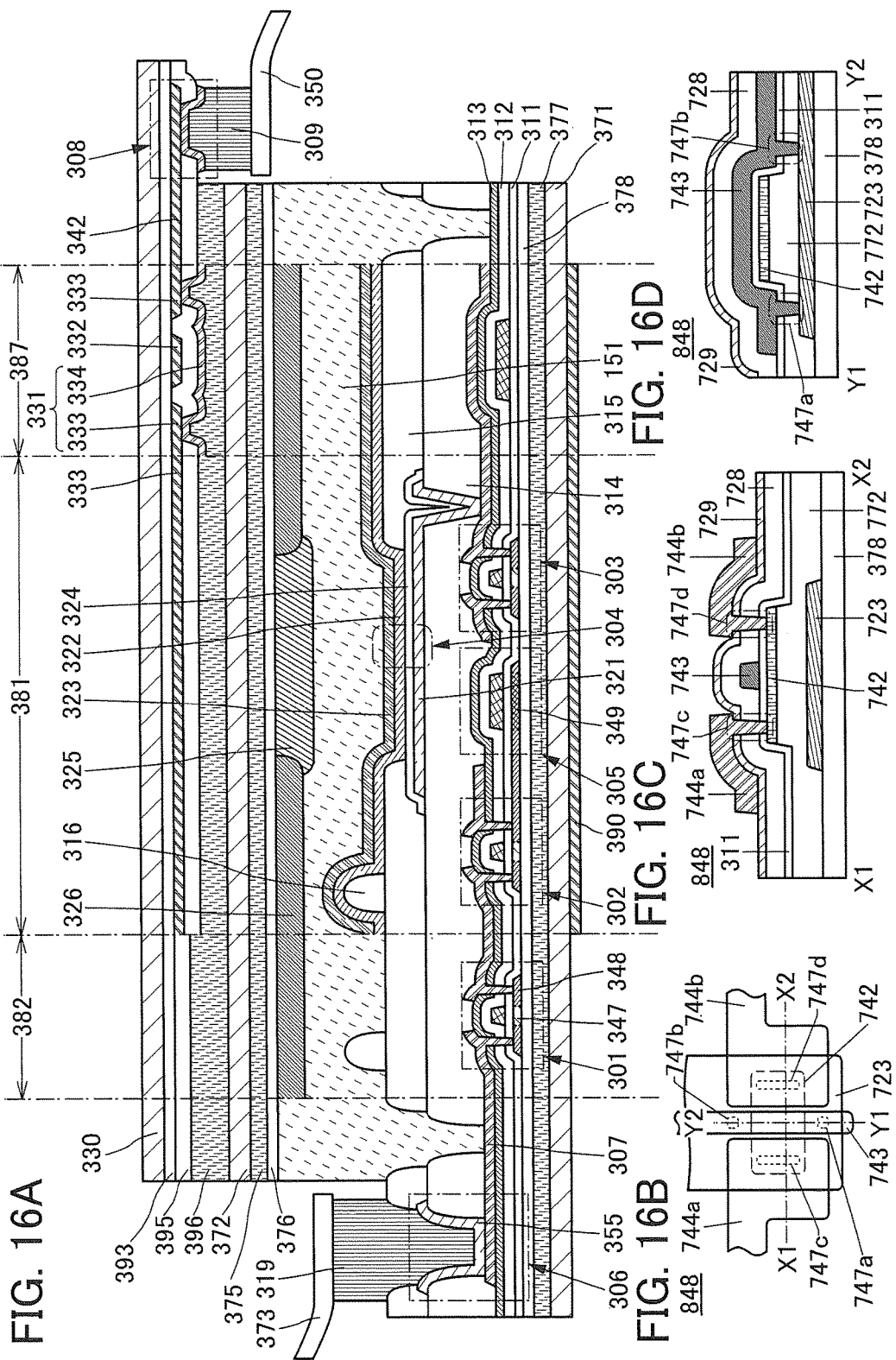
FIGS. 16A-16D A cross-sectional view illustrating an example of a touch panel and a top view and cross-sectional views of a transistor.

FIG. 15 illustrates an example of a cross-sectional view of the touch panel 300. FIG. 15 shows cross-sectional structures of the display portion 381, the driver circuit portion 382, the region including the FPC 373, the region including the FPC 350, and the like. Furthermore, FIG. 15 illustrates a cross-sectional structure of a crossing portion 387 where a wiring formed by processing a conductive layer used for forming the gate of the transistor and a wiring formed by processing a conductive layer used for forming the source and the drain of the transistor cross each other.

The flexible substrate 371 and the flexible substrate 372 are attached to each other with the bonding layer 317. The flexible substrate 372 and the flexible substrate 330 are attached to each other with a bonding layer 396. Here, the layers from the flexible substrate 371 to the flexible substrate 372 correspond to the display panel 370. Furthermore, the layers from the flexible substrate 330 to the electrode 334 correspond to the input device 310. In other words, the bonding layer 396 attaches the display panel 370 and the input device 310 to each other. Alternatively, the layers from the flexible substrate 371 to the insulating layer 376 correspond to the display panel 370. Furthermore, the layers from the flexible substrate 330 to the flexible substrate 372 correspond to the input device 310. In other words, the bonding layer 375 attaches the display panel 370 and the input device 310 to each other.

The structure of the display panel 370 shown in FIG. 15 is similar to that of the display panel shown in FIG. 8 and is thus not described in detail.

<Input Device 310>

On the flexible substrate 372 side of the flexible substrate 330, the electrode 331 and the electrode 332 are provided. An example where the electrode 331 includes an electrode 333 and the electrode 334 is described here. As illustrated in the crossing portion 387 in FIG. 15, the electrodes 332 and 333 are formed on the same plane. An insulating layer 395 is provided to cover the electrode 332 and the electrode 333. The electrode 334 electrically connects two electrodes 333, between which the electrode 332 is provided, through openings formed in the insulating layer 395.

In a region near the end portion of the flexible substrate 330, a connection portion 308 is provided. The connection portion 308 has a stack of a wiring 342 and a conductive layer formed by processing a conductive layer used for forming the electrode 334. The connection portion 308 is electrically connected to the FPC 350 through a connector 309.

The flexible substrate 330 is attached to the insulating layer 393 with the bonding layer 391. As in the manufacturing method for the structure example 1, the input device 310 can also be manufactured by forming elements over a formation substrate, separating the formation substrate, and then transferring the elements over the flexible substrate 330. Alternatively, the insulating layer 393, the elements, and the like may be directly formed on the flexible substrate 330 (see FIG. 16A).

<Structure Example 5>

The touch panel shown in FIG. 16(A) is different from the touch panel in FIG. 15 in the structures of the transistors 301, 302, and 303 and the capacitor 305 and in not including the bonding layer 391.

FIG. 16(A) illustrates a top-gate transistor.

Each transistor includes a gate, the gate insulating layer 311, a semiconductor layer, a source, and a drain. The gate and the semiconductor layer overlap with each other with the gate insulating layer 311 provided therebetween. The semiconductor layer may include low-resistance regions 348. The low-resistance regions 348 function as the source and drain of the transistor.

The conductive layer over the insulating layer 313 functions as a lead wiring. The conductive layer is electrically connected to the region 348 through an opening provided in the insulating layer 313, the insulating layer 312, and the gate insulating layer 311.

In FIG. 16(A), the capacitor 305 has a stacked-layer structure that includes a layer formed by processing a semiconductor layer used for forming the above-described semiconductor layer, the gate insulating layer 311, and a layer formed by processing a conductive layer used for forming the gate. Here, part of the semiconductor layer of the capacitor 305 preferably has a region 349 having a higher conductivity than a region 347 where the channel of the transistor is formed.

The region 348 and the region 349 each can be a region containing more impurities than the region 347 where the channel of the transistor is formed, a region with a high carrier concentration, a region with low crystallinity, or the like.

A transistor 848 illustrated in FIGS. 16(B) to (D) can be used in the display device of one embodiment of the present invention.

FIG. 16(B) is a top view of the transistor 848. FIG. 16(C) is a cross-sectional view in the channel length direction of the transistor 848 in the display device of one embodiment of the present invention. The cross section of the transistor 848 illustrated in FIG. 16(C) is taken along the dashed-dotted line X1-X2 in FIG. 16(B). FIG. 16(D) is a cross-sectional view in the channel width direction of the transistor 848 in the display device of one embodiment of the present invention. The cross section of the transistor 848 illustrated in FIG. 16(D) is taken along the dashed-dotted line Y1-Y2 in FIG. 16(B).

The transistor 848 is a type of top-gate transistor including a back gate.

In the transistor 848, a semiconductor layer 742 is formed over a projection of an insulating layer 772. When the semiconductor layer 742 is provided over the projection of the insulating layer 772, the side surface of the semiconductor layer 742 can also be covered with a gate 743. Thus, the transistor 848 has a structure in which the semiconductor layer 742 can be electrically surrounded by an electric field of the gate 743. Such a structure of a transistor in which a semiconductor film in which a channel is formed is electrically surrounded by an electric field of a conductive film is called a surrounded channel (s-channel) structure. A transistor with an s-channel structure is referred to as an "s-channel-type transistor" or an "s-channel transistor".

In the s-channel structure, a channel can be formed in the whole (bulk) of the semiconductor layer 742. In the s-channel structure, the drain current of the transistor can be increased, so that a larger amount of on-state current can be obtained. Furthermore, the entire channel formation region of the semiconductor layer 742 can be depleted by the electric field of the gate 743. Accordingly, the off-state current of the transistor with the s-channel structure can further be reduced.

A back gate 723 is provided over the insulating layer 378.

A conductive layer 744a provided over an insulating layer 729 is electrically connected to the semiconductor layer 742 through an opening 747c formed in the gate insulating layer 311, an insulating layer 728, and the insulating layer 729. A conductive layer 744b provided over the insulating layer 729 is electrically connected to the semiconductor layer 742 through an opening 747d formed in the gate insulating layer 311 and the insulating layers 728 and 729.

The gate 743 provided over the gate insulating layer 311 is electrically connected to the back gate 723 through an opening 747a and an opening 747b formed in the gate insulating layer 311 and the insulating layer 772. Accordingly, the same potential is supplied to the gate 743 and the back gate 723. Furthermore, either or both of the opening 747a and the opening 747b may be omitted. In the case where both the opening 747a and the opening 747b are omitted, different potentials can be supplied to the back gate 723 and the gate 743.

As a semiconductor in the transistor having the s-channel structure, an oxide semiconductor, silicon such as polycrystalline silicon or single crystal silicon that is transferred from a single crystal silicon substrate, or the like is used.

<Structure Example 6>

Figure 17:
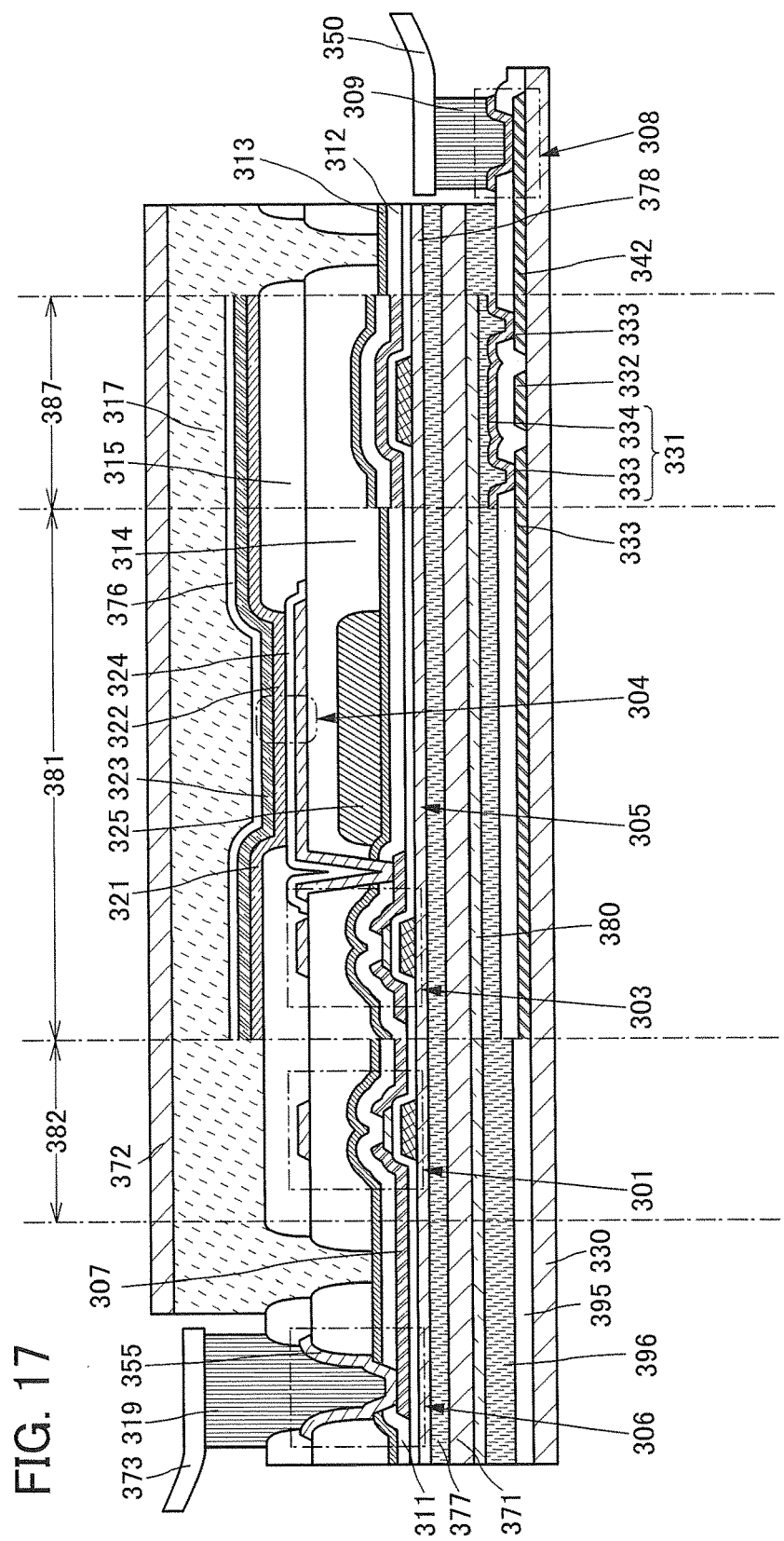
FIG. 17 A cross-sectional view illustrating an example of a touch panel.

FIG. 17 shows an example of a touch panel in which a bottom-emission display panel and an input device are attached to each other with the bonding layer 396.

FIG. 17 shows an example where the conductive layer 380 is provided not only in the display portion 381, but also in the driver circuit portion 382 and in an end portion of the flexible substrate 371 which overlaps with the FPC 373.

The display panel in FIG. 17 is different from that in FIG. 13(A) in that an insulating layer 376 is included. The input device in FIG. 17 is different from that in FIG. 16 in that the insulating layer 393 is not provided and that the electrode 331, the electrode 332, and the like are provided directly on the flexible substrate 330.

<Structure Example 7>

Figure 18:
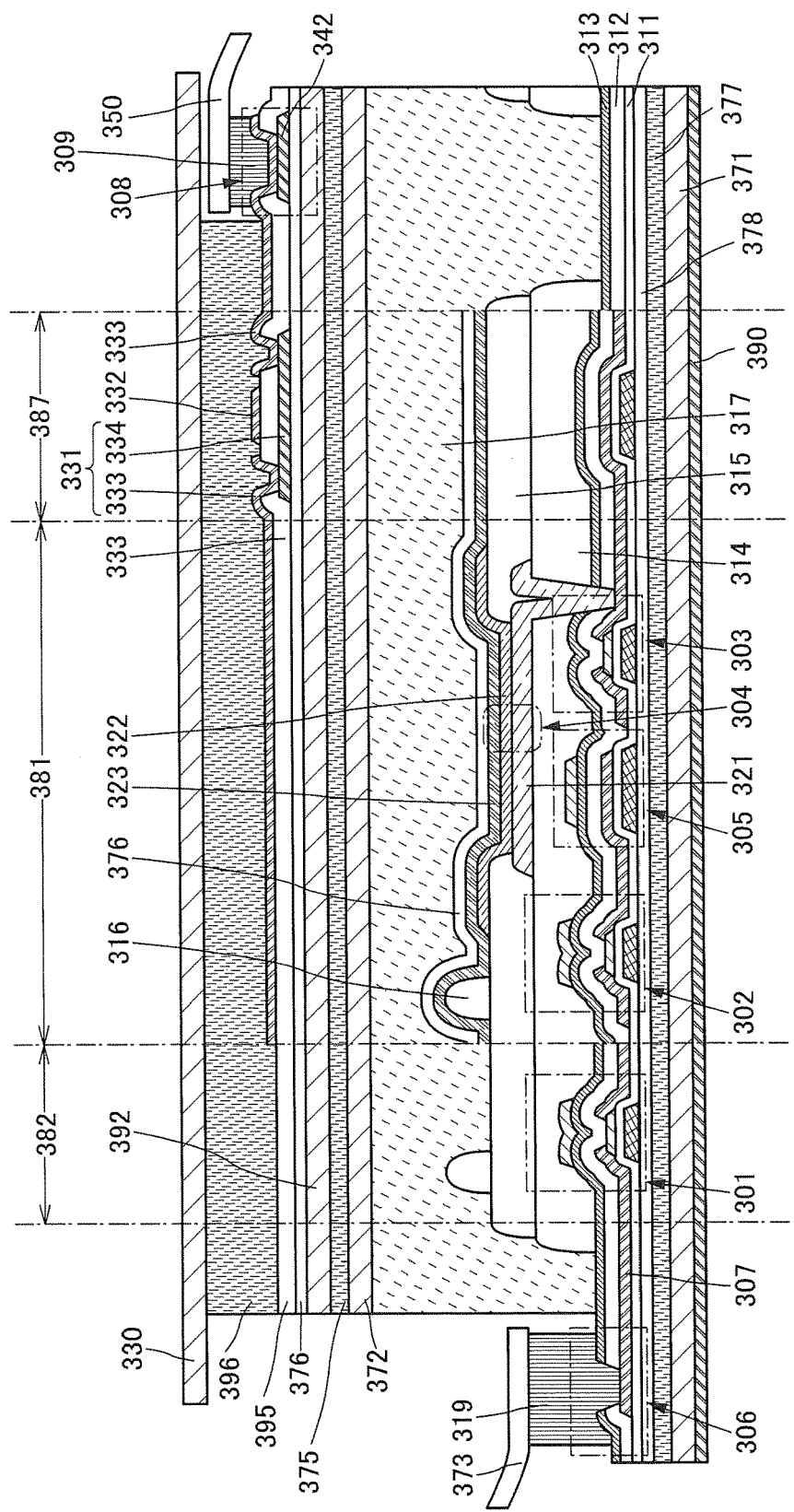
FIG. 18 A cross-sectional view illustrating an example of a touch panel.

FIG. 18 shows an example of a touch panel in which a display panel using a separate coloring method and an input device are attached to each other with the bonding layer 375.

The display panel in FIG. 18 has a structure similar to that in FIG. 13(B).

The input device in FIG. 18 includes the insulating layer 376 over a flexible substrate 392, and the electrode 334 and the wiring 342 over the insulating layer 376. The electrode 334 and the wiring 342 are covered with the insulating layer 395. The electrode 332 and the electrode 333 are provided over the insulating layer 395. The flexible substrate 330 is attached to the flexible substrate 392 with the bonding layer 396.

<Structure Example 8>

Figure 19:
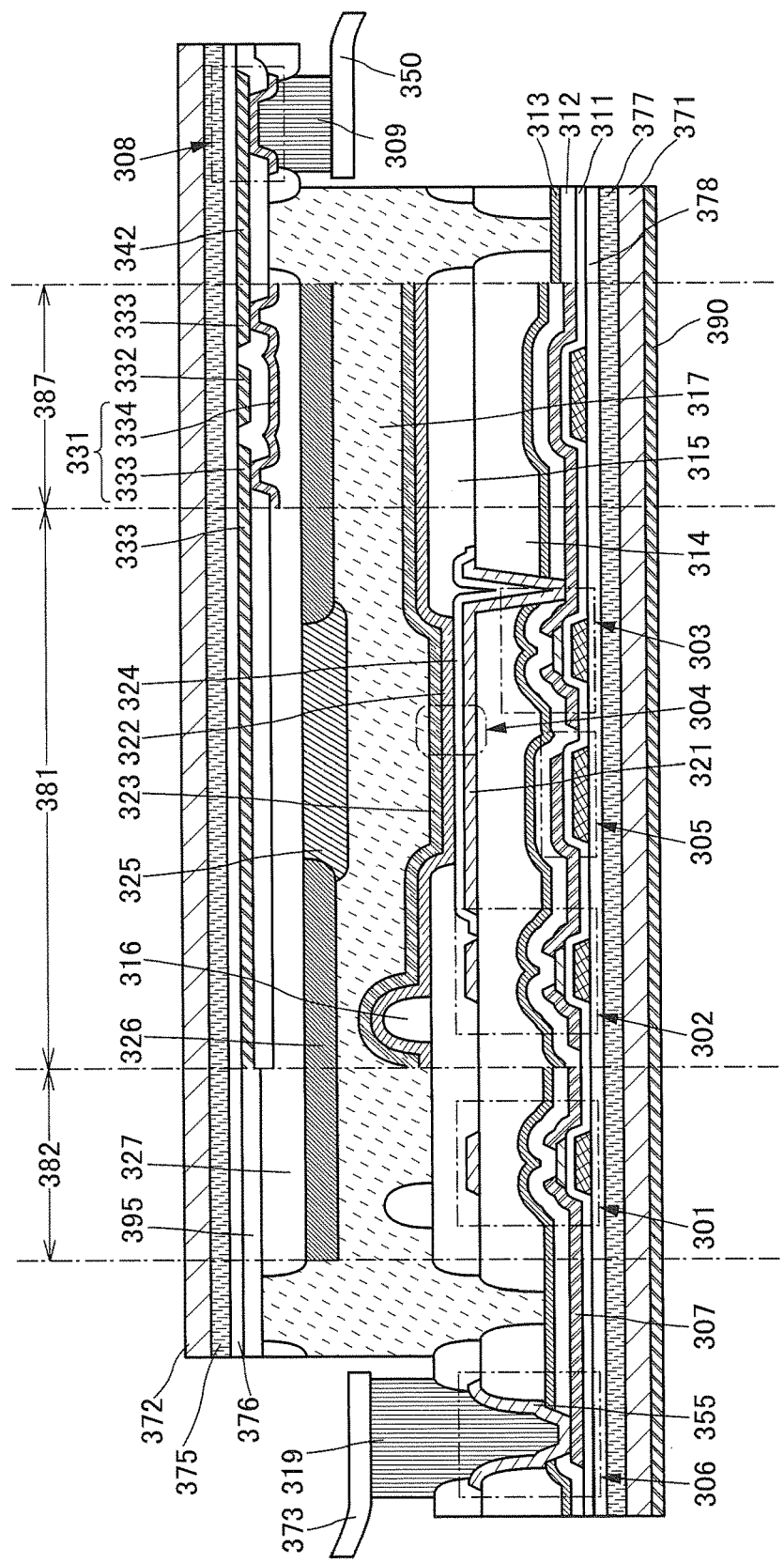
FIG. 19 A cross-sectional view illustrating an example of a touch panel.

FIG. 19 shows an example in which a touch sensor and the light-emitting element 304 are provided between a pair of flexible substrates (the flexible substrate 371 and the flexible substrate 372). When two flexible substrates are used, the touch panel can be thin, lightweight, and flexible.

The structure in FIG. 19 can be fabricated by changing the structure of the layer to be separated that is formed over the formation substrate 411 in the manufacturing process example for the structure example 1. In the manufacturing process example for the structure example 1, as the layer to be separated that is formed over the formation substrate 411, the insulating layer 376, the coloring layer 325, and the light-blocking layer 326 are formed (FIG. 9(B)).

In the case where the structure in FIG. 19 is fabricated, after the insulating layer 376 is formed, the electrode 332, the electrode 333, and the wiring 342 are formed over the insulating layer 376. Then, the insulating layer 395 covering these electrodes is formed. Next, the electrode 334 is formed over the insulating layer 395. Then, the insulating layer 327 covering the electrode 334 is formed. After that, the coloring layer 325 and the light-blocking layer 326 are formed over the insulating layer 327. Then, attachment to the formation substrate 401 is performed, the formation substrates are separated, and the flexible substrate is attached; thus, the touch panel having the structure in FIG. 19 can be fabricated.

<Structure Example 9>

Figure 20A:
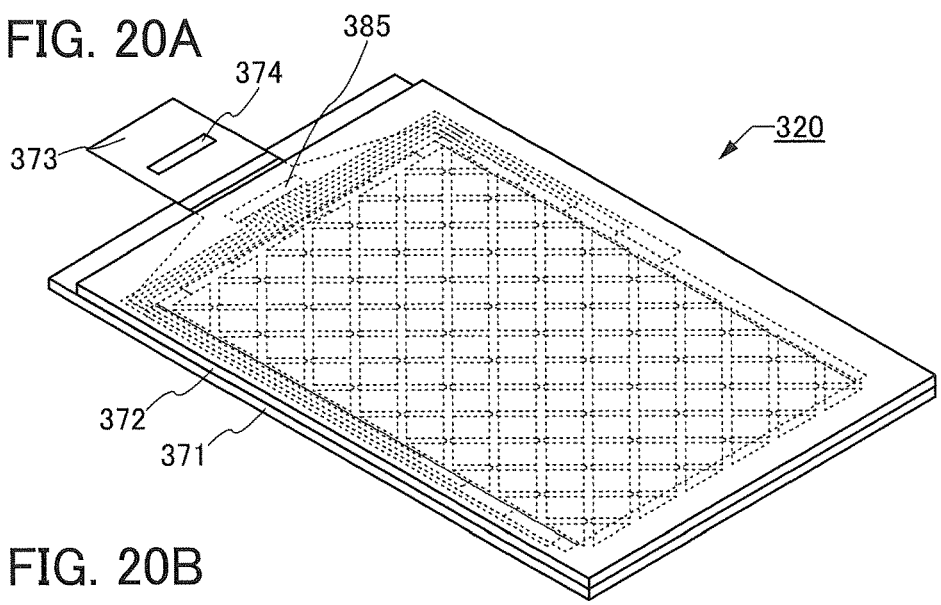
FIGS. 20A-20B Perspective views illustrating an example of a touch panel.

FIGS. 20(A) and (B) are schematic perspective views of a touch panel 320.

In FIGS. 20(A) and (B), the flexible substrate 372 of a display panel 379 is provided with an input device 318. The wiring 341, the wiring 342, and the like of the input device 318 are electrically connected to the FPC 373 provided for the display panel 379.

With the above structure, the FPC connected to the touch panel 320 can be provided only on one substrate side (on the flexible substrate 371 side in this embodiment). Although two or more FPCs may be attached to the touch panel 320, it is preferable that the touch panel 320 be provided with one FPC 373 and signals be supplied from the FPC 373 to both the display panel 379 and the input device 318 as illustrated in FIGS. 20(A) and (B), for the simplicity of the structure.

The IC 374 may have a function of driving the input device 318. Alternatively, an IC for driving the input device 318 may further be provided. Further alternatively, an IC for driving the input device 318 may be mounted on the flexible substrate 371.

Figure 20B:
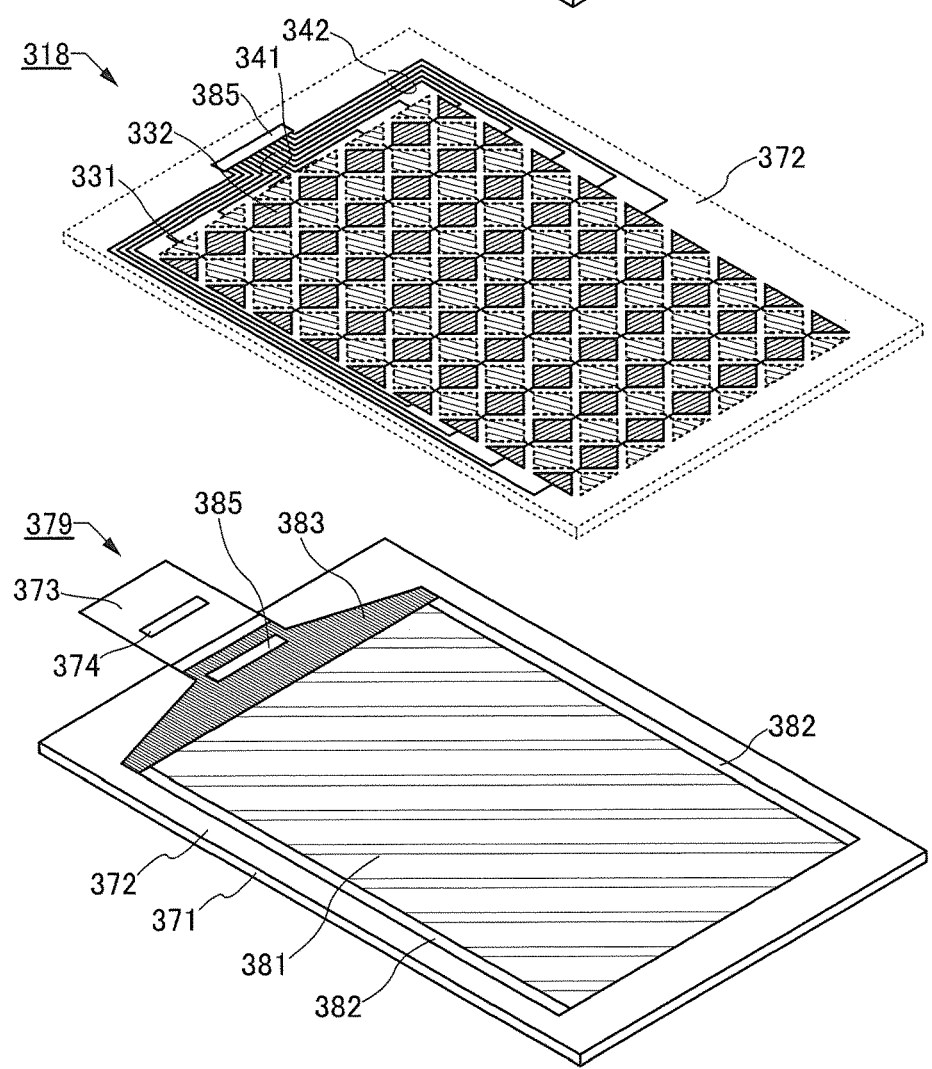
Figure 21:
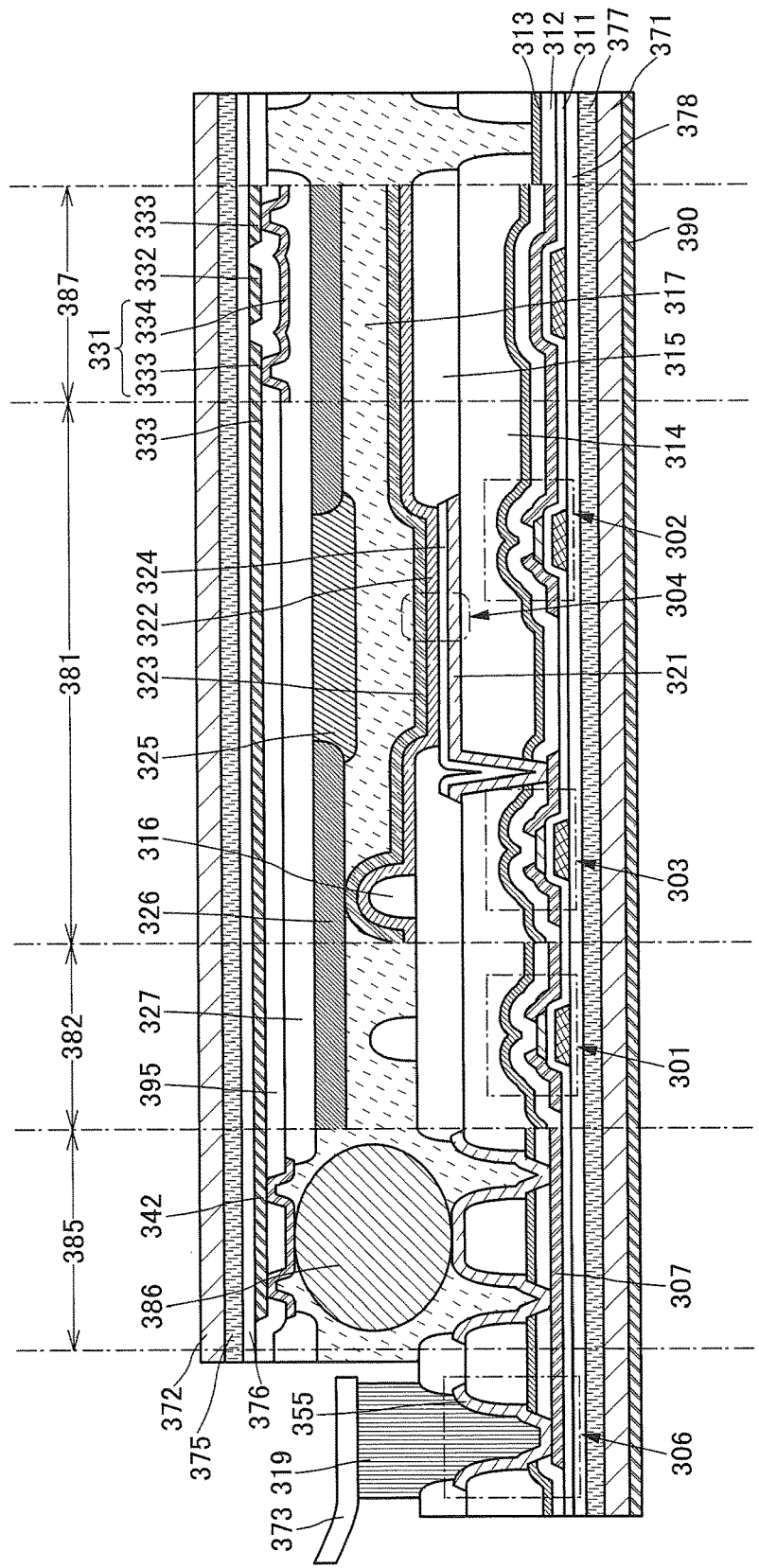
FIG. 21 A cross-sectional view illustrating an example of a touch panel.

FIG. 21 is a cross-sectional view showing a region including the FPC 373, a connection portion 385, the driver circuit portion 382, and the display portion 381 in FIG. 20.

In the connection portion 385, one of the wirings 342 (or the wirings 341) and one of the conductive layers 307 are electrically connected to each other through a connector 386.

As the connector 386, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 386, a material capable of elastic deformation or plastic deformation is preferably used. As illustrated in FIG. 21, the conductive particle has a shape that is vertically crushed in some cases. With the crushed shape, the contact area between the connector 386 and a conductive layer electrically connected to the connector 386 can be increased, thereby reducing contact resistance and suppressing the generation of problems such as disconnection.

The connector 386 is preferably provided so as to be covered with the bonding layer 317. For example, a paste or the like for forming the bonding layer 317 may be applied, and then, the connectors 386 may be scattered in the connection portion 385. A structure in which the connection portion 385 is provided in a portion where the bonding layer 317 is provided can be similarly applied not only to a structure in which the bonding layer 317 is also provided over the light-emitting element 304 as illustrated in FIG. 21 (also referred to as a solid sealing structure) but also to, for example, a hollow sealing structure in which the bonding layer 317 is provided in the periphery of a light-emitting panel, a liquid crystal display panel, or the like.

FIG. 21 illustrates an example in which the optical adjustment layer 324 does not cover an end portion of the electrode 321. In the example in FIG. 21, the spacer 316 is also provided in the driver circuit portion 382.

<Structure Example 10>

In a touch panel illustrated in FIG. 22(A), the light-blocking layer 326 is provided between the electrodes and the like in the touch sensor and the flexible substrate 372. Specifically, the light-blocking layer 326 is provided between the insulating layer 376 and an insulating layer 328. Conductive layers including the electrodes 332 and 333 and the wirings 342, the insulating layer 395 covering these conductive layers, the electrode 334 over the insulating layer 395, and the like are provided over the insulating layer 328.

Furthermore, the insulating layer 327 is provided over the electrode 334 and the insulating layer 395, and the coloring layer 325 is provided over the insulating layer 327.

The insulating layers 327 and 328 have a function as a planarization film. Note that the insulating layers 327 and 328 are not necessarily provided when not needed.

With such a structure, the light-blocking layer 326 provided in a position closer to the flexible substrate 372 side than the electrodes and the like of the touch sensor can prevent the electrodes and the like from being seen by a user. Thus, a touch panel with not only a small thickness but also improved display quality can be achieved.

As illustrated in FIG. 22(B), the touch panel may include a light-blocking layer 326a between the insulating layer 376 and the insulating layer 328 and may include a light-blocking layer 326b between the insulating layer 327 and the bonding layer 317. Providing the light-blocking layer 326b can inhibit light leakage more surely.

This embodiment can be combined with any of other embodiments as appropriate.

(Embodiment 3)

<Composition of CAC-OS>

Described below is the composition of a CAC (cloud aligned complementary)-OS applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC (cloud aligned complementary)-OS (oxide semiconductor) or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, CAC-OS of an In—Ga—Zn oxide (an In—Ga—Zn oxide of CAC-OS may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; 1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part of the CAC-OS, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure and Formation Method of Samples>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 34:
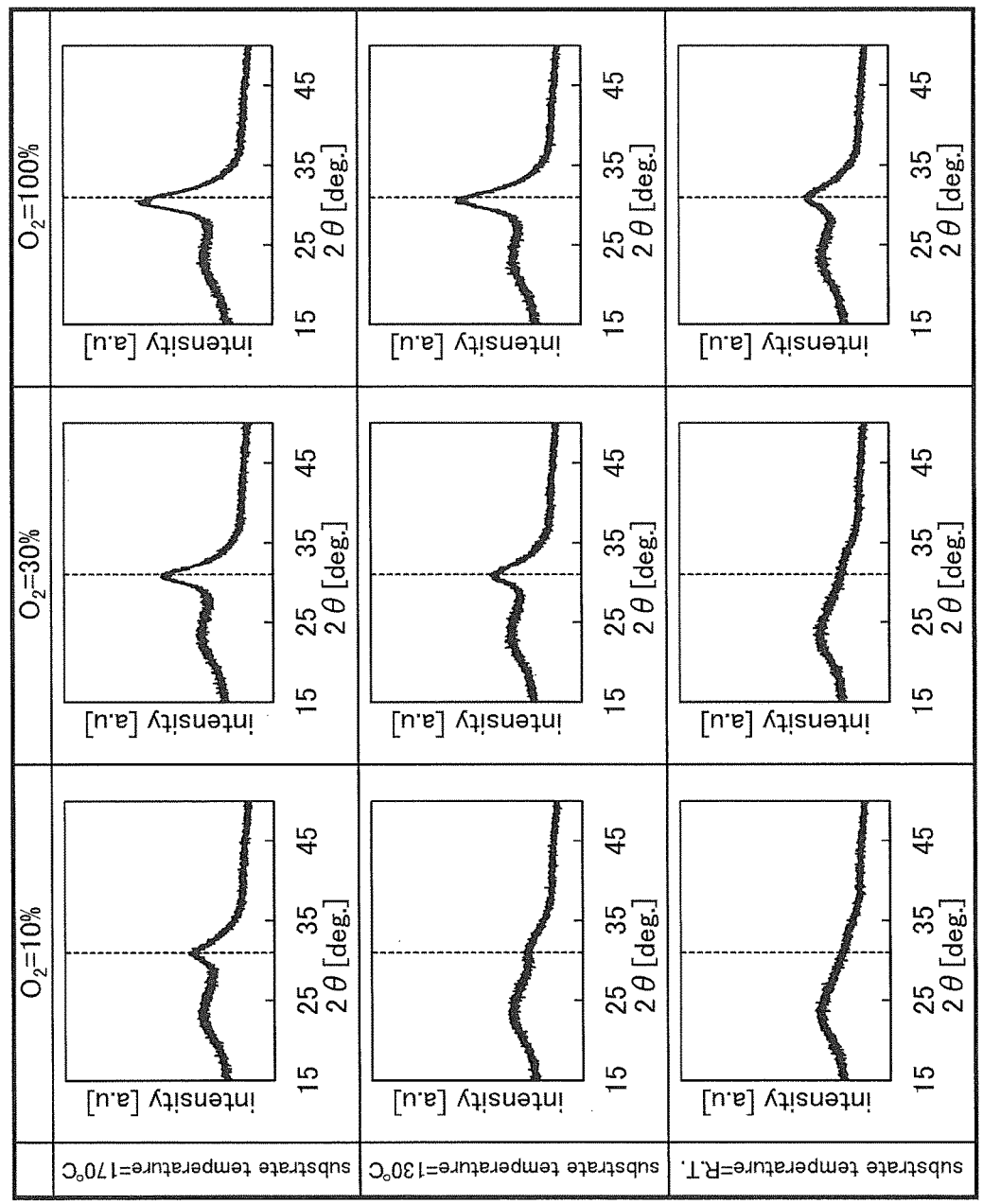
FIG. 34 A diagram showing measurement results of XRD spectra of samples.

FIG. 34 shows XRD spectra measured by an out-of-plane method. In FIG. 34, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 34, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC)-IGZO).

As shown in the XRD spectra in FIG. 34, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nmφ is performed.

FIG. 35(A) is a plan-view TEM image of the sample formed at a substrate temperature of R.T. and with an oxygen gas flow rate ratio of 10%. FIG. 35(B) is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by a black dot a1, a black dot a2, a black dot a3, a black dot a4, and a black dot a5 in the plan-view TEM image in FIG. 35(A) of the sample formed at a substrate temperature of R.T. and an oxygen gas flow rate ratio of 10% are observed. Note that the electron diffraction patterns are observed while electron beam irradiation is performed at a constant rate for 35 seconds. FIG. 35(C), FIG. 35(D), FIG. 35(E), FIG. 35(F), and FIG. 35(G) show the results of the points indicated by the black dot a1, the black dot a2, the black dot a3, the black dot a4, and the black dot a5, respectively.

In FIG. 35(C), FIG. 35(D), FIG. 35(E), FIG. 35(F), and FIG. 35(G), regions with high luminance in a circular (ring) pattern can be shown. Furthermore, a plurality of spots can be shown in a ring-like shape.

Electron diffraction patterns of points indicated by a black dot b1, a black dot b2, a black dot b3, a black dot b4, and a black dot b5 in the cross-sectional TEM image in FIG. 35(B) of the sample formed at a substrate temperature of R.T. and an oxygen gas flow rate ratio of 10% are observed. FIG. 35(H), FIG. 35(I), FIG. 35(J), FIG. 35(K), and FIG. 35(L) show the results of the points indicated by the black dot b1, the black dot b2, the black dot b3, the black dot b4, and the black dot b5, respectively.

In FIG. 35(H), FIG. 35(I), FIG. 35(J), FIG. 35(K), and FIG. 35(L), regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 36A:
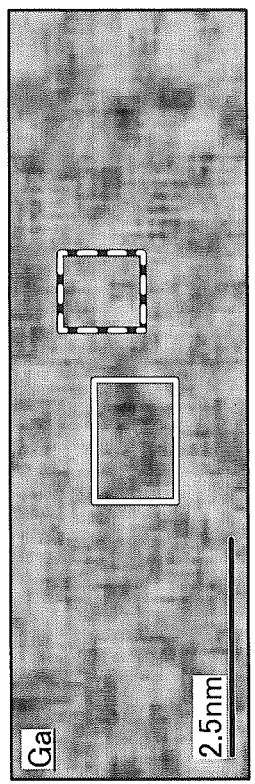
FIGS. 36A-36C Diagrams showing EDX mapping images of a sample.
Figure 36B:
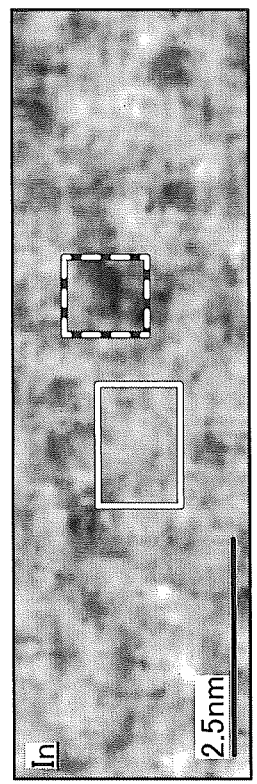
Figure 36C:
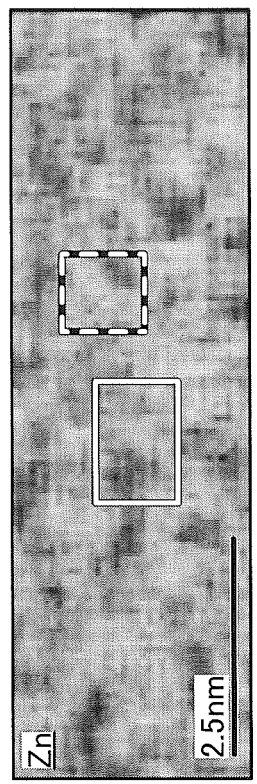

FIG. 36 shows EDX mapping images in a cross section of the sample formed at a substrate temperature of R.T. and with an oxygen gas flow rate ratio of 10%. FIG. 36(A) shows an EDX mapping image of Ga atoms. The proportion of the Ga atoms in all the atoms is 1.18 atomic % to 18.64 atomic %. FIG. 36(B) shows an EDX mapping image of In atoms. The proportion of the In atoms in all the atoms is 9.28 atomic % to 33.74 atomic %. FIG. 36(C) shows an EDX mapping image of Zn atoms. The proportion of the Zn atoms in all the atoms is 6.69 atomic % to 24.99 atomic %. FIG. 36(A), FIG. 36(B), and FIG. 36(C) show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIG. 36 is 7200000 times.

The EDX mapping images in FIG. 36(A), FIG. 36(B), and FIG. 36(C) show relative distribution of brightness indicating that each element has a distribution in the sample formed at a substrate temperature of R.T. and with an oxygen gas flow rate ratio of 10%. Areas surrounded by solid lines and areas surrounded by dashed lines in FIG. 36(A), FIG. 36(B), and FIG. 36(C) are examined.

In FIG. 36(A), a relatively dark region occupies a large area in the area surrounded by the solid line, while a relatively bright region occupies a large area in the area surrounded by the dashed line. In FIG. 36(B), a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 36(C), the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, or the like as a main component.

The area surrounded by the solid line is a region including a relatively small number of Ga atoms and the area surrounded by the dashed line is a region including a relatively large number of Ga atoms. In FIG. 36(C), the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, or the like as a main component.

Furthermore, as shown in FIG. 36(A), FIG. 36(B), and FIG. 36(C), the In atoms are relatively more uniformly distributed than the Ga atoms, and regions including $InO_{X1}$ as a main component are seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIG. 36(A), FIG. 36(B), and FIG. 36(C), each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

This embodiment can be combined with any of other embodiments as appropriate.

(Embodiment 4)

In this embodiment, electronic devices and lighting devices of embodiments of the present invention will be described with reference to drawings.

Electronic devices with reduced display defects can be obtained using the display device of one embodiment of the present invention. Electronic devices having a curved surface or flexibility can be obtained using the display device of one embodiment of the present invention. Thin or lightweight electronic devices can be obtained using the display device of one embodiment of the present invention.

Examples of electronic devices are a television set, wearable displays such as a wristband display and a goggle-type display (head mounted display), a monitor of a computer or the like, cameras such as a digital camera and a digital video camera, a digital photo frame, a mobile phone, a portable game machine, a portable information terminal, an audio reproducing device, and a large-sized game machine such as a pachinko machine.

The electronic device of one embodiment of the present invention has flexibility and therefore can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

FIGS. 23(A) to (E) show examples of electronic devices each including a display portion 7001 having flexibility.

The display portion 7001 is manufactured using the display device of one embodiment of the present invention. For example, a display device that can be bent with a radius of curvature of greater than or equal to 0.01 mm and less than or equal to 150 mm can be used. The display portion 7001 may include a touch sensor so that the electronic device can be operated by touching the display portion 7001 with a finger or the like.

One embodiment of the present invention makes it possible to provide an electronic device with reduced display defects which includes a display portion having flexibility.

Figure 23A:
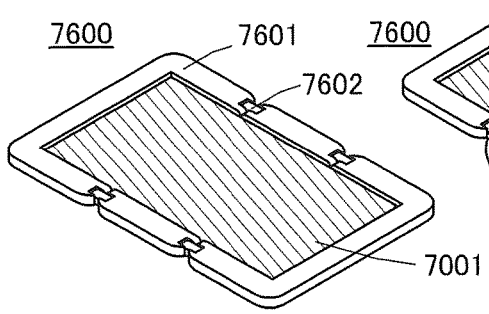
FIGS. 23A-23E Perspective views illustrating examples of an electronic device.
Figure 23B:
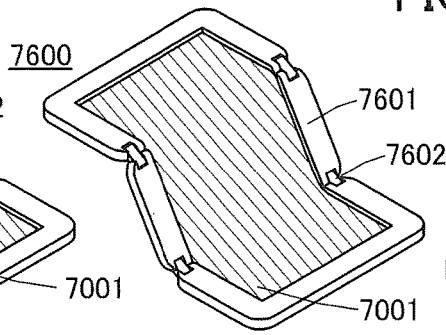
Figure 23C:
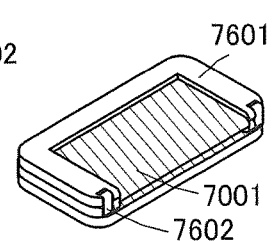

FIGS. 23(A) to (C) illustrate an example of a foldable electronic device. FIG. 23(A) illustrates an electronic device 7600 that is opened. FIG. 23(B) illustrates the electronic device 7600 that is being opened or being folded. FIG. 23(C) illustrates the electronic device 7600 that is folded. The electronic device 7600 is highly portable when folded, and is highly browsable when opened because of a seamless large display area.

A display portion 7001 is supported by three housings 7601 joined together by hinges 7602. By folding the electronic device 7600 at a connection portion between two housings 7601 with the hinges 7602, the electronic device 7600 can be reversibly changed in shape from an opened state to a folded state.

Figure 23D:
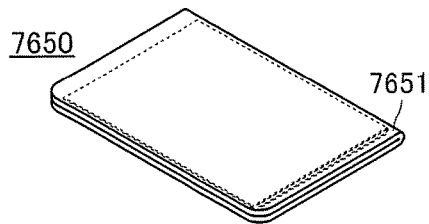
Figure 23E:
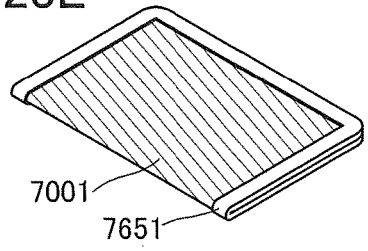

FIGS. 23(D) and (E) illustrate an example of a foldable electronic device. FIG. 23(D) illustrates an electronic device 7650 that is folded inward and FIG. 23(E) illustrates the electronic device 7650 that is folded outward. The electronic device 7650 includes the display portion 7001 and a non-display portion 7651. When the electronic device 7650 is not used, the electronic device 7650 is folded so that the display portion 7001 is on the inside, whereby the display portion 7001 can be prevented from being contaminated or damaged.

The electronic device 7600 and the electronic device 7650 can each be used as a portable information terminal. Each of the portable information terminals illustrated in this embodiment functions as, for example, one or more of a telephone set, a notebook, and an information browsing system. Specifically, each of the portable information terminals can be used as a smartphone. The portable information terminal is capable of executing a variety of applications such as mobile phone calls, e-mailing, reading and editing texts, music reproduction, Internet communication, and a computer game.

Foldable electronic devices are described in detail with reference to FIG. 24 to FIG. 27. FIG. 24 to FIG. 27 show examples where the touch panel 300 (see FIG. 14 and FIG. 15) is used as a display panel.

Electronic devices illustrated in FIG. 24 to FIG. 27 include a strip-like high flexibility region and a strip-like low flexibility region that are arranged alternately. These electronic devices can be folded by bending the high flexibility region. These electronic devices are highly portable in a folded state, and are highly browsable in an opened state because of a seamless large light-emitting region. The high flexibility region can be bent either inward or outward.

When the electronic device is in use, it can be opened so that the seamless large display region is entirely used, or it can be folded such that the display surface of the display panel faces outward and the display region can be partly used. When the display region that is folded and hidden from a user is a non-display region, the power consumption of the electronic device can be reduced.

Figure 24A:
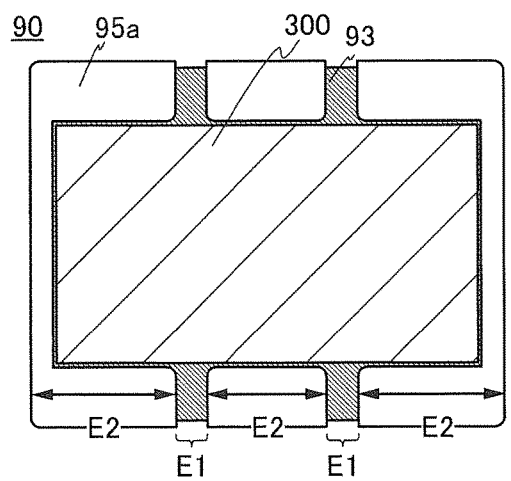
FIGS. 24A-24D Top views and bottom views illustrating examples of an electronic device.
Figure 24B:
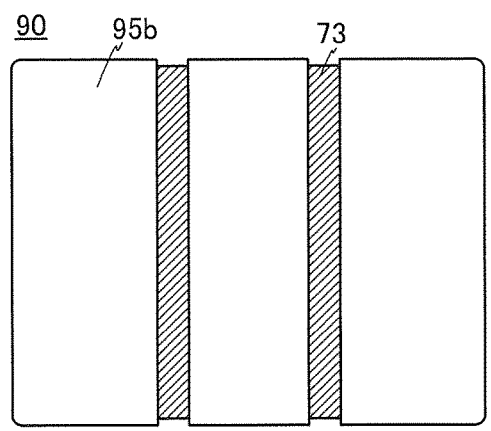

FIGS. 24(A) to 24(D) illustrate an electronic device 90 that can be folded in three parts and includes two strip-like high flexibility regions and three strip-like low flexibility regions. FIGS. 24(A) and (C) are plan views of the display surface side of the electronic device 90, and FIGS. 24(B) and (D) are plan views of the side opposite to the display surface of the electronic device 90.

Figure 25A:
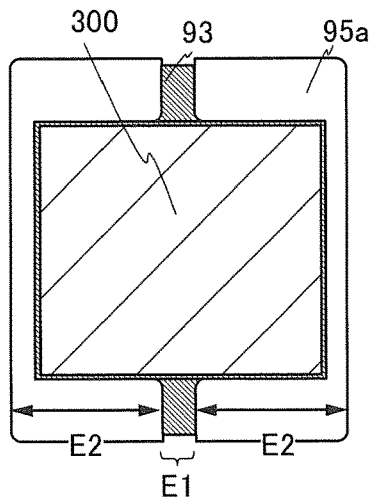
FIGS. 25A-25C Top views illustrating examples of an electronic device.
Figure 25B:
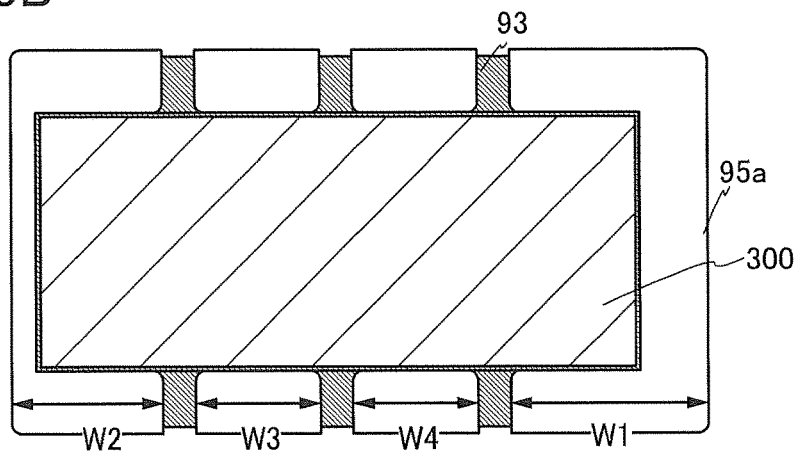
Figure 25C:
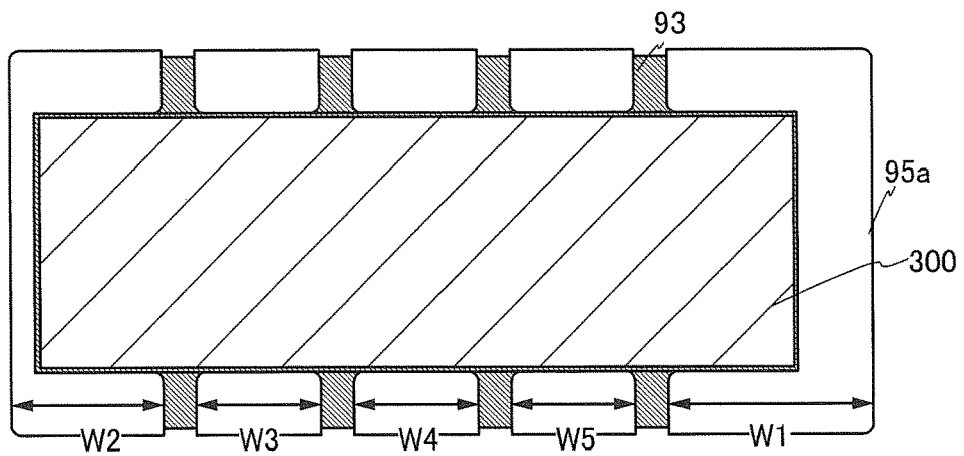

Note that the number of high flexibility regions and the number of low flexibility regions are not particularly limited. FIG. 25(A) illustrates an electronic device that can be folded in two parts and includes one strip-like high flexibility region and two strip-like low flexibility regions. FIG. 25(B) illustrates an electronic device that includes three strip-like high flexibility regions and four strip-like low flexibility regions. FIG. 25(C) illustrates an electronic device that includes four strip-like high flexibility regions and five strip-like low flexibility regions.

The electronic device 90 illustrated in FIGS. 24(A) to (D) includes the touch panel 300 having flexibility, a protective layer 93, the conductive layer 73, a plurality of support panels 95a, and a plurality of support panels 95b. Each of the support panels 95a and 95b has a lower flexibility than the touch panel 300. The plurality of support panels 95a are apart from each other. The plurality of support panels 95b are apart from each other.

As illustrated in FIG. 24(A), the electronic device 90 includes high flexibility regions E1 and low flexibility regions E2 that are arranged alternately in one direction. The high flexibility region and the low flexibility region are strip-like regions (form stripes). In this embodiment, a plurality of high flexibility regions and a plurality of low flexibility regions are parallel to each other; however, the regions are not necessarily arranged parallel to each other.

The high flexibility region E1 in the electronic device 90 includes at least a flexible display panel. In particular, a display panel using organic EL elements is particularly preferable because it not only has high flexibility and impact resistance but also can be thinned and lightened.

The low flexibility region E2 in the electronic device 90 includes at least a flexible display panel and a support panel having a lower flexibility than that of the display panel and overlapping with the display panel.

Figure 26A:
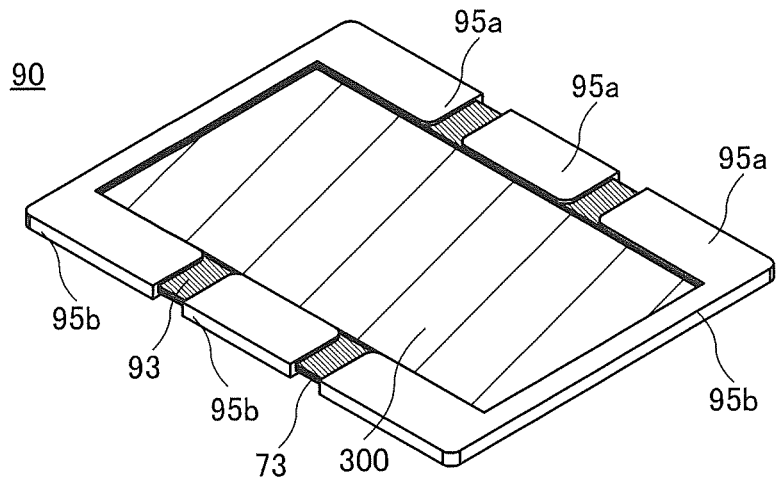
FIGS. 26A-26C Perspective views illustrating an example of an electronic device.
Figure 26B:
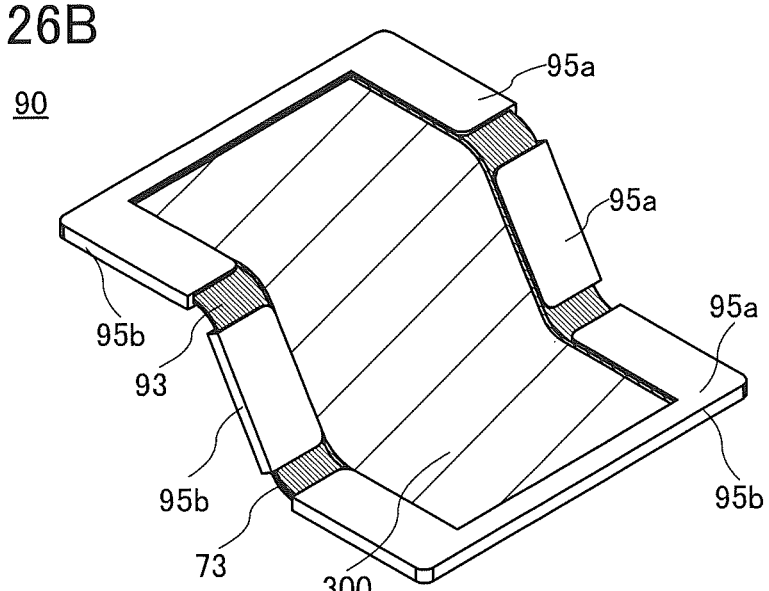
Figure 26C:
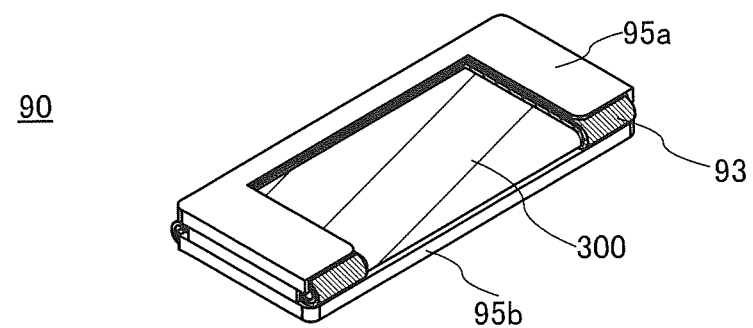

FIG. 26(A) illustrates the state where the electronic device 90 illustrated in FIG. 24(A) is opened. FIG. 26(B) illustrates the electronic device 90 that is being opened or being folded. FIG. 26(C) illustrates the electronic device 90 that is folded.

Figure 27:
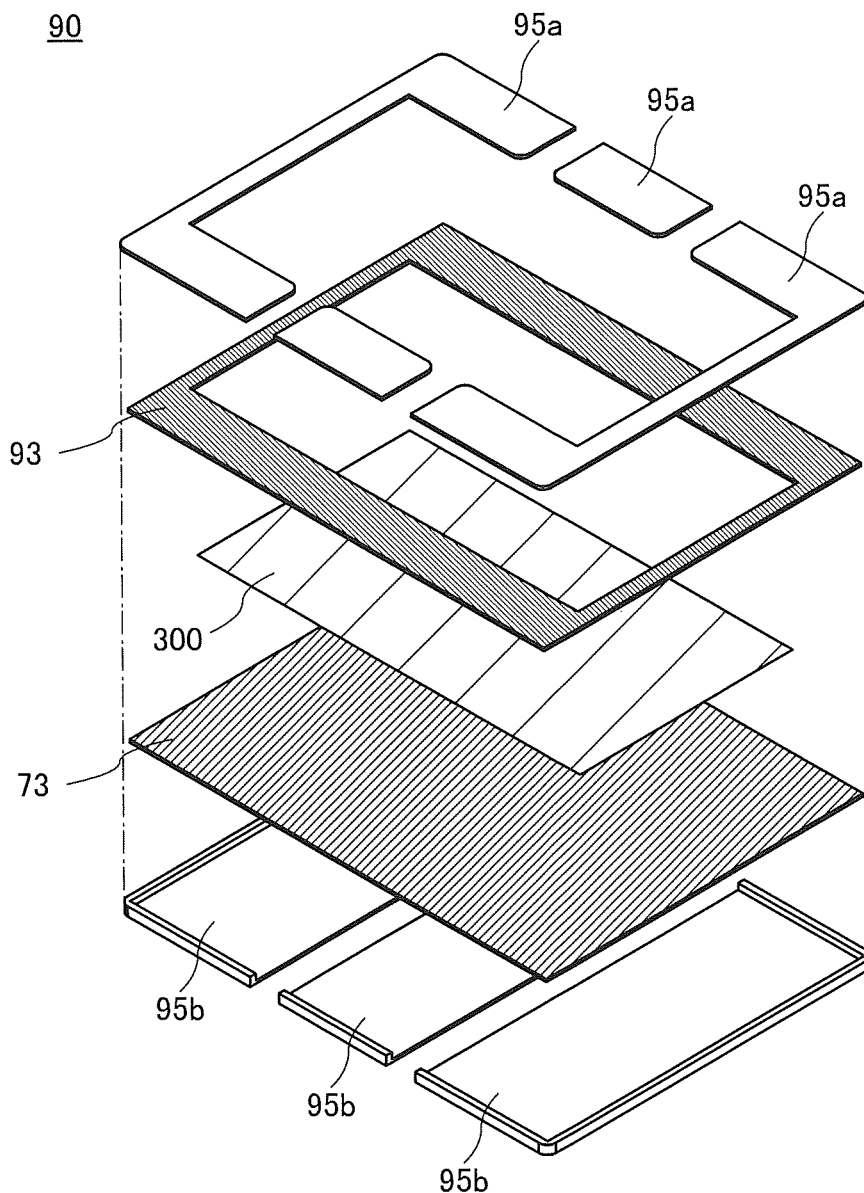
FIG. 27 A perspective view illustrating an example of an electronic device.

FIG. 27 is a perspective view illustrating components of the electronic device 90 illustrated in FIG. 24(A).

Here, when an end portion (also referred to as a folded portion or the like) of the touch panel 300 is located outward from end portions of the support panels 95a and 95b in the electronic device 90 in a folded state, the touch panel 300 is damaged or an element included in the touch panel 300 is broken in some cases.

In the electronic device 90 in a folded state shown in FIG. 26(C), the end portion of the touch panel 300 is aligned with the end portions of the support panels 95a and 95b positioned over and below the touch panel 300. This structure can prevent damage to the touch panel 300, breakage of an element included in the touch panel 300, and the like.

Figure 24C:
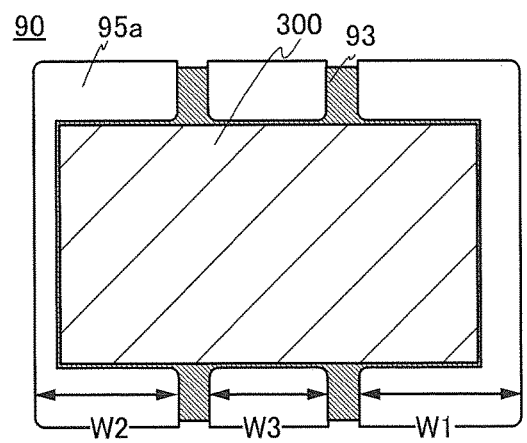
Figure 24D:
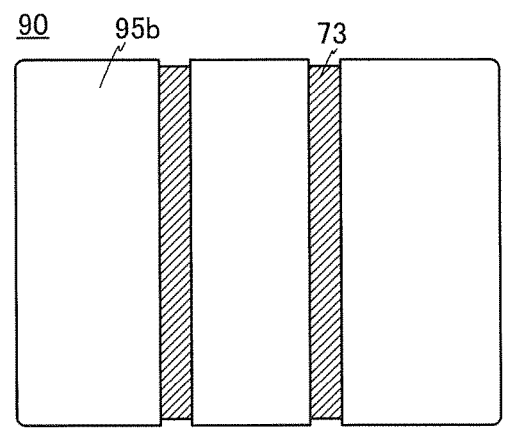

Moreover, when the electronic device 90 illustrated in FIG. 24(C) is folded, the end portion of the touch panel 300 is positioned inward from the end portions of the support panels 95a and 95b. This structure can further prevent damage to the touch panel 300, breakage of an element included in the touch panel 300, and the like.

In FIG. 24(C), a length W1 to a length W3 represent the lengths of the low flexibility regions in the direction in which the high flexibility region and the low flexibility region are arranged.

The low flexibility region preferably includes an external connection electrode of the display panel. Here, the external connection electrode corresponds to, for example, the conductive layer 355 in FIG. 15.

In FIG. 24(C), the low flexibility region with the length W1 includes the external connection electrode. In the electronic device 90, the length W1 of a low flexibility region A overlapping with the external connection electrode is longer than the length W3 of a low flexibility region B that is closer to the region A.

In the electronic device 90, it is preferable that the length W1 of the low flexibility region A overlapping with the external connection electrode be longer than the length W3 of the low flexibility region B that is closer to the region A. It is particularly preferable that, among the length W1 of the region A, the length W3 of the region B, and the length W2 of a low flexibility region C that is farther from the region A, W1 be the longest and W2 be the second longest.

Similarly, in the electronic device illustrated in FIG. 25(B), the length W1 is the longest, the length W2 is the second longest, and the length W3 and the length W4 are the shortest among the length W1 to the length W4. The length W3 and the length W4 may be different lengths.

In addition, in the electronic device illustrated in FIG. 25(C), the length W1 is the longest, the length W2 is the second longest, and the length W3, the length W4, and the length W5 are the shortest among the length W1 to the length W5. The length W3, the length W4, and the length W5 may be different lengths.

The support panel is provided on at least one of the display surface side and the side opposite to the display surface side of the display panel.

The display panel preferably has support panels on both the display surface side and the side opposite to the display surface side, like the support panels 95a and 95b, in which case the display panel can be sandwiched between a pair of support panels; thus, the mechanical strength of the low flexibility region is increased and the electronic device 90 becomes less likely to be broken.

The high flexibility region E1 and the low flexibility region E2 preferably include the display panel and a protective layer having a higher flexibility than that of the support panel and overlapping with the display panel. In that case, the high flexibility region E1 in the electronic device 90 can have high mechanical strength as well as flexibility and the electronic device 90 becomes less likely to be broken. This structure makes the electronic device 90 less likely to be broken by deformation due to external force or the like in the high flexibility region as well as the low flexibility region.

For example, it is preferable that the support panel be the thickest and the display panel be the thinnest among the display panel, the support panel, and the protective layer. Alternatively, for example, it is preferable that the support panel have the lowest flexibility and the display panel have the highest flexibility among the display panel, the support panel, and the protective layer. Such a structure increases the difference in flexibility between the high flexibility region and the low flexibility region. Thus, the electronic device can be folded reliably at the high flexibility region, so that the low flexibility region is prevented from being bent. Consequently, the reliability of the light-emitting device can be improved. Such a structure also prevents the electronic device from being bent at an undesired portion.

The display panel preferably has protective layers on both the display surface side and the side opposite to the display surface side, in which case the display panel can be sandwiched between a pair of protective layers; thus, the electronic device has increased mechanical strength and the electronic device becomes less likely to be broken.

In this embodiment, an example where the conductive layer 73 functions as a protective layer is shown. The conductive layer 73 is connected to the support panel 95b or a battery and thus is supplied with a constant potential.

For example, as illustrated in FIG. 24(A), FIG. 27, and the like, in the low flexibility region E2, it is preferable that the protective layer 93 and the conductive layer 73 be placed between the pair of support panels 95a and 95b and the touch panel 300 be placed between the protective layer 93 and the conductive layer 73.

It is preferable that the display panel have the protective layer on only one of the display surface side and the side opposite to the display surface side because the electronic device 90 can be thinner or more lightweight. For example, the electronic device 90 that includes the conductive layer 73 and does not include the protective layer 93 may be employed.

When the protective layer 93 on the display surface side of the display panel is a light-blocking film, a non-display region of the display panel can be prevented from being irradiated with external light. This structure is preferable because it prevents photodegradation of a transistor and the like of a driver circuit that is included in the non-display region.

The touch panel 300 includes a portion not fixed to the conductive layer 73, whereby, when the electronic device 90 is bent or opened, the position of at least one portion of the touch panel 300 relative to the conductive layer 73 is changed. In addition, a neutral plane can be formed in the touch panel 300; thus, the touch panel 300 can be prevented from being broken due to power applied to the touch panel 300.

The protective layer and the support panel can be formed using plastic, a metal, an alloy, rubber, or the like. Plastic, rubber, or the like is preferably used because it can form a protective layer or a support panel that is lightweight and less likely to be broken. For example, silicone rubber can be used for the protective layer 93, a conductive film can be used for the conductive layer 73, and stainless steel or aluminum can be used for the support panel. As the conductive film, for example, a film in which ITO and a PET film are stacked can be used.

The protective layer and the support panel are preferably formed using a material with high toughness. In that case, an electronic device with high impact resistance that is less likely to be broken can be provided. For example, when a resin, a thin metal material, or a thin alloy material is used for the protective layer and the support panel, the electronic device can be lightweight and less likely to be broken. For a similar reason, also a substrate of the display panel is preferably formed using a material with high toughness.

The protective layer and the support panel on the display surface side do not necessarily have a light-transmitting property if they do not overlap with the display region of the display panel. When the protective layer and the support panel on the display surface side overlap with at least part of the display region, they are preferably formed using a material that transmits light emitted from the light-emitting element. There is no limitation on the light-transmitting property of the protective layer and the support panel on the side opposite to the display surface side.

When any two of the protective layer, the support panel, and the display panel are bonded to each other, any of a variety of adhesives can be used, and for example, resins such as a curable resin that is curable at room temperature (e.g., a two-component-mixture-type resin), a light curable resin, and a thermosetting resin can be used. Alternatively, a sheet-like adhesive may be used. Alternatively, components of the electronic device may be fixed with, for example, a screw that penetrates two or more of the protective layer, the support panel, and the display panel, a pin or clip that holds them, or the like. The touch panel 300 includes a portion not fixed to the conductive layer 73.

The electronic device 90 can be used with one display panel (one display region) divided into two or more regions at a folded portion(s). For example, it is possible to put the region that is hidden by folding the light-emitting device in a non-display state and put only the exposed region in a display state. Thus, power consumed by a region that is not used by a user can be reduced.

The electronic device 90 may include a sensor for determining whether each high flexibility region is bent or not. The sensor can be composed of, for example, a switch, a MEMS pressure sensor, a pressure sensor, or the like.

In the electronic device 90, one display panel can be folded once or more times. The curvature radius in that case can be, for example, greater than or equal to 1 mm and less than or equal to 150 mm.

FIGS. 28(A) to (D) show examples of an arm-worn electronic device and a watch-type electronic device. In FIG. 28, examples where the touch panel 300 (see FIG. 14 and FIG. 15) is used as a display panel are shown.

Usage of electronic devices of one embodiment of the present invention is not particularly limited. For example, the electronic devices may be used without being worn on or may be used while being worn on part of a body such as an arm, a waist, or a leg or being attached to a robot (e.g., a factory robot and a humanoid robot), a columnar object (e.g., a column of a building, a utility pole, and an indicator pole), a tool, or the like.

Figure 28A:
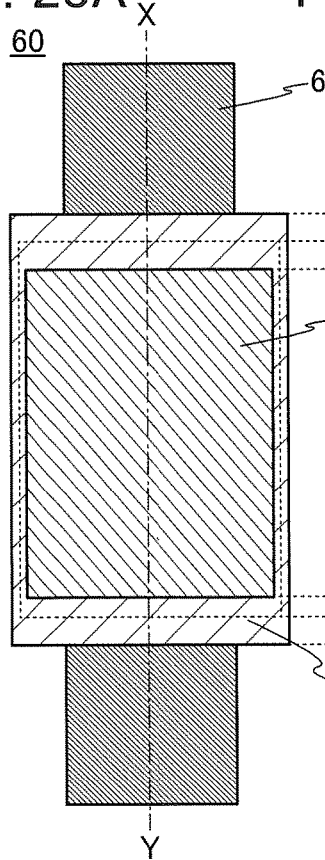
FIGS. 28A-28D Diagrams illustrating examples of an electronic device.
Figure 28B:
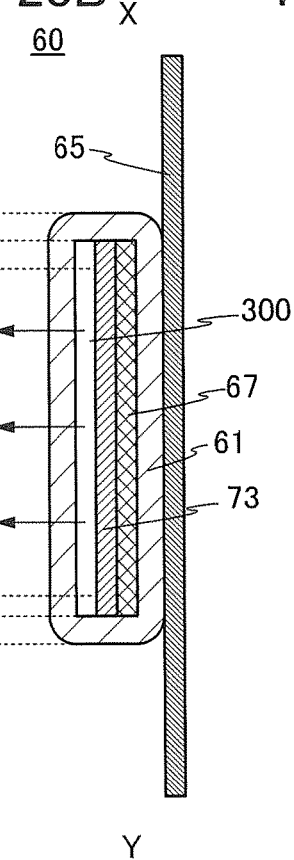

FIG. 28(A) illustrates a top view of an arm-worn electronic device 60 and FIG. 28(B) illustrates a cross-sectional view taken along dashed-dotted line X-Y in FIG. 28(A). In FIG. 28(B), a direction in which light emitted from the light-emitting element included in the touch panel 300 is denoted by arrows.

The electronic device 60 includes a housing 61 and a band 65. Inside the housing 61, the touch panel 300, the conductive layer 73, a circuit, a power storage device 67, and the like are provided. The housing 61 is connected to the band 65. The housing 61 and the band 65 may be connected to each other detachably.

The touch panel 300 includes the conductive layer 390 illustrated in FIG. 15. The conductive layer 390 is electrically connected to the conductive layer 73 and is supplied with a constant potential. The conductive layer 73 is supplied with a constant potential. The conductive layer 73 may be connected to the power storage device 67 or the housing

61. For example, the conductive layer 73 is electrically connected to the GND line of the housing 61 or the battery, and is supplied with the GND potential.

The conductive layer 73 may function as a shield for electrostatic shielding of the power storage device 67. In particular, the conductive layer 73 is preferable as a shield of a secondary battery which does not need an exterior body (e.g., solid-state battery). Furthermore, the conductive layer 73 may function as a shield for electrostatic shielding of a variety of sensors included in the electronic device 60.

As the band, a belt-like band or a chain-like band can be used.

Figure 28C:
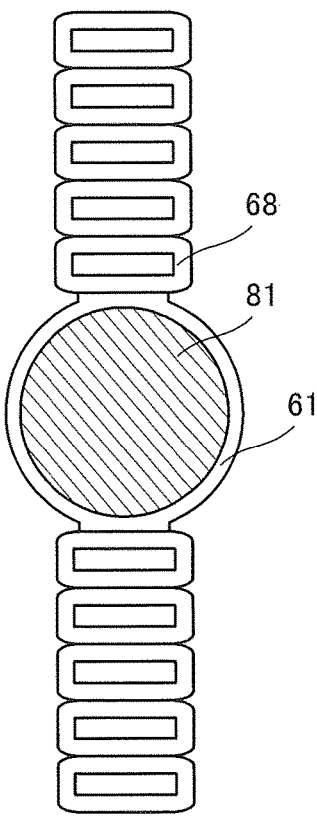

FIG. 28(C) shows an example including a chain-like band 68. FIG. 28(C) illustrates an arm-worn electronic device including a circular display region 81 in a circular housing 61.

For the band which enables the electronic device to be worn on the arm or the like, one or more of a metal, a resin, a natural material, and the like can be used. As the metal, stainless steel, aluminum, a titanium alloy, or the like can be used. As the resin, an acrylic resin, a polyimide resin, or the like can be used. As the natural material, processed wood, stone, bone, leather, paper, or cloth can be used, for example.

Figure 28D:
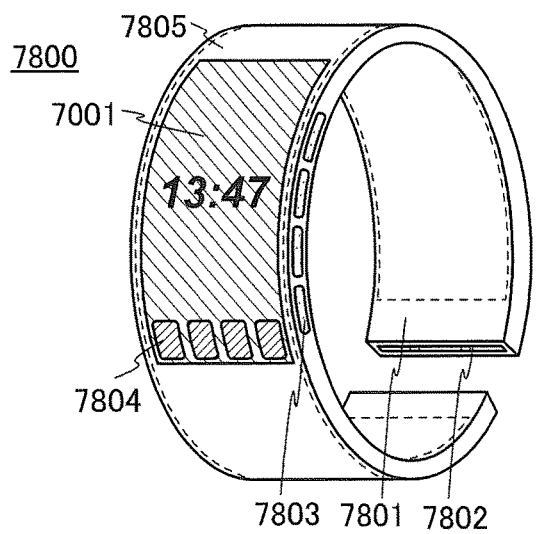

FIG. 28(D) illustrates an example of a wrist-watch-type electronic device. An electronic device 7800 includes a band 7801, the display portion 7001, an input/output terminal 7802, operation buttons 7803, and the like. The band 7801 has a function as a housing. A flexible battery 7805 can be included in the electronic device 7800. The battery 7805 may be provided to overlap with the display portion 7001 or the band 7801, for example.

The band 7801, the display portion 7001, and the battery 7805 have flexibility. Thus, the electronic device 7800 can be easily curved to have a desired shape.

The electronic device 7800 can be used as a portable information terminal.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the electronic device 7800.

By touch on an icon 7804 displayed on the display portion 7001 with a finger or the like, application can be started.

The electronic device 7800 can employ near field communication that is a communication method based on an existing communication standard. In that case, for example, mutual communication between the electronic device 7800 and a headset capable of wireless communication can be performed, and thus hands-free calling is possible.

The electronic device 7800 may include the input/output terminal 7802. In the case where the input/output terminal 7802 is included in the electronic device 7800, data can be directly transmitted to and received from another information terminal via a connector. Charging through the input/output terminal 7802 is also possible. Note that charging may be performed by contactless power transmission without using the input/output terminal.

FIGS. 29(A), (B), (C1), (C2), (D), and (E) illustrate examples of electronic devices each including a display portion 7000 with a curved surface. The display surface of the display portion 7000 is curved, and images can be displayed on the curved display surface. Note that the display portion 7000 may be flexible.

The display portion 7000 can be formed using the display device of one embodiment of the present invention.

One embodiment of the present invention makes it possible to provide an electronic device with reduced display defects and having a curved display portion.

FIG. 29(A) illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 29(A) includes a touch sensor in the display portion 7000. Operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; for example, switching images from a mail creation screen to a main menu screen is performed with the operation button 7103.

FIG. 29(B) illustrates an example of a television set. In a television set 7200, the display portion 7000 is incorporated in a housing 7201. Here, the housing 7201 is supported by a stand 7203.

The television set 7200 illustrated in FIG. 29(B) can be operated with an operation switch of the housing 7201 or a separate remote controller 7211. The display portion 7000 may include a touch sensor, and can be operated by touch on the display portion 7000 with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television set 7200 is provided with a receiver, a modem, or the like. A general television broadcast can be received with the receiver. When the television set is connected to a communication network with or without wires via the modem, one-way (from a transmitter to a receiver) or two-way (between a transmitter and a receiver or between receivers) data communication can be performed.

FIGS. 29(C1), (C2), (D), and (E) illustrate examples of portable information terminals. Each of the portable information terminals includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal can be performed by touch on the display portion 7000 with a finger, a stylus, or the like.

FIG. 29(C1) is a perspective view of a portable information terminal 7300. FIG. 29(C2) is a top view of the portable information terminal 7300. FIG. 29(D) is a perspective view of a portable information terminal 7310. FIG. 29(E) is a perspective view of a portable information terminal 7320.

The portable information terminals 7300, 7310, and 7320 can each display characters and image information on its plurality of surfaces. For example, as illustrated in FIGS. 29(C1) and (D), three operation buttons 7302 can be displayed on one surface, and information 7303 indicated by a rectangle can be displayed on another surface. FIGS. 29(C1) and (C2) illustrate an example in which information is displayed on the top surface of the portable information terminal. FIG. 29(D) illustrates an example in which information is displayed on the side surface of the portable information terminal. Information may be displayed on three or more surfaces of the portable information terminal. FIG.

29(E) illustrates an example in which information 7304, information 7305, and information 7306 are displayed on different surfaces.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in the position that can be seen from above the portable information terminal 7300. Thus, the user can see the display without taking out the portable information terminal 7300 from the pocket and decide whether to answer the call.

FIGS. 29(F) to (H) each illustrate an example of a lighting device having a curved light-emitting portion.

The light-emitting portion included in each of the lighting devices illustrated in FIGS. 29(F) to (H) can be formed using the display device of one embodiment of the present invention.

One embodiment of the present invention makes it possible to provide a lighting device with reduced light-emission defects and having a curved light-emitting portion.

A lighting device 7400 illustrated in FIG. 29(F) includes a light-emitting portion 7402 with a wave-shaped light-emitting surface and thus is a good-design lighting device.

A light-emitting portion 7412 included in a lighting device 7410 illustrated in FIG. 29(G) has two convex-curved light-emitting portions symmetrically placed. Thus, all directions can be illuminated with the lighting device 7410 as a center.

A lighting device 7420 illustrated in FIG. 29(H) includes a concave-curved light-emitting portion 7422. This is suitable for illuminating a specific range because light emitted from the light-emitting portion 7422 is collected to the front of the lighting device 7420.

The light-emitting portion included in each of the lighting devices 7400, 7410, and 7420 may be flexible. The light-emitting portion may be fixed on a plastic member, a movable frame, or the like so that a light-emitting surface of the light-emitting portion can be bent freely depending on the intended use.

The lighting devices 7400, 7410, and 7420 each include a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular area can be brightly illuminated, or the light-emitting surface is curved to have a convex shape, whereby a whole room can be brightly illuminated.

With the flexible display device of one embodiment of the present invention, an electronic device having a structure other than the folded display portion (e.g., FIG. 23) can be manufactured.

FIGS. 30(A) to (D) each illustrate an example of a portable information terminal including a display portion 7001 having flexibility.

FIGS. 30(A) is a perspective view illustrating an example of the portable information terminal and FIG. 30(B) is a side view illustrating the example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal and power can be directly supplied from the outside with a wiring.

By pressing the operation buttons 7503, power ON/OFF, switching of displayed videos, and the like can be performed. Although FIGS. 30(A) to (C) illustrate an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 30(C) illustrates the portable information terminal 7500 in a state where the display portion 7001 is pulled out. Images can be displayed on the display portion 7001 in this state. In addition, the portable information terminal 7500 may perform different displays in the state where part of the display portion 7001 is rolled as illustrated in FIG. 30(A) and in the state where the display portion 7001 is pulled out by the display portion tab 7502 as illustrated in FIG. 30(C). For example, in the state illustrated in FIG. 30(A), the rolled portion of the display portion 7001 is put in a non-display state, which results in a reduction in power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIG. 30(D) illustrates an example of a flexible portable information terminal. A portable information terminal 7700 includes a housing 7701 and the display portion 7001. The portable information terminal 7700 may further include buttons 7703*a* and 7703*b* which serve as input means, speakers 7704*a* and 7704*b* which serve as sound output means, an external connection port 7705, a microphone 7706, or the like. A flexible battery 7709 can be included in the portable information terminal 7700. The battery 7709 may be provided to overlap with the display portion 7001, for example.

The housing 7701, the display portion 7001, and the battery 7709 are flexible. Thus, it is easy to curve the portable information terminal 7700 into a desired shape and to twist the portable information terminal 7700. For example, the portable information terminal 7700 can be folded so that the display portion 7001 is on the inside or on the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

Figure 31A:
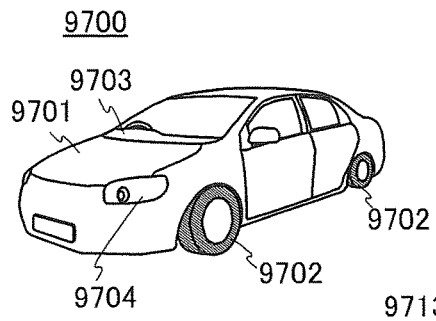
FIGS. 31A-31E Diagrams illustrating examples of an electronic device.
Figure 31B:
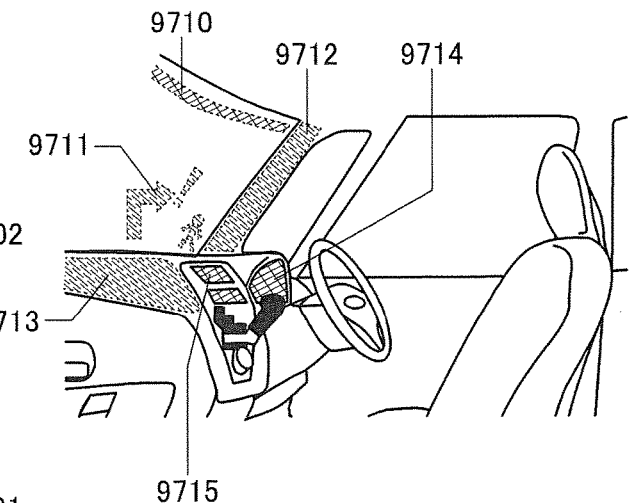

FIG. 31(A) illustrates an external view of an automobile 9700. FIG. 31(B) illustrates a driver's seat of the automobile 9700. The automobile 9700 includes a car body 9701, wheels 9702, a dashboard 9703, lights 9704, and the like. The display device of one embodiment of the present invention can be used in a display portion or the like of the automobile 9700. For example, the display device of one embodiment of the present invention can be provided in a display portion 9710 to a display portion 9715 illustrated in FIG. 31(B).

The display portion 9710 and the display portion 9711 are display devices provided in an automobile windshield. The display device of one embodiment of the present invention can be a see-through device, through which the opposite side can be seen, by using a light-transmitting conductive material for its electrodes and wirings. Such a see-through display portion 9710 or 9711 does not hinder driver's vision during driving of the automobile 9700. Thus, the display device of one embodiment of the present invention can be provided in the windshield of the automobile 9700. Note that in the case where a transistor or the like for driving the display device or the like is provided, a transistor having light-transmitting properties, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar portion by showing an image taken by an imaging unit provided on the car body. The display portion 9713 is a display device provided on the dashboard. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 31C:
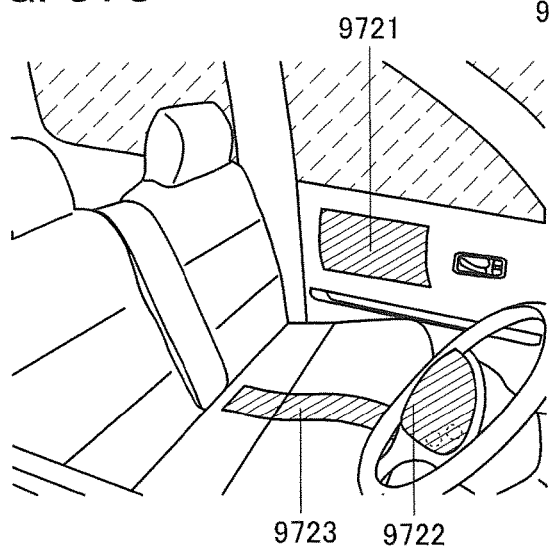

FIG. 31(C) illustrates the inside of an automobile in which a bench seat is used as a driver seat and a front passenger seat. A display portion 9721 is a display device provided in a door portion. For example, the display portion 9721 can compensate for the view hindered by the door portion by showing an image taken by an imaging unit provided on the car body. A display portion 9722 is a display device provided in a steering wheel. A display portion 9723 is a display device provided in the middle of a seating face of the bench seat. Note that the display device can be used as a seat heater by providing the display device on the seating face or backrest and by using heat generated by the display device as a heat source.

The display portion 9714, the display portion 9715, and the display portion 9722 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

A display portion including the display device of one embodiment of the present invention may be flat. In this case, the display device of one embodiment of the present invention does not necessarily have a curved surface or flexibility. When the display device of one embodiment of the present invention is used, a thin and lightweight electronic device is possible.

Figure 31D:
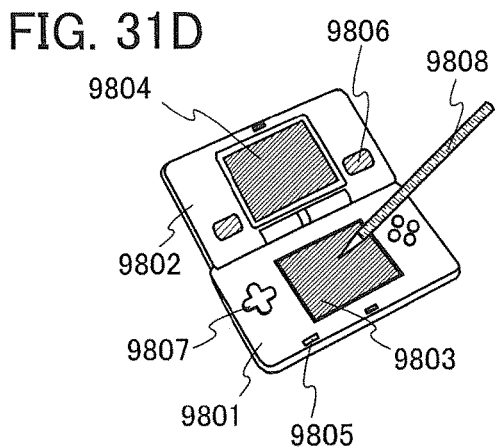

FIG. 31(D) illustrates a portable game console including a housing 9801, a housing 9802, a display portion 9803, a display portion 9804, a microphone 9805, a speaker 9806, an operation key 9807, a stylus 9808, and the like.

The portable game console illustrated in FIG. 31(D) includes two display portions 9803 and 9804. Note that the number of display portions of an electronic device of one embodiment of the present invention is not limited to two and can be one or three or more. In the case where an electronic device includes a plurality of display portions, at least one display portion includes the display device of one embodiment of the present invention.

Figure 31E:
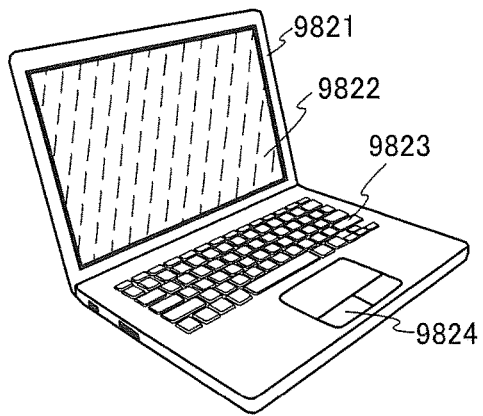

FIG. 31(E) illustrates a laptop personal computer including a housing 9821, a display portion 9822, a keyboard 9823, a pointing device 9824, and the like.

This embodiment can be combined with any of other embodiments as appropriate.

[Example]

In this example, the results of fabricating the display device of one embodiment of the present invention and displaying an image will be described.

The display device of this example is described with reference to FIG. 6(B). The display device of this example includes a touch panel with a top-emission structure employing a color filter method as the display panel 10. The touch panel includes a light-emitting element and a touch sensor between a pair of flexible substrates. The thickness of the display panel 10 is smaller than or equal to 100 μm. The display panel 10 can be bent inward and outward.

The display panel 10 was manufactured by, in a manner similar to the manufacturing method of the structure example 1 described in Embodiment 2, forming a layer to be separated on each of the two formation substrates, bonding the two formation substrates to each other, separating each formation substrate, and transferring the layer to be separated between the pair of flexible substrates. Glass substrates were used as the formation substrates. For the flexible substrate 51 and the flexible substrate 57, resin films were used. As a semiconductor material of the transistor, a CAAC-OS was used. As the light-emitting element, an organic EL element was used. As the conductive layer 71, a titanium film with a thickness of 50 nm was used.

Under the display panel 10, a conductive film was placed. The conductive film includes an ITO film with a thickness of 100 nm over a PET film with a thickness of 127 μm. The ITO film corresponds to the conductive layer 73.

Figure 32A:
FIGS. 32A-32C Photographs showing a display device of Example.
Figure 32B:
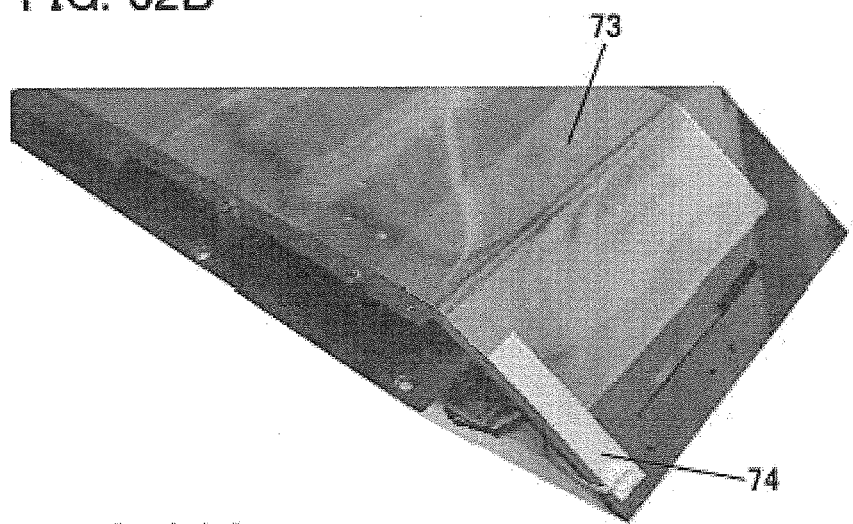

FIGS. 32(A) and (B) show a conductive film placed over a housing. Over the conductive layer 73 included in the conductive film, a conductor 74 (a copper foil) is connected. A connection portion of the conductive layer 73 and the conductor 74 was provided at a position which does not overlap with the display panel 10. The wiring is soldered to the conductor 74. The wiring is led to GND of a power source. When the conductive layer 73 is in contact with the conductive layer 71 of the display panel 10, the conductive layer 71 can be supplied with the GND potential.

Figure 32C:
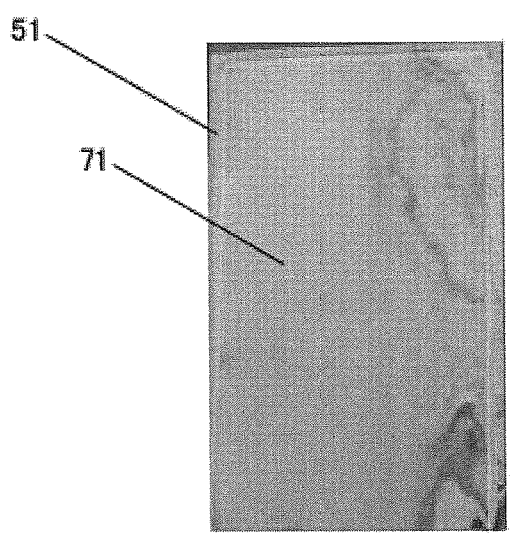

FIG. 32(C) shows a photograph of a rear surface (surface on the side opposite to the display surface) of the display panel 10. The conductive layer 71 is provided over the flexible substrate 51. The conductive layer 71 overlaps with the display region of the display panel 10 and is formed in a region larger than the display region.

Figure 33A:
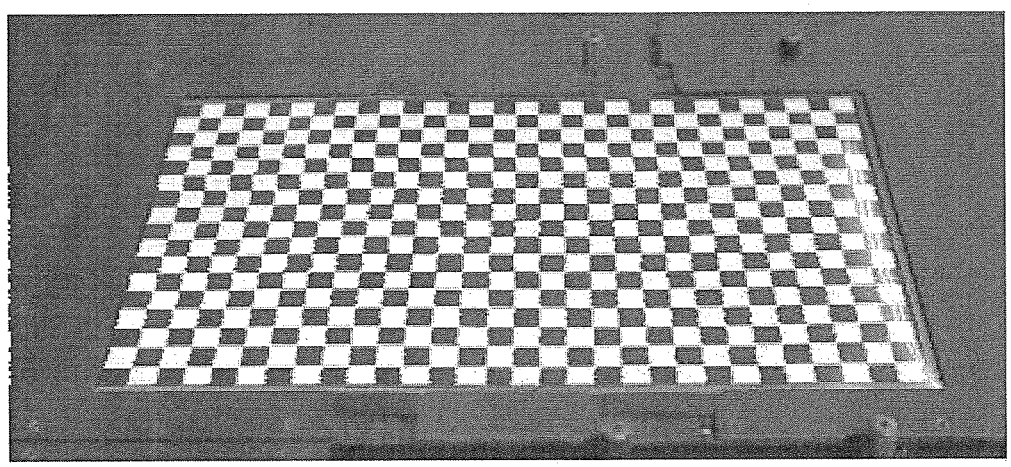
FIGS. 33A-33B Photographs of a display device displaying an image in Example.
Figure 33B:
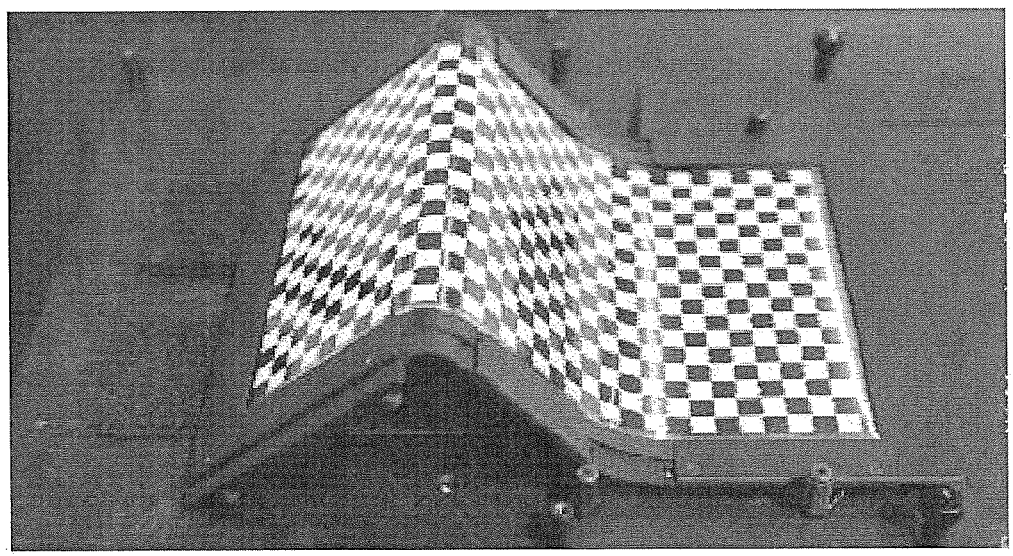

FIGS. 33(A) and (B) show photographs of a display device displaying an image. In the display device shown in FIGS. 33(A) and (B), the display panel 10 can be folded in three parts by a housing, and the curvature radius at that time is approximately 3 mm. The display panel 10 is positioned to overlap with the conductive film so that the conductive layer 71 is in contact with the conductive layer 73. As shown in FIGS. 33(A) and (B), the display device of this example could perform favorable display both in the opened state and the folded state. The conductive layer 71 was formed on the rear surface of the display panel 10; however, there was no problem in display. In addition, even when the display panel 10 was touched or the display panel 10 was bent, there was no influence on display.

In this example, the conductive layer 71 was provided on the rear surface of the display panel 10, and the conductive layer 71 was supplied with the GND potential. Thus, even when the thickness of the display panel 10 was thin enough to be subjected to repetitive bending and unbending operation, noise from the outside could be reduced and the display panel 10 could perform favorable display. In addition, the conductive layer 71 and the conductive layer 73 were not fixed; thus, a decrease in flexibility of the display panel 10 could be suppressed. Furthermore, the connection portion of the conductive layer 73 and the conductor 74 was provided at a position which does not overlap with the display panel 10, whereby steps due to the connection portion were not formed in the display region, and a reduction in display quality could be suppressed.

REFERENCE NUMERALS 10 display panel
11 first wiring
12 second wiring
13 third wiring
14 fourth wiring
15 fifth wiring
16 display panel
19 wiring
20 layer including transistor
21 conductive layer
22 region
22A region
22B region
22C region
22D region
31 light-emitting element
32 transistor
33 transistor
34 capacitor
39 capacitance
41 electrode
43 EL layer
45 electrode
51 flexible substrate
53 insulating layer
55 bonding layer
57 flexible substrate
60 electronic device
61 housing
65 band
67 power storage device
68 band
71 conductive layer
72 element layer
73 conductive layer
73a conductive layer
73b conductive layer
74 conductor
74a conductor
74b conductor
81 display region
82 scan line driver circuit
83 FPC
84 IC
90 electronic device
93 protective layer
95a support panel
95b support panel
98 housing
99 finger
300 touch panel
301 transistor
302 transistor
303 transistor
304 light-emitting element
305 capacitor
306 connection portion
307 conductive layer
308 connection portion
309 connector
310 input device
311 gate insulating layer
312 insulating layer
313 insulating layer
314 insulating layer
315 insulating layer
316 spacer
317 bonding layer
318 input device
319 connector
320 touch panel
321 electrode
322 EL layer
323 electrode
324 optical adjustment layer
325 coloring layer
326 light-blocking layer
326a light-blocking layer
326b light-blocking layer
327 insulating layer
328 insulating layer
330 flexible substrate
331 electrode
332 electrode
333 electrode
334 electrode
341 wiring
342 wiring
347 region
348 region
349 region
350 FPC
351 IC
355 conductive layer
370 display panel
371 flexible substrate 372 flexible substrate
373 FPC
374 IC
375 bonding layer
376 insulating layer
377 bonding layer
378 insulating layer
379 display panel
380 conductive layer
381 display portion
382 driver circuit portion
383 wiring
385 connection portion
386 connector
387 crossing portion
390 conductive layer
391 bonding layer
392 flexible substrate
393 insulating layer
395 insulating layer
396 bonding layer
398 separation film
399 separation film
401 formation substrate
403 separation layer
411 formation substrate
413 separation layer
723 back gate
728 insulating layer
729 insulating layer
742 semiconductor layer
743 gate
744a conductive layer
744b conductive layer
747a opening
747b opening
747c opening
747d opening
772 insulating layer
848 transistor
7000 display portion
7001 display portion
7100 mobile phone
7101 housing
7103 operation button
7104 external connection port
7105 speaker
7106 microphone
7200 television set
7201 housing
7203 stand
7211 remote controller
7300 portable information terminal
7301 housing
7302 operation button
7303 information
7304 information
7305 information
7306 information
7310 portable information terminal
7320 portable information terminal
7400 lighting device
7401 stage
7402 light-emitting portion
7403 operation switch
7410 lighting device
7412 light-emitting portion
7420 lighting device
7422 light-emitting portion
7500 portable information terminal
7501 housing
7502 tab
7503 operation button
7600 electronic device
7601 housing
7602 hinge
7650 electronic device
7651 non-display portion
7700 portable information terminal
7701 housing
7703a button
7703b button
7704a speaker
7704b speaker
7705 external connection port
7706 microphone
7709 battery
7800 electronic device
7801 band
7802 input/output terminal
7803 operation button
7804 icon
7805 battery
9700 automobile
9701 car body
9702 wheel
9703 dashboard
9704 light
9710 display portion
9711 display portion
9712 display portion
9713 display portion
9714 display portion
9715 display portion
9721 display portion
9722 display portion
9723 display portion
9801 housing
9802 housing
9803 display portion
9804 display portion
9805 microphone
9806 speaker
9807 operation key
9808 stylus
9821 housing
9822 display portion
9823 keyboard
9824 pointing device

The invention claimed is:
1. A display device comprising:
a display panel; and
a first conductive layer,
wherein the display panel has flexibility,
wherein the display panel comprises a flexible substrate, a first transistor, a second transistor, a light-emitting element, and a second conductive layer,
wherein the first transistor, the second transistor, and the light-emitting element are each over the flexible substrate,
wherein the light-emitting element comprises a first electrode over the flexible substrate, a layer comprising a light-emitting substance over the first electrode, and a second electrode over the layer comprising the light-emitting substance, wherein the first electrode is electrically connected to a source or a drain of the first transistor, wherein the second electrode is supplied with a constant potential, wherein the first transistor and the light-emitting element are each electrically insulated from the second conductive layer and each overlap with the second conductive layer with the flexible substrate provided therebetween, wherein the second conductive layer comprises a portion in contact with the first conductive layer and comprises a portion not fixed to the first conductive layer, and wherein the first conductive layer is supplied with a constant potential.

2. The display device according to claim 1, wherein the first conductive layer is in contact with a wiring supplied with the constant potential in a portion not overlapping with the display panel.

3. The display device according to claim 1, wherein an area where the second conductive layer and a display region of the display panel overlap with each other is greater than or equal to 80% and less than or equal to 100% of an area of the display region.

4. The display device according to claim 1, wherein an area of the second conductive layer is larger than an area of a display region of the display panel.

5. The display device according to claim 1, wherein an area where the first conductive layer and the display panel overlap with each other is greater than or equal to 80% and less than or equal to 100% of an area of the display panel.

6. The display device according to claim 1, wherein an area of the first conductive layer is larger than an area of the display panel.

7. The display device according to claim 1, further comprising
an insulating layer,
wherein the insulating layer overlaps with the display panel with the first conductive layer provided therebetween,
wherein the insulating layer comprises a resin, and
wherein the total thickness of the insulating layer and the first conductive layer is greater than or equal to 20 μm and less than or equal to 150 μm.

8. The display device according to claim 7, wherein Rockwell hardness of the insulating layer is higher than or equal to M60 and lower than or equal to M120.

9. The display device according to claim 1, wherein the thickness of the display panel is greater than or equal to 50 μm and less than or equal to 100 μm.

10. The display device according to claim 1, wherein the light-emitting element emits light toward the flexible substrate side, and
wherein the first conductive layer and the second conductive layer are each configured to transmit visible light.

11. The display device according to claim 1, wherein the light-emitting element emits light toward a side opposite to the flexible substrate side, and
wherein the first conductive layer comprises a metal or an alloy.

12. A module comprising:
the display device according to claim 1; and
a flexible printed circuit board or an integrated circuit.

13. An electronic device comprising:
the module according to claim 12; and
a sensor,
wherein the sensor overlaps with the display panel with the second conductive layer provided therebetween.

14. An electronic device comprising:
the module according to claim 12; and
at least one of a sensor, an antenna, a battery, a housing, a camera, a speaker, a microphone, and an operation button.

* * * * *